US008359542B2

(12) United States Patent
Dingeman et al.

(10) Patent No.: US 8,359,542 B2
(45) Date of Patent: Jan. 22, 2013

(54) MACHINES, PROGRAM PRODUCTS, AND COMPUTER-IMPLEMENTED METHODS FOR INTERACTIVE AIRCRAFT PERFORMANCE SUBSTANTIATION

(75) Inventors: David M. Dingeman, Cedar Hill, TX (US); Dave G. Parsons, Forth Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 340 days.

(21) Appl. No.: 12/856,318

(22) Filed: Aug. 13, 2010

(65) Prior Publication Data

US 2012/0042273 A1    Feb. 16, 2012

(51) Int. Cl.
| G06F 3/048 | (2006.01) |
| G06F 7/70 | (2006.01) |
| G06F 19/00 | (2006.01) |
| G01C 23/00 | (2006.01) |
| G05D 1/00 | (2006.01) |
| G05D 1/08 | (2006.01) |
| G06G 7/00 | (2006.01) |
| G06G 7/76 | (2006.01) |

(52) U.S. Cl. ............ 715/771; 715/764; 715/781; 701/3; 701/14

(58) Field of Classification Search .................. 715/771, 715/764, 781; 701/3, 14
See application file for complete search history.

(56) References Cited

U.S. PATENT DOCUMENTS

| 3,678,256 | A | | 7/1972 | Harenberg |
| 4,212,064 | A | | 7/1980 | Forsythe et al. |
| 4,236,212 | A | | 11/1980 | Arents |
| 4,312,041 | A | | 1/1982 | DeJonge |
| 4,325,123 | A | | 4/1982 | Graham et al. |
| 4,490,793 | A | | 12/1984 | Miller |
| 4,729,102 | A | | 3/1988 | Miller et al. |
| 4,831,538 | A | | 5/1989 | Cucchiari et al. |
| 4,837,695 | A | | 6/1989 | Baldwin |
| 5,070,458 | A | | 12/1991 | Gilmore et al. |
| 5,260,702 | A | | 11/1993 | Thompson |
| 5,408,413 | A | | 4/1995 | Gonser et al. |
| 5,499,025 | A | | 3/1996 | Middleton et al. |
| 5,606,505 | A | | 2/1997 | Smith et al. |
| 5,610,822 | A | * | 3/1997 | Murphy ........................ 701/468 |
| 5,987,474 | A | * | 11/1999 | Sandifer ................................. 1/1 |
| 6,134,500 | A | | 10/2000 | Tang et al. |

(Continued)

FOREIGN PATENT DOCUMENTS

WO         2007/006310 A2      1/2007

*Primary Examiner* — David Phantana Angkool
(74) *Attorney, Agent, or Firm* — Bracewell & Giuliani LLP

(57) ABSTRACT

An interactive aircraft performance substantiation is provided by determining maneuvers for a user-selected aircraft, determining operation and performance variables for a user-selected maneuver, displaying a scale graphic representation of the user-selected aircraft according to aircraft dimensions, displaying load selection fields according to aircraft dimensions and load-sites dimensions, interactively updating the scale graphic representation of the user-selected aircraft to include an oriented graphic representation of a user-selected load according to the aircraft dimensions, load dimensions, and load-site dimensions, interactively determining mass properties of the user-selected aircraft according to the aircraft dimensions, the load dimensions, and the load-site dimensions; receiving operation properties for the user-selected maneuver corresponding to the operation variables; and displaying an aircraft performance substantiation responsive to determining performance properties of the user-selected aircraft according to the mass properties thereof and the operation properties thereof, the performance properties corresponding to the performance variables.

33 Claims, 21 Drawing Sheets

U.S. PATENT DOCUMENTS

| | | |
|---|---|---|
| 6,400,282 B1 | 6/2002 | Germanetti |
| 6,449,573 B1 | 9/2002 | Amos |
| 6,553,333 B1 | 4/2003 | Shenk |
| 6,650,974 B2 | 11/2003 | Chamas et al. |
| 6,816,762 B2 | 11/2004 | Hensey et al. |
| 6,923,375 B2 | 8/2005 | Stefani |
| 7,148,814 B2 * | 12/2006 | Sikora et al. .................. 340/945 |
| 7,158,052 B2 | 1/2007 | Mangion et al. |
| 7,346,854 B2 * | 3/2008 | Hedrick ........................ 715/771 |
| 7,529,603 B2 | 5/2009 | Allen et al. |
| 7,555,372 B2 | 6/2009 | Dwyer |
| 7,584,073 B2 | 9/2009 | Coulmeau |
| 7,586,422 B2 | 9/2009 | Goodman et al. |
| 7,606,641 B2 | 10/2009 | Allen |
| 2003/0006928 A1 * | 1/2003 | Szeto et al. ..................... 342/26 |
| 2006/0200279 A1 | 9/2006 | Ainsworth et al. |
| 2007/0142980 A1 | 6/2007 | Ausman et al. |
| 2007/0180394 A1 * | 8/2007 | Hedrick ........................ 715/771 |
| 2007/0255489 A1 | 11/2007 | Jensen et al. |
| 2009/0125168 A1 | 5/2009 | Voisin |

\* cited by examiner

| Maneuver | Warning | Loading | Fuel Wt. (lbs) | ETR | Delta_Temp_degF | Altitude_ft | Weight_lbs | FS_CG_in | Wt_CG_in | Distance_to_50ft | Ground_Roll_ft | Rotation_Speed_KCAS | Takeoff_Speed_KCAS | Speed_at_500_ft_KCAS | Speed_at_1000_ft_KCAS | Speed_at_2000_ft_KCAS |
|---|---|---|---|---|---|---|---|---|---|---|---|---|---|---|---|---|
| Take-off | Warning: Wt_CG_in is outside the range of valid data, set value to > 89.75 and < 94 | MISSILE_C MISSILE_C MISSILE_D MISSILE_C MISSILE_D | 27295 | 150 | -40 | 1000 | 49178 | 436.6 | 86 | 3684 | 2539 | 151 | 192 | 86 | 123 | 173 |
| Take-off | Warning: Wt_CG_in is outside the range of valid data, set value to > 89.75 and < 94 | MISSILE_C MISSILE_C MISSILE_D MISSILE_C MISSILE_D | 27295 | 150 | -40 | 1000 | 49178 | 436.6 | 86 | 3684 | 2539 | 151 | 192 | 86 | 123 | 173 |
| Take-off | Warning: Wt_CG_in is outside the range of valid data, set value to > 89.25 and < 93.75 | MISSILE_C MISSILE_C MISSILE_D MISSILE_C MISSILE_D | 24566 | 150 | -40 | 1000 | 46448 | 440.9 | 84.9 | 3232 | 2142 | 138 | 182 | 89 | 127 | 177 |
| Take-off | Warning: Wt_CG_in is outside the range of valid data, set value to > 88 and < 93.25 | MISSILE_C MISSILE_C MISSILE_D MISSILE_C MISSILE_D | 21836 | 150 | -40 | 1000 | 43719 | 438 | 84.1 | 3079 | 2053 | 139 | 184 | 92 | 131 | 182 |
| Take-off | Warning: Wt_CG_in is outside the range of valid data, set value to > 87.25 and < 92.75 | MISSILE_C MISSILE_C MISSILE_D MISSILE_C MISSILE_D | 19106 | 150 | -40 | 1000 | 40989 | 435.2 | 83.1 | 2922 | 1946 | 138 | 185 | 95 | 135 | 187 |
| Take-off | Warning: Wt_CG_in is outside the range of valid data, set value to > 86.25 and < 92.25 | MISSILE_C MISSILE_C MISSILE_D MISSILE_C MISSILE_D | 16377 | 150 | -40 | 1000 | 38260 | 436.2 | 81.8 | 2656 | 1729 | 131 | 181 | 98 | 140 | 192 |

FIG. 13A

| Maneuver | Warning | Loading | Fuel Wt. (lbs) | ETR | Delta_Temp_degF | Altitude_ft | Weight_lbs | FS_CG_in | WL_CG_in | Distance_to_50ft | Ground_Roll_ft | Rotation_Speed_KCAS | Takeoff_Speed_KCAS | Speed_at_500_ft_KCAS | Speed_at_1000_ft_KCAS | Speed_at_2000_ft_KCAS |
|---|---|---|---|---|---|---|---|---|---|---|---|---|---|---|---|---|
| Take-off | Warning: WL_CG_in is outside the range of valid data, set value to > 85.5 and < 90.75 | MISSILE_C MISSILE_C MISSILE_D MISSILE_C MISSILE_C MISSILE_D | 13648 | 150 | -40 | 1000 | 35530 | 436.3 | 80.3 | 2373 | 1492 | 119 | 175 | 102 | 145 | 198 |
| Take-off | Warning: WL_CG_in is outside the range of valid data, set value to > 85.5 and < 90 | MISSILE_C MISSILE_C MISSILE_D MISSILE_C MISSILE_C MISSILE_D | 10518 | 150 | -40 | 1000 | 32801 | 437.5 | 78.4 | 2053 | 1232 | 106 | 166 | 107 | 150 | 204 |
| Take-off | Warning: WL_CG_in is outside the range of valid data, set value to > 87.25 and < 89.25 | MISSILE_C MISSILE_C MISSILE_D MISSILE_C MISSILE_C MISSILE_D | 8188 | 150 | -40 | 1000 | 30071 | 440.5 | 76.1 | 1742 | 985 | 92 | 155 | 111 | 156 | 211 |
| Take-off | Warning: Weight_lbs is outside the range of valid data, set value to > 30000 and < 55000 Warning: WL_CG_in is outside the range of valid data, set value to > 87.25 and < 89.25 | MISSILE_C MISSILE_C MISSILE_D MISSILE_C MISSILE_C MISSILE_D | 5459 | 150 | -40 | 1000 | 27342 | 437.3 | 73 | 1735 | 979 | 91 | 155 | 112 | 156 | 211 |
| Take-off | Warning: Weight_lbs is outside the range of valid data, set value to > 30000 and < 55000 Warning: WL_CG_in is outside the range of valid data, set value to > 87.25 and < 89.25 | MISSILE_C MISSILE_C MISSILE_D MISSILE_C MISSILE_C MISSILE_D | 2730 | 150 | -40 | 1000 | 24612 | 439.5 | 69.7 | 1735 | 979 | 91 | 155 | 112 | 156 | 211 |
| Take-off | Warning: Weight_lbs is outside the range of valid data, set value to > 30000 and < 55000 Warning: WL_CG_in is outside the range of valid data, set value to > 87.25 and < 89.25 | MISSILE_C MISSILE_C MISSILE_D MISSILE_C MISSILE_C MISSILE_D | 0 | 150 | -40 | 1000 | 21683 | 454.1 | 66.6 | 1685 | 934 | 85 | 151 | 112 | 156 | 210 |

FIG. 13B

MACHINES, PROGRAM PRODUCTS, AND COMPUTER-IMPLEMENTED METHODS FOR INTERACTIVE AIRCRAFT PERFORMANCE SUBSTANTIATION

BACKGROUND OF THE INVENTION

1. Technical Field

The present invention relates in general to the aerospace industry and, in particular, to the substantiation of aircraft performance in aircraft design, configuration, and operation.

2. Description of the Related Art

In the fields of aircraft design, manufacturing, and operation, aircraft performance substantiation is conducted to provide a quantification of aircraft performance with respect to critical performance properties. Aircraft performance substantiation can provide such a quantification in a report to be used by, for example, aircraft designers, manufacturers, customers, and operators to certify, for example, that the aircraft can satisfactorily perform a desired maneuver or series of maneuvers or whether an aircraft can satisfactorily achieve a desired mission. Legacy presentation of an aircraft performance substantiation report included approximately 700 pages of aircraft performance substantiation data. Those intending to use such a report were required to identify aircraft performance substantiation data of interest and sift through pages of data to locate such aircraft performance substantiation data of interest. For example, a user accessing an aircraft performance substantiation report to determine whether an aircraft could safely or satisfactorily perform takeoff under particular conditions or assumptions would have had to identify each of several performance variables relevant to the maneuver of takeoff (e.g., rotation speed, flap settings, distance-to-speed, etc.), identify each of several conditions or assumptions relevant to each of the performance variables (e.g., weight, centers of gravity, moments of inertia), and manually interpolate or extrapolate the performance properties for such performance variables with respect to each of the particular conditions or assumptions. Accessing an aircraft performance substantiation report for several performance variables and several conditions or assumptions was time-consuming and was prone to error depending whether the user had correctly identified the relevant performance variables and conditions or assumptions. Accessing an aircraft performance substantiation report in such manner also required that the user undertake a series of manual references to data tables, which complicated the user's ability to change the operative conditions or assumptions in determining the aircraft performance properties. Furthermore, to the extent that the mass properties of an aircraft, such as the centers of gravity and moments of inertia, would be included in the relevant conditions or assumptions, the user was required to perform a series of preliminary calculations based on the loading of the aircraft to determine the mass properties, which can become increasingly complex for aircraft with complex configurations, such as, for example, military aircraft, which have multiple loading stations, multiple loads available to load at the loading stations, and multiple desired configurations depending on the aircraft's mission. The art, however, has not provided an interactive aircraft performance substantiation solution wherein a customer or user can input or select key conditions or assumptions to efficiently and interactively obtain aircraft performance properties of interest with respect to preselected maneuvers and user-configurable conditions and assumptions.

SUMMARY OF THE INVENTION

Applicants recognize the need in the art for an enhanced aircraft performance substantiation solution that allows a user to obtain aircraft performance substantiation data in designing, configuring, or operating an aircraft. Embodiments of the present invention can allow a user to receive aircraft performance substantiation data with respect to the performance properties of any of various preselected aircraft to perform any of various preselected maneuvers, allowing for user-selected conditions and assumptions as well as programmatically varied conditions and assumptions. Embodiments of the present invention can provide an enhanced aircraft performance substantiation solution having a user interface for a user to select an aircraft, select a maneuver, configure loads for the selected aircraft, and configure conditions or assumptions for the selected aircraft in performing the selected maneuver so that the user can receive aircraft performance substantiation data with respect to a unique set of aircraft performance properties for the selected aircraft and selected maneuver with respect to the configured loads and the configured conditions or assumptions. Embodiments of the present invention allow a user to receive such aircraft performance substantiation data without the inefficiency of manually accessing a lengthy performance substantiation report for each of the preselected aircraft as described in the description of the related art.

Embodiments of the present invention also provide an enhanced aircraft performance substantiation solution for a user to receive aircraft performance substantiation data for the selected aircraft interactively upon changing the configuration of any of the loads, conditions, or assumptions. The enhanced aircraft performance substantiation solution also allows a user to receive aircraft properties data for the selected aircraft interactively upon changing the configuration or selection of loads, conditions, or assumptions. The user of the enhanced aircraft performance substantiation solution, accordingly, can be made aware, interactively, of the impact of such configurations or selections with respect to the mass properties and the performance properties of the aircraft.

Embodiments of the present invention also provide an enhanced aircraft performance substantiation solution to allow a user to graphically configure or select the loads on a selected aircraft. The user of the enhanced aircraft performance substantiation solution, accordingly, can be made aware, interactively, of the impact of placing any of various loads at any of various load stations, in three dimensions, with respect to other selected loads for the aircraft and the aircraft as a whole. For example, a user may be able to visually identify clearance issues that may arise from having a particular load positioned at particular load-site, for example, if the load is positioned incompatibly with respect to an adjacent load.

Embodiments of the present invention also provide an enhanced aircraft performance substantiation solution to allow a user to interactively determine the mass properties of the aircraft while graphically configuring the loads on the aircraft. The user of the enhanced aircraft performance substantiation solution, accordingly, can be made aware, interactively, of any imbalance issues that may arise from having selected an incorrect load, having positioned a load at an incorrect station, or while configuring asymmetric loads on either side of the aircraft—especially where loads differ dramatically in dimensions and there are multiple load-sites which differ with respect to the loads that are acceptable thereupon.

Embodiments of the present invention also provide an enhanced aircraft performance substantiation solution to allow a user to customize the aircraft performance substantiation report with respect to particular variables representing the configured or selected loads, configurations, or assumptions, which may be varied for the purpose of creating a multi-dimensional plot or graph to show the relationship between the conditions and assumptions relevant to the selected maneuver with respect to the performance variables relevant to the selected maneuver, as manifest in the aircraft performance substantiation data. Embodiments of the present invention, accordingly, allow a user to rapidly and repeatedly change configurations, conditions, and assumptions, or survey across multiple configurations, conditions, and assumptions to produce, in real time, an enhanced aircraft performance substantiation report that is relevant to the selected aircraft and the selected maneuver, as well as selected survey variables.

Embodiments of the present invention can provide a machine to enhance aircraft performance substantiation for an aircraft selected from a plurality of preselected aircraft to more efficiently perform a mission by the aircraft. Embodiments of the present invention providing a machine can comprise a processor, a non-transitory memory positioned in communication with the processor to store computer program products therein, and a database to store data related to a plurality of preselected aircraft, a plurality of preselected aircraft maneuvers for each of the plurality of preselected aircraft, a plurality of aircraft dimensions for each of the plurality of preselected aircraft, a plurality of preselected loads of different types, and a plurality of aircraft load-sites being in or on each of the plurality of preselected aircraft and corresponding to one or more of the plurality of preselected loads.

Embodiments of the present invention providing a machine can further comprise an input/output unit in communication with the database and the processor to interactively communicate with a user through a user interface when positioned in communication therewith to receive user selections for and to display a scale graphical representation of one or more of the plurality of preselected aircraft when being used by a user.

Embodiments of the present invention providing a machine can further comprise a first computer program product stored in the non-transitory memory and operable on the processor to generate a load configuration for the user-selected aircraft by interactively modeling one or more of the plurality of preselected loads with respect to one of the plurality of preselected aircraft to thereby define an aircraft load configuration module.

Embodiments of the present invention providing an aircraft load configuration module can have a set of instructions comprising an instruction of generating a display at the user interface of a scale graphic representation of a user-selected aircraft responsive to a selection of the user-selected aircraft by a user received from the user interface through the input/output unit, the scale graphic representation of the user-selected aircraft being scaled responsive to the plurality of aircraft dimensions of the user-selected aircraft. Embodiments of the present invention providing an aircraft load configuration module can have a set of instructions further comprising an instruction of generating a display at the user interface of a plurality of load selection fields, each of the plurality of load selection fields being for a respective aircraft load-site of the plurality of aircraft load-sites in or on the user-selected aircraft, each of the plurality of load selection fields being positioned responsive to the plurality of aircraft dimensions of the user-selected aircraft and a plurality of aircraft load-site dimensions of the respective aircraft load-site, each of the plurality of load selection fields being positioned to receive a selection one or more of the plurality of preselected loads of different types corresponding to the respective aircraft load-site at the database. Embodiments of the present invention providing an aircraft load configuration module can have a set of instructions further comprising an instruction of interactively updating the scale graphic representation of the user-selected aircraft to include an oriented graphic representation of a user-selected load at a target aircraft load-site, the user-selected load being received from the user interface through the input/output unit responsive to a selection of the user-selected load by a user at a load selection field for the target aircraft load-site, the oriented graphic representation of the load being oriented responsive to the plurality of aircraft dimensions of the user-selected aircraft, a plurality of load dimensions of the user-selected load, and a plurality of aircraft load-site dimensions of the target aircraft load-site. Embodiments of the present invention providing an aircraft load configuration module can have a set of instructions further comprising an instruction of interactively determining a plurality of mass properties of the user-selected aircraft responsive to the plurality of aircraft dimensions of the user-selected aircraft, the plurality of load dimensions of the user-selected load, and the plurality of aircraft load-site dimensions of the target aircraft load-site.

Embodiments of the present invention providing a machine can further comprise a second computer program product stored in the non-transitory memory and operable on the processor to generate a mission configuration for one or more of the plurality of preselected aircraft to define an aircraft mission configuration module.

Embodiments of the present invention providing an aircraft mission configuration module can have a set of instructions comprising an instruction of generating a display at the user interface of a maneuver selection field responsive to determining a plurality of preselected maneuvers responsive to the user-selected aircraft. Embodiments of the present invention providing an aircraft mission configuration module can have a set of instructions further comprising an instruction of determining a plurality of operation variables and a plurality of performance variables responsive to a selection of a maneuver of the plurality of maneuvers from the database, the selection of the maneuver being by a user and received from the user interface through the input/output unit, the maneuver defining a user-selected maneuver. Embodiments Of the present invention providing an aircraft mission configuration module can have a set of instructions further comprising an instruction of generating a display at the user interface of a plurality of operation property selection fields, each of the plurality of operation property selection fields being responsive to one of the plurality of operation variables and being positioned to receive a user selection of an operation property corresponding to the one of the plurality of operation variables.

Embodiments of the present invention providing a machine can further comprise a third computer program product stored in the non-transitory memory and operable on the processor to generate an aircraft performance substantiation responsive to the mission configuration and the load configuration to thereby define an aircraft performance substantiation module.

Embodiments of the present invention providing an aircraft performance substantiation module can have a set of instructions comprising an instruction of generating a display at the user interface of a plurality of dependent-variable selection fields, each of the plurality of dependent-variable selection fields corresponding to the one of the plurality of performance variables to receive a user selection of a dependent variable. Embodiments of the present invention providing an aircraft performance substantiation module can have a set of instructions further comprising an instruction of generating a display at the user interface of a plurality of independent-variable selection fields each of the plurality of independent-variable selection fields corresponding to the one of the plurality of operation variables and one of a plurality of mass variables to receive a user selection of an independent variable. Embodiments of the present invention providing an aircraft performance substantiation module can have a set of instructions further comprising an instruction of determining a plurality of independent properties responsive to a predefined range, a predefined increment and one of a plurality of user-selected operation properties and the plurality of mass properties, each of the plurality of independent properties corresponding to a user-selected independent variable received from the user interface through the input/output unit responsive to a user selection of an independent variable at one of the plurality of independent-variable selection fields, each of the plurality of user-selected operation properties being received from the user interface through the input/output unit responsive to a user selection of an operation property at one of the plurality of operation property selection fields. Embodiments of the present invention providing an aircraft performance substantiation module can have a set of instructions further comprising an instruction of determining a plurality of dependent properties of the user-selected aircraft for each of the plurality of independent properties, the determining operation being responsive to the respective independent property of the plurality of independent properties and at least one other of the plurality of user-selected operation properties and the plurality of mass-properties, each of the plurality of dependent properties corresponding to a user-selected dependent variable received from the user interface through the input/output unit responsive to a user selection of a dependent variable at one of the plurality of dependent-variable selection fields. Embodiments of the present invention providing an aircraft performance substantiation module can have a set of instructions further comprising an instruction of generating a display of an aircraft performance substantiation at the user interface responsive to determining the plurality of dependent properties of the user-selected aircraft, the display including a plot of each of the plurality of dependent properties for each respective independent property of the plurality of independent properties, the plot having the user-selected dependent variable as its Y-axis and the user-selected independent variable as its X-axis.

BRIEF DESCRIPTION OF THE DRAWINGS

So that the manner in which the features and advantages of the invention, as well as others which will become apparent are attained and can be understood in more detail, a more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

FIG. 4A is an exemplary interactive display at a user interface according to an embodiment of the present invention.

FIG. 4B is an exemplary interactive display at a user interface according to an embodiment of the present invention.

FIG. 4C is an exemplary interactive display at a user interface according to an embodiment of the present invention.

FIG. 4D is an exemplary interactive display at a user interface according to an embodiment of the present invention.

FIG. 13A is a spreadsheet that shows an exemplary table export according to an embodiment of the present invention.

FIG. 13B is a spreadsheet that shows an exemplary table export according to an embodiment of the present invention.

DETAILED DESCRIPTION

The present invention is directed to embodiments of machines, computer program products, and computer-implemented methods for interactively modeling and calculating aircraft properties, including aircraft performance properties. Such embodiments of machines, computer program products, and computer-implemented methods are ideally suited, for example, for use in applications that require aircraft performance substantiation data such as aircraft manufacturing, airworthiness certification, aircraft maintenance, aircraft operation, mission planning, aircraft procurement, aircraft configuration, and aircraft inspection. Such embodiments provide enhanced aircraft performance substantiation solution by allowing users or customers to interactively model and determine critical aircraft properties. For example, upon making selections with respect to a selected aircraft and a selected maneuver, users can more efficiently obtain aircraft performance substantiation data of interest respective to those selections for the selected aircraft and selected maneuver. Such embodiments also provide a enhanced aircraft performance substantiation solution suitable for users to interactively obtain aircraft performance substantiation data for both on-board and off-board needs, for example, using a web-based user interface, including the use of a web browser such as Microsoft® Internet Explorer® by Microsoft Corporation of Redmond, Wash., to present or display aircraft performance substantiation data or as an interactive digital performance flight manual.

Figure 1:
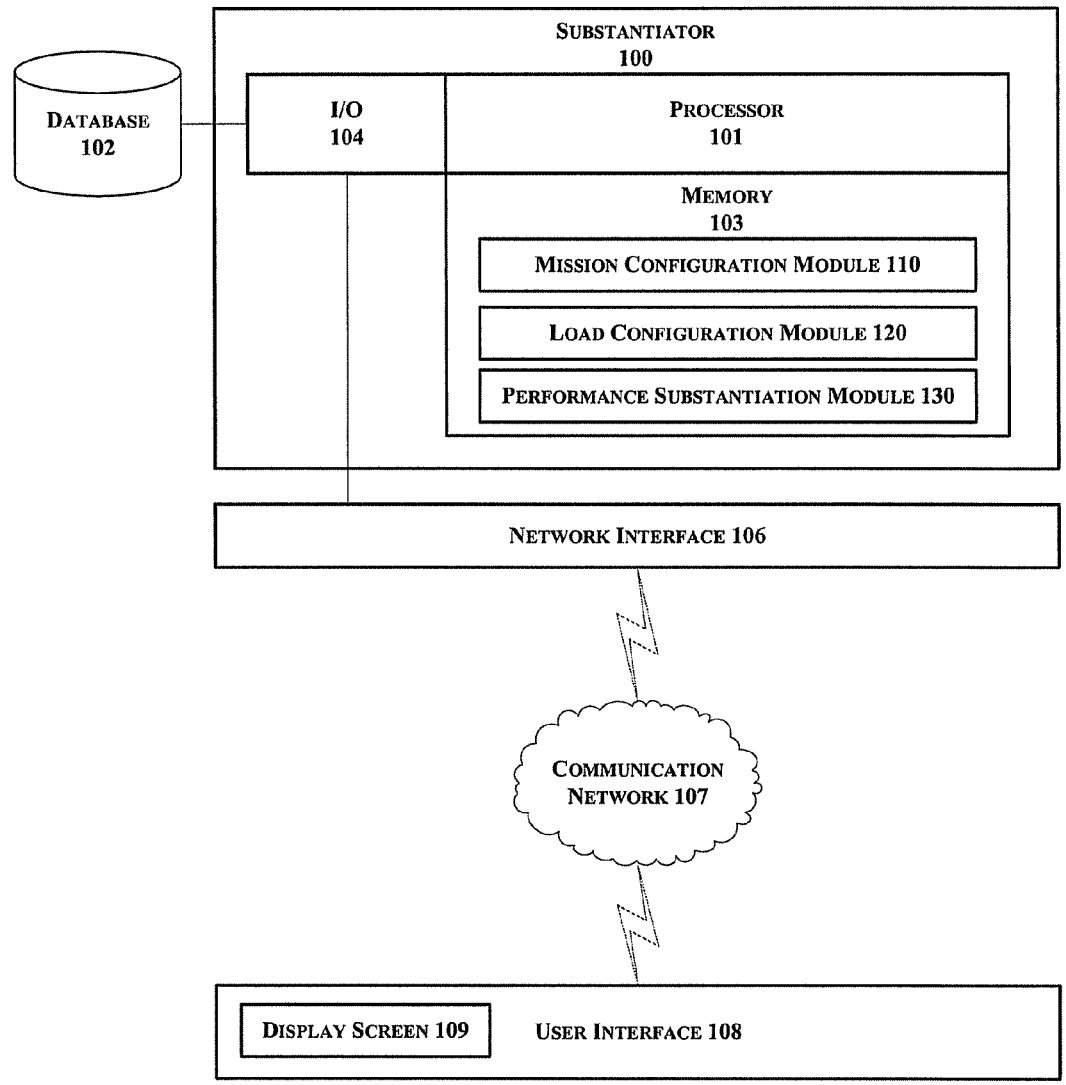
FIG. 1 is a schematic diagram that shows an exemplary embodiment of a machine according to an embodiment of the present invention.

An embodiment of a machine providing an enhanced aircraft performance substantiation solution (a "substantiator")

according to the present invention can be shown with reference to FIG. 1. The substantiator 100 can be, for example, a computer, a server (such as an application server or a web server), a machine, or set of distributed computers or servers that includes a non-transitory memory 103, a program product or program products, e.g., 110-130, a processor or processors 101, an input/output device or devices ("I/O") 104, and a database 102.

I/O 104 connects the substantiator 100 to the database 102, a network interface 106, and a user interface 108 to thereby allow the substantiator 100 to send and receive commands and data. I/O 104 can be any I/O including, but not limited to a network card/controller connected by a PCI (Peripheral Component Interconnect) bus to the motherboard, or hardware built into the motherboard of the substantiator 100 to connect same to the forgoing database, interface, and apparatus. As those of skill in the art will appreciate, I/O 104 can connect the substantiator 100 with any other compatible machine, server, system, device, or equipment having a suitable physical interface and that I/O 104 and/or computer program product or products 110-130 on non-transitory memory 103 may be positioned to understand, convert, or translate application or communication protocols of such machines, servers, systems, devices, or equipment irrespective of native protocols.

I/O 104 can connect the substantiator 100 to a user interface 108 according to methods that will be understood by those of skill in the art, including connecting through a network interface 106 and a communication network 107. A network interface 106 can be, for example, any logical or physical device or technology necessary to effect a connection with any of the aforementioned devices or networks, including, for example, hubs, switches, routers, converters, amplifiers, and wireless transceivers. One having skill in the art will understand that I/O 104 can also include or otherwise incorporate any logical or physical technology necessary to effect a connection with any of the aforementioned devices, including, for example, hubs, switches, routers, converters, amplifiers, and wireless transceivers.

User interface 108 can be, for example, any local or remote user interface including devices or peripherals that, or being otherwise configured to, receive input from an end user and display output to an end user. A user interface may include, for example, any type of web-accessible computer or device, e.g., mobile handheld unit or cock-pit mounted unit, having or connected to a screen 109, such as a monitor or screen, for example, and an input mechanism (not shown), such as a keyboard, touchpad, joystick, microphone, or mouse, for example. One having skill in the art will also understand that user interface 108 may also include or be connected to any peripheral or any logical or physical technology to effect a connection with any of the aforementioned functionality or devices, including, for example, hubs, switches, routers, converters, amplifiers, busses, ports, and transceivers. The user interface 108 can execute, and the screen 109 can present to a user the graphical user interface for, any sort of browser, such as Microsoft® Internet Explorer® by Microsoft Corporation of Redmond, Wash., for example, capable of receiving input, commands, scripts, markup language, programs, images, and so on, such as Hypertext Markup Language ("HTML"), Extensible Markup Language ("XML") or other supported formats that will be known to those having skill in the art that allow the user interface 108 to display content to a user at the screen 109 and to receive input and selections responsive to the content displayed, for example, through the use of HTML form fields as will be understood by those having skill in the art.

As can be shown in FIG. 1, the I/O 104 is connected to a processor 101. The processor 101 is the "brains" of the substantiator 100, and as such executes program product or products 110-130 and works in conjunction with the I/O 104 to direct data to the non-transitory memory 103 and to send data or commands from the non-transitory memory 103 to the database 102, the network interface 106, and the user interface 108. The processor 101 can be any commercially available processor, or plurality of processors, adapted for use in or with the substantiator 100, e.g., Intel® Xeon® multi-core processors, Intel® micro-architecture Nehalem, and AMD Opteron™ multi-core processors. As one skilled in the art will appreciate, processor 101 may also include components that allow the substantiator 100 to be connected to a display, as will be understood by those skilled in the art, and keyboard or other peripherals that would allow a user to directly or indirectly access the processor 101 and non-transitory memory 103.

Non-transitory memory 103 stores computer program product or products 110-130 having instructions for execution on the processor 101, and consists of both non-volatile memory, e.g., hard disks, flash memory, optical disks, and the like, and volatile memory, e.g., SRAM, DRAM, and SDRAM as required to support embodiments of the instant invention. As one skilled in the art will appreciate, though the non-transitory memory 103 is depicted on, e.g., a motherboard, of the substantiator 100, the non-transitory memory 103 may also be a separate component or device, e.g., FLASH memory, connected to the substantiator 100 through the I/O 104. The non-transitory memory 103 may also store applications that various workstations or remote units can access and run on the substantiator 100. For example, user at the user interface 108 may access applications and computer program products stored on the non-transitory memory 103 and run on the processor 101. Importantly, non-transitory memory 103 stores the program product or products 110-130 of the instant invention. As one skilled in the art will understand, the program product or products 110-130, along with one or more databases/tables/fields/records for data can be stored either in non-transitory memory 103 or in separate non-transitory memory associated, for example, with a storage medium such as database 102, positioned in communication with the substantiator 100 through the I/O 104.

As can be shown in FIG. 1, the database 102 is in communication with the substantiator 100. Although the database 102 is illustrated according to an embodiment in which the database 102 is separate and distinct from the substantiator 100, for example, as a database server, the present invention may also include any arrangement of the database 102 in communication with the substantiator 100, including the database 102 being incorporated into the same computer, server, machine, or system including the substantiator 100, as one physical unit, for example, as an installed component of the substantiator 100 communicating with the processor 101 through the use of the I/O and having, for example, a database memory separate and distinct from memory 103, such as a hard drive, optical storage, or the like. Database 102, as is understood in the art, can include a processor directing data from a bus into the database memory, which can be, for example, a hard drive, optical storage or the like, and computer software that provides computers, including the substantiator 100, access to the data therein.

Figure 5:
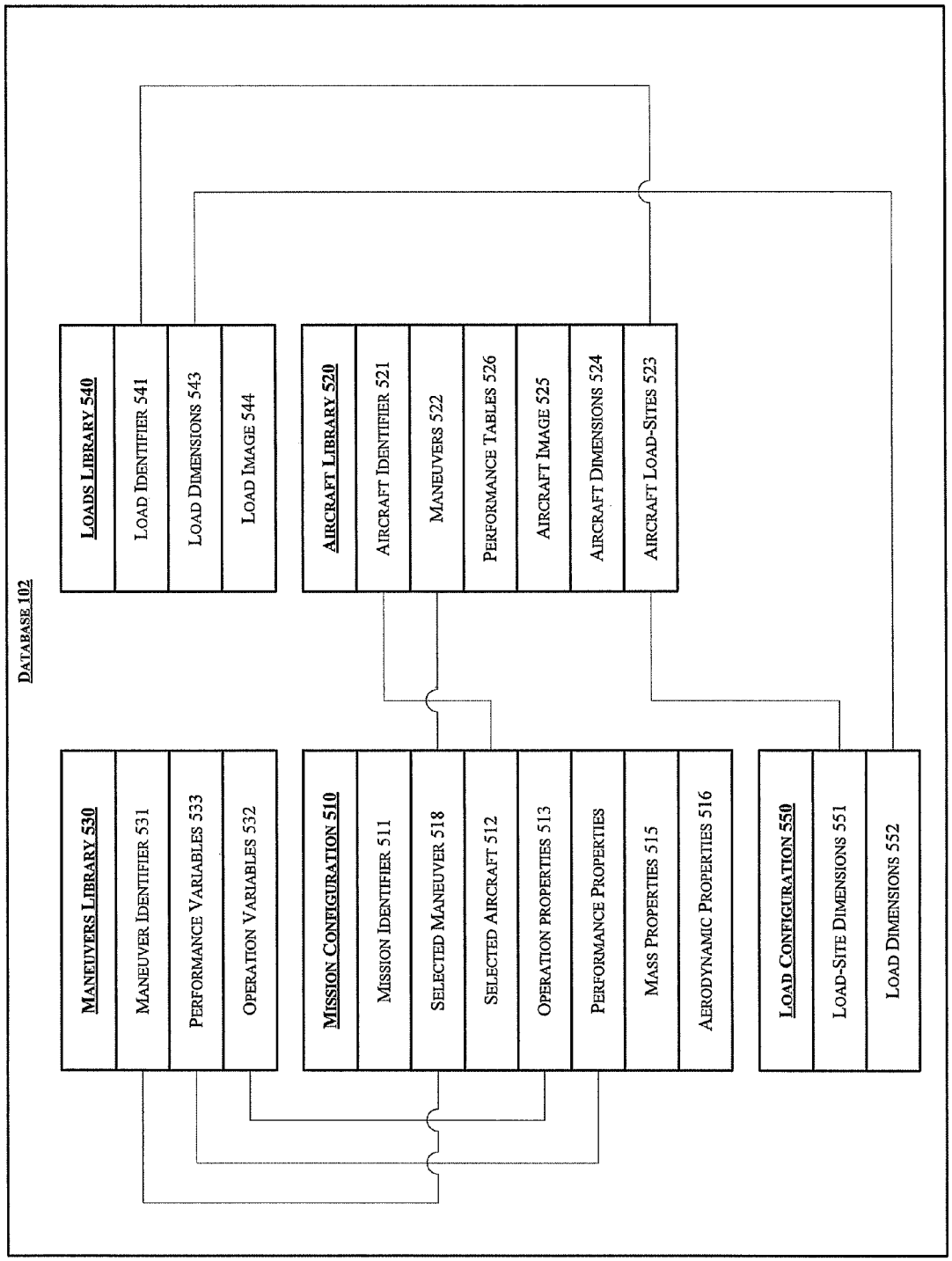
FIG. 5 is a schematic diagram that shows an exemplary embodiment of data structures according to an embodiment of the present invention.

The database 102 can store therein a data structure or data structures relating to aircraft performance substantiation data, as is further described herein. Database 102 can be, for example, any sort of database, set of XML libraries, a flat file, a relational database, a file and directory structure, or a multidimensional database positioned to store and structure data so that data may be stored in fields or files of tables or directories and linked to other fields or other tables using identifiers or table data. FIG. 5 illustrates an exemplary set of data tables 510, 520, 530, 540, and 550, although data stored in fields therein may be structured in various other ways as will be appreciated by those having skill in the art. Data stored in fields of the database 102 may be updated as needed, for example, by a user with administrative access to the database to add new data to the libraries in the database as they become supported. It will be appreciated by those having skill in the art that data described as being stored in the database 102, in any table, such as the mission configuration table 510 or the load configuration table 550, or in any record, entry, or variable may be stored or maintained, instead, in non-transitory memory 103 or a non-transitory memory of the user interface and accessed among subroutines, functions, modules, objects, program products, or processes for example, according to global variables or according to variables passed between such subroutines, functions, modules, objects, program products or processes, for example, as command line arguments, function parameters, or arguments in an web address.

Aircraft Load Configuration Module

As can be shown with reference to FIG. 1, the aircraft load configuration module 120 can be, for example, a computer program product stored in the non-transitory memory 103 and operable on the processor 101. As can be shown with reference to FIG. 2A, the aircraft load configuration module 120 can generate an interactive display of a scale graphic representation of a user-selected aircraft responsive to receiving a selection of the user-selected aircraft, generate an interactive display of a plurality of load selection fields positioned responsive to a plurality of aircraft dimensions and a plurality of aircraft load-site dimensions to receive a user-selected load of one or more of a plurality of preselected loads, interactively update the interactive display to include an oriented graphic representation of a user-selected load at a target aircraft load-site, and interactively determine a plurality of mass properties of the user-selected aircraft responsive to the plurality of aircraft dimensions of the user-selected aircraft, the plurality of load dimensions of the user-selected load, and the plurality of aircraft load-site dimensions of the target aircraft load-site.

Accordingly, the load selection fields being positioned in the interactive display 400 allows a user to more effectively configure an aircraft by selecting loads at a position relative to the position of the corresponding load-site. For example, the user may be able to more precisely achieve a desired balance in the configuration of an aircraft by configuring the loads while the user is aware of the relative positioning of the different load-sites during the configuration process. The selection of a load with respect to a load-site allows determination of the aircraft performance properties of the user-selected aircraft having the respective load loaded at the respective load-site. By way of example, a load-site may be any bay, station, pylori, hard point, tank, area, seat, or cargo hold, of an aircraft capable of holding a load. The plurality of load-sites of the user-selected aircraft 301 can be determined responsive to identifying all load-sites in the load-sites data field 523 for the user-selected aircraft 301 at the aircraft library 520.

Figure 2A:
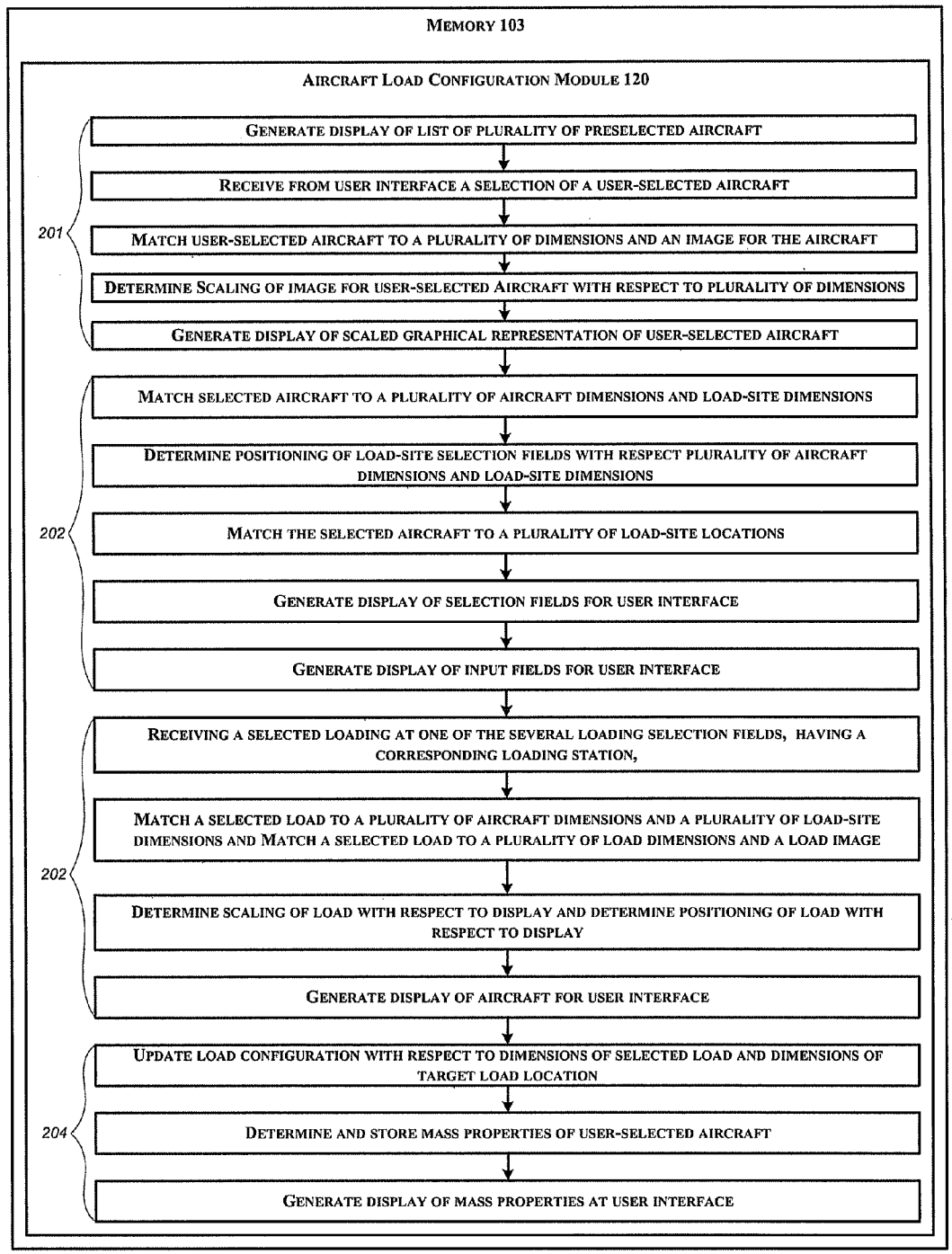
FIG. 2A is a block diagram that shows an exemplary computer program product according to embodiments of the present invention.
Figure 6:
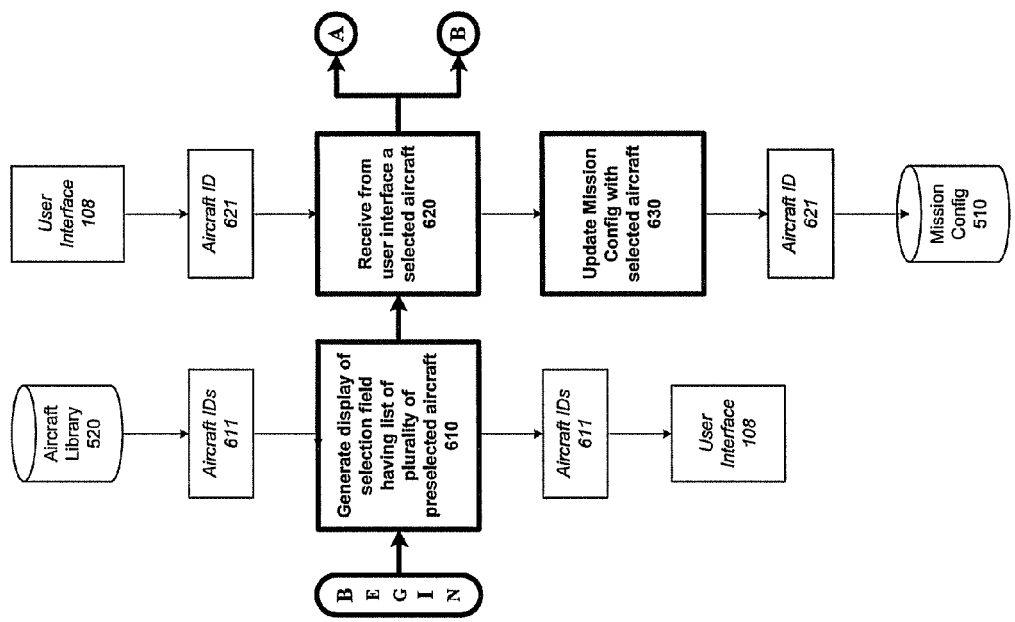
FIG. 6 is a flowchart that shows an exemplary process according to an embodiment of the present invention.

As can further be shown with reference to step 201 of FIG. 2A, the aircraft load configuration module 120 can generate an interactive display at the user interface of a scale graphic representation of a user-selected aircraft responsive to a selection of the user-selected aircraft by a user received from the user interface through the input/output unit, the scale graphic representation of the user-selected aircraft being scaled responsive to the plurality of aircraft dimensions of the user-selected aircraft. The operation of an exemplary aircraft load configuration module 120 according to step 201 can be shown with reference to FIG. 6; and the interactive display 400 with respect to such operation can be shown with reference to FIG. 4A. Exemplary data structures described with respect to step 201 can be shown with reference to FIG. 5.

The aircraft load configuration module 120 can receive 620 from the interactive display 400 a selection of a user-selected aircraft 301 having an aircraft identifier 621. The aircraft load configuration module 120 can receive 620 the selection of the user-selected aircraft 301 including the aircraft identifier 621 for the user-selected aircraft 301, for example, using an aircraft selection field 302 such as an HTML FORM SELECT field. Those having skill in the art will appreciate that the selection of the user-selected aircraft 301 including the aircraft identifier 621 for the user-selected aircraft 301 can be received using any other means for receiving a selection, identification, or other input (collectively, a "selection" herein) of an aircraft, such as an HTML FORM TEXT field or a RADIO field, for example—although such means, as will be understood by those of skill in the art, are not limited to the HTML. The aircraft selection field 302 may be generated 610 by the aircraft load configuration module 120 for display on the interactive display 400 responsive to a plurality of aircraft identifiers 611 for a plurality of preselected aircraft at the aircraft library 520. The aircraft selection field 302, may contain a list of the plurality of preselected aircraft in a drop down selection box, such as the SELECT field as shown for the aircraft selection field 302. As used herein, the generation of an interactive display at a user interface can include generating markup language (such as HTML) or any other type of script, applet, object, image, image map, or file capable of being received and at the user interface 108 to allow a corresponding display to be presented at the screen 109 of the user interface 108.

Responsive to receiving the user-selected aircraft 301 or the aircraft identifier 621 for the user-selected aircraft 301, the aircraft load configuration module 120 can store or update 630 a mission configuration 510 to include the aircraft identifier 621 for the user-selected aircraft 301, thereby allowing other modules, processes, subroutines, functions, objects, program products, and so on to reference the user-selected aircraft 301 or the aircraft identifier 621 for the user-selected aircraft 301. The aircraft identifier 621 for the user-selected aircraft 301, as those skilled in the art will recognize, can be one or more interchangeable identifiers such as a string of computer text or characters (e.g., alphanumeric characters) serving to identify the user-selected aircraft 301 as a primary key in the aircraft library 520 or any string of computer text or characters (e.g., alphanumeric characters) serving to identify an aircraft to a user.

With reference to table 520 at FIG. 5, an aircraft library is shown having fields for an aircraft identifier 521, maneuvers 522, aircraft image 525, aircraft dimensions 524, and aircraft load-sites 523. The aircraft library 520 can be, for example, any table, chart, matrix, array, map, plan, list, index, or other flat file or multidimensional structure, or a reference to such, capable of storing data to represent such variables and/or properties. Any of these fields, for example, aircraft dimensions 524 and aircraft load-sites 523 can be multidimensional fields or arrays having named or numbered indexes so that several properties can be stored therein and indexed accordingly. The aircraft library 520 may also be, for example, a data structure stored in memory 102 or any set or sets of arguments or expressions passed between computer program products, such as is known to those of skill in the art for passing arguments to server-side web applications, such as PHP applications.

Figure 4A:
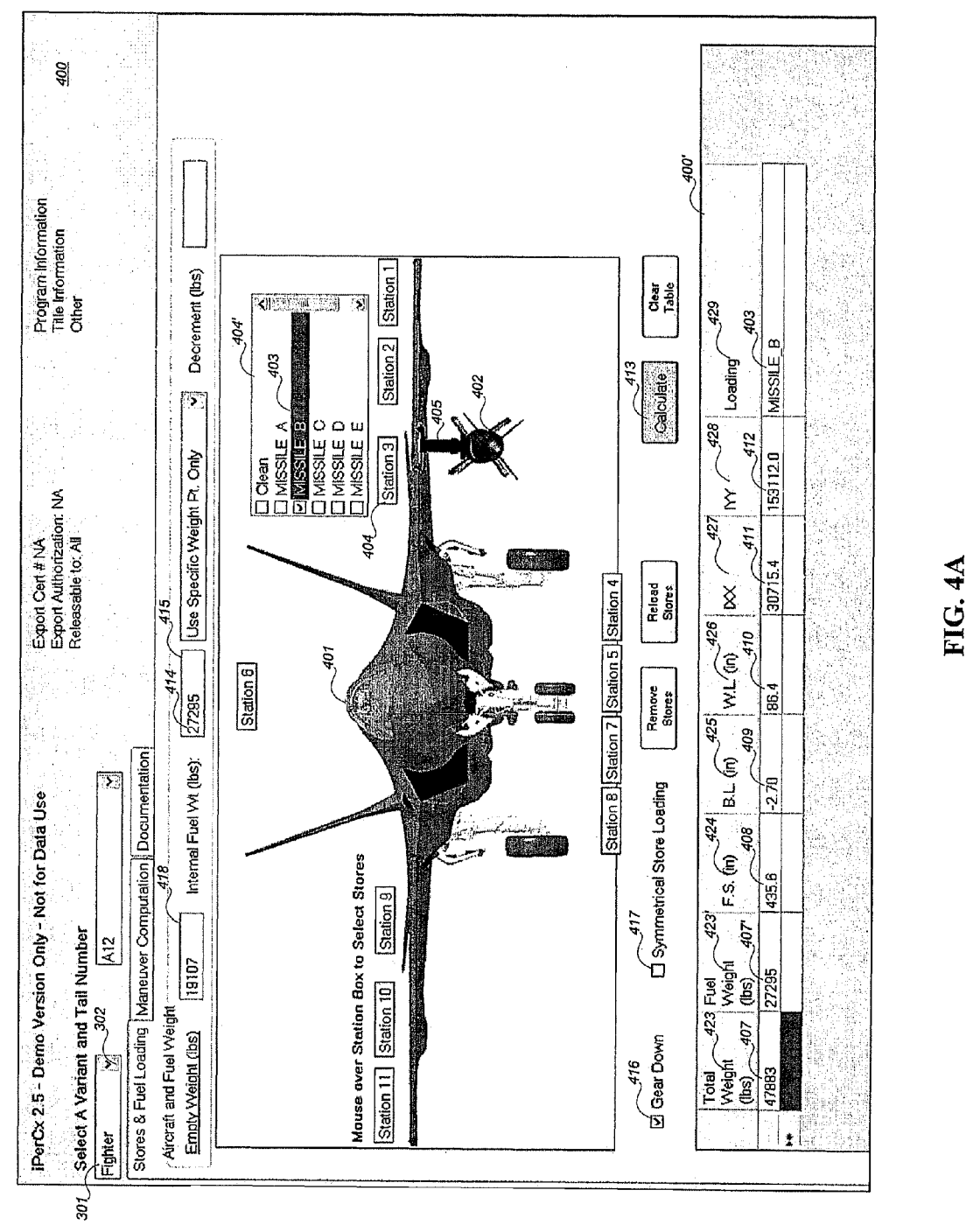
Figure 7:
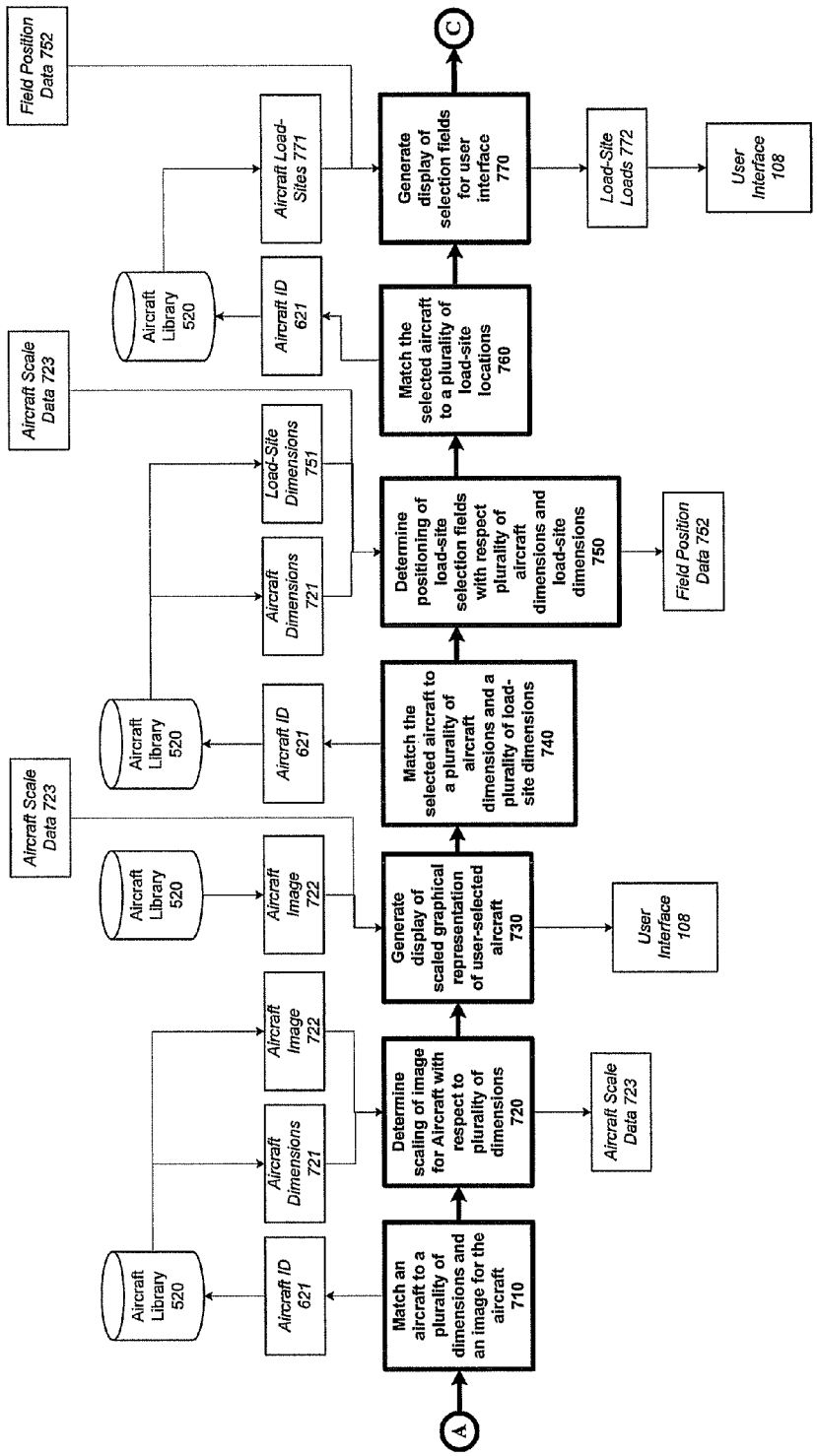
FIG. 7 is a flowchart that shows an exemplary process according to an embodiment of the present invention.

The operation of an exemplary aircraft load configuration module 120 according to step 201 is further shown with reference to FIG. 7; and the interactive display 400 with respect to such operation can be further shown with reference to FIG. 4A. Exemplary data structures described with respect to step 201 can be shown with reference to FIG. 5. The aircraft load configuration module 120 can match 710 the user-selected aircraft 301 to a plurality of aircraft dimensions 721 and an aircraft image 722 using the aircraft identifier 621 as a primary key 521 at the aircraft library 520 to link to an aircraft dimensions field 524 and an aircraft image field 525 to receive a plurality of aircraft dimensions 721 and an aircraft image 722, respectively, matching the aircraft identifier 621.

The aircraft image field 525 may include a table, chart, matrix, array, map, file, list, index, or other data structure, or a reference to such, capable of storing or structuring data to graphically represent or model the appearance of an aircraft in any dimension or any number of dimensions. For example, each aircraft identifier 521 in the aircraft library 520 can be associated with data for displaying or rendering a graphical representation of the aircraft, including any type of raster graphic or vector graphic, or a reference thereto, for example, a bitmap, a compressed image, or formulas, coordinates, or other data for generating a vector-based solid, structure, or surface image of an aircraft.

The image 525 can be scaled to a size suitable for the interactive display 400, at any fixed or variable preselected or predefined scale, responsive to the plurality of dimensions of the aircraft at the dimensions field 524 of the aircraft table 520. The scale graphical representation 401 can be, for example, a graphical representation or model of the aircraft along its Y-axis and its Z-axis, wherein the Y-axis corresponds to the butt line ("BL") running from wing to wing and the Z-axis corresponds to the water line ("WL") running from bottom to top, so that the user can view the position of the aircraft, its load-sites, and loads with respect to the BL and WL dimensions of the aircraft. Similarly, the scale graphical representation may also be such along the aircraft's X-axis and Y-axis, wherein the X-axis corresponds to the fuselage station ("FS") running the length of the aircraft; along the X-axis and Y-axis; or along the all three axes, so thin the interactive display 400 can display the position of the aircraft, its load-sites, and loads in three-dimensions.

Embodiments provide for matching an aircraft to a plurality of dimensions of the aircraft. At field 524 of the aircraft library, an aircraft can be matched to a plurality of dimensions of the aircraft using the aircraft identifier 521 as a primary key. The aircraft dimensions field 524 can contain multidimensional data or multiple fields. The aircraft dimensions field 524, for example, may include a table, chart, matrix, array, map, list, index, or other multidimensional structure, or a reference to such, capable of storing and structuring data to represent a plurality of dimensions of an aircraft. Accordingly, the plurality of dimensions of an aircraft can include any information relating to the measures or other physical properties of the aircraft or components of the aircraft, including load-sites of the aircraft, in a three dimensional space (along the FS, BL, and WL axes) and can be expressed in a three-dimensional coordinate-based system, for example, zeroed on the intersection of the FS, BL, and WL axes. Dimensions of the aircraft can also include, for example, without limitation: length, wingspan, weight, centers of gravity, moments of inertia, coefficients of drag, wing dihedral angle, surface areas, pitch angles, and so on.

Responsive to the plurality of aircraft dimensions 721 and the aircraft image 722, the aircraft load configuration module 120 can determine 720 aircraft scaling data 723 for displaying the aircraft image 722 of the user-selected aircraft 301 at the user interface 108 according to a predefined scale. Alternatively, the aircraft image 722 may already have been defined with respect to a predefined scale (e.g., at creation), and no further scaling operations are necessary in generating the display of the scaled image 722. The defined scale may be used, for example, to allow a user-selected aircraft, user-selected loads for the aircraft, and load selection fields for the aircraft to be graphically displayed at the user interface according to a consistent scale and perspective. Aircraft scaling data 723 may include, for example, a ratio for relating the dimensions of the aircraft to the resolution or dimensions of a display at the user interface 108 (e.g., 1.25 cm to 1 pixel) and a vector representing the perspective for viewing the user-selected aircraft at the user interface. Those having skill in the art will appreciate that such ratio or vector may be defined, for example, at the user interface according to user preferences; for example zoom, pan, rotate, and other controls known to those of skill in the art may be employed at the user interface to provide such a ratio or vector. Responsive to the aircraft scale data 723 and the aircraft image 722, the aircraft load configuration module 120 can generate 730 a display of a scale graphical representation 401 in the interactive display 400 of the user-selected aircraft 301 using the aircraft image 722. The graphical representation 401 of the user-selected aircraft 301 can be generated, for example, according to techniques that will be understood by those having skill in the art, such as by image merging, image layering, and/or transparency techniques known to those of skill in the art, for example using cascading style sheets (CSS) and DIV elements therein to position and merge images on an HTML or XML document.

As can further be shown with reference to step 202 of FIG. 2A, the aircraft load configuration module 120 can generate a display at the user interface of a plurality of load selection fields, each of the plurality of load selection fields being for a respective aircraft load-site of the plurality of aircraft load-sites in or on the user-selected aircraft, each of the plurality of load selection fields being positioned responsive to the plurality of aircraft dimensions of the user-selected aircraft and a plurality of aircraft load-site dimensions of the respective aircraft load-site, each of the plurality of load selection fields being positioned to receive a selection one or more of the plurality of preselected loads of different types corresponding to the respective aircraft load-site at the database. The operation of an exemplary aircraft load configuration module 120 according to step 202 can be shown with reference to FIG. 7; and the interactive display 400 with respect to such operation can be shown with reference to FIG. 4A. Exemplary data structures described with respect to step 202 can be shown with reference to FIG. 5.

The aircraft load configuration module 120 can further match 740 the user-selected aircraft 301 to a plurality of aircraft dimensions 721 and a plurality of aircraft load-site dimensions 751 using the aircraft identifier 621 as a primary key 521 at the aircraft library 520 to link to an aircraft dimensions field 524 and an aircraft load-sites field 523 to receive a plurality of aircraft dimensions 721 and the plurality of aircraft load-site dimensions 751, respectively, matching the aircraft identifier 621.

The load-sites field 523 can contain multi-dimensional data or multiple fields. The load-sites field 523, for example, may include a table, chart, matrix, array, map, list, index, or other multidimensional structure, or a reference to such, capable of storing and structuring data to represent the multiple properties of the load-sites of an aircraft. For example, each aircraft entry 521 in the aircraft library 520 may have multiple load-sites identifiers in the load-site field 523, such as an array "loadsites" having fields "i", "n," "loadsite_dimensions", and "loadsite_loads", wherein i is the load-site identifier and n is the load-site name, such as "Station 1," "Station 2," "Station 3," and so on. Each load-site identifier can correspond to a physical load-site in or on the aircraft, including any bay, pylori, hard point, tank, area, seat, hold, and so on, that can accept, hold, or bear any load.

Each load-site identifier in the load-site field 523 may correspond to multiple dimensions of the load-site, which may be stored as multidimensional data or as a reference to additional arrays or tables, for example. Dimensions of the load-site may include the following load-site dimensions, for example, in an array "loadsite_dimensions" having fields: "fs_position" for the position of the center of the load-site on the FS axis, "wl_position" for the position of the center of the load-site on the WL axis, "bl_position" for the position of the center of the load-site on the BL axis, "fs_dimension" for the dimensions of the load-site along the FS axis, "wl_dimension" for the dimensions of the load-site along the WL axis, "bl_dimension" for the dimensions of the load-site along the BL axis, "volume", and "weight". Accordingly, the plurality of dimensions of each of the plurality of load-sites of an aircraft can include any information relating to the physical attributes of a load-site, including such information defined with respect to the aircraft in a three-dimensional coordinate-based system (such as the positioning of the load-site with respect to the axes of the aircraft).

Each load-site identifier in the load-site field 523 may correspond to multiple loads that can be positioned at the load-site, which may be stored as multidimensional data or as a reference to additional arrays or tables, for example. Loads that can be positioned at the load-site may include, for example, the following data in an array "loadsite_loads" having fields: "i" for the identifier of a load acceptable at the load-site, "x_position" for the position of the mounting point of the load on the load-site with respect to the X-axis of the load, "y_position" for the position of the mounting point of the load on the load-site with respect to the Y-axis of the load, "z_position" for the position of the mounting point of the load on the load-site with respect to the Z-axis of the load. Loads may include anything that can be placed on or in an aircraft positioned or mounted at a load-site of the aircraft, including, for example, fuel, missiles, crew, supplies, equipment, payload, cargo, and so on. Loads may also include, for example, components of the aircraft that can be positioned in different locations of the aircraft, such as the landing gear. Loads may also include, for example, loads of the aircraft that can be positioned in different locations of the aircraft, such as the fuel.

The identifiers of loads acceptable, for example, can be matched by load identifier 541 at the load library 540 to other load data, such as load type 542, load dimensions 543 (including, but not limited to, size, weight, drag coefficient, and other physical or aerodynamic properties), and image 544. As will be appreciated by those having skill in the art, the load dimensions field 543 may be structured as described with respect to the aircraft dimensions field 524. Load dimensions field may include, for example, the fields "x_dimension" for the dimension of the load along the X-axis of the load, "y_dimension" for the dimension of the load along the Y-axis of the load, "z_dimension" for the dimension of the load along the Z-axis of the load, "weight" for the weight of the load, "x_cg" for the center of gravity of the load along the X-axis of the load, "y_cg" for the center of gravity of the load along the Y-axis of the load, "z_cg" for the center of gravity of the load along the Z-axis of the load, "x_moi" for the moment of inertia along the X-axis of the load, and "y_moi" for the moment of inertia along the Y-axis of the load. The plurality of dimensions of a load can include any information relating to the measures or other physical properties of the load in a three dimensional space (along the X-, Y-, and Z-axes of the load) and can be expressed in a three-dimensional coordinate-based system.

Responsive to the plurality of aircraft dimensions 721 and the plurality of aircraft load-site dimensions 751, and further responsive to the aircraft scale data 723, the aircraft load configuration module 120 can determine 750 field position data 752 for displaying a plurality of load selection fields with respect to the graphical representation of the user-selected aircraft for displaying the load selection fields for the user-selected aircraft 301 at the user interface 108 according to the defined scale, so that a plurality of load selection fields may appear in the interactive display 400 positioned with relation to the appearance of corresponding aircraft load-sites.

The aircraft load configuration module 120 can further match 760 the user-selected aircraft 301 to a plurality of aircraft load-site loads 771 using the aircraft identifier 621 as a primary key 521 at the aircraft library 520 to link to an aircraft load-sites field 523 to receive a plurality of aircraft load-site loads 771, respectively, matching the aircraft identifier 621 for each load-site of the user-selected aircraft 301, so that the plurality of load selection fields may appear in the interactive display 400 pre-populated with the loads available to be positioned at the respective load-site, e.g., those loads listed in the loadsite_loads array.

The aircraft load configuration module 120 can generate 770 a display of a plurality of load selection fields, e.g., 404 for "Station 3", in the interactive display 400 responsive to the field position data 752, so as to be positioned in proximity to the location of a corresponding aircraft load-site, e.g., 405 for Station 3, in the graphical representation of the aircraft 401. As can be shown with reference to load selection fields for "Station 1" through "Station 11", for example, a display of a plurality of load selection fields may be generated for corresponding aircraft load-sites in the load-sites field 523 for the selected aircraft. The display of the plurality of load selection fields, e.g., 404, can be generated so that the plurality of load selection fields are positioned in the interactive display 400 using techniques that will be appreciated by those having skill in the art, for example, using cascading style sheets (CSS) and <div> elements therein to position and load selection fields on an HTML or XML document according to the position data 752. The relative position of a load-site corresponding to an input or selection field, e.g., 404, with respect to graphical representation 401 of the user-selected aircraft 301 can be determined responsive to comparing dimensions of the load-site, e.g., "fs_position", "wl_position", "bl_position", "fs_dimension", "wl_dimension", and "bl_dimension", e.g., as specified in the dimensions fields 524 for the user-selected aircraft 301 at the aircraft library 520. Each of the plurality of load selection fields, e.g., 404, can be positioned in the interactive display 400 according to the relative position of a corresponding load-site, e.g., 405, with respect to the scale graphical representation 401 of the user-selected aircraft 301, as is shown at the interactive display 400. Those having skill in the art will appreciate alternate methods of positioning the plurality of load selection fields at a user interface, such as by using static HTML pages or templates, server side programming (such as PHP) for generating dynamically generated HTML pages, or client-side programming (such as JavaScript™) for including dynamic content. The aircraft load configuration module 120 can further generate a display of the load selection fields, e.g., 415 for internal fuel weight, in the interactive display 400 at any general location with respect to the graphical representation of the aircraft 401. As can be shown with reference to load selection fields 415 for landing gear position and 418, for example, a display including a plurality of load selection fields may be generated with respect to other aircraft load-sites in the load-sites field 523 for the selected aircraft.

The aircraft load configuration module 120 can generate 770 an interactive display 400 including the load selection fields, e.g., 404 for "Station 3", responsive to a plurality of load-site loads 771 at the aircraft library 520, so as to contain a list of the plurality of loads available 772 for selection in the load selection field, such as in a drop down box as can be shown in the aircraft load selection field 404'. The plurality of load selection fields, as can be shown in the loads section field 415 of the interactive display 400, can be, for example, using an, HTML <TEXT> box allowing a user to input a load value, a load name, or a load identifier or an HTML <SELECT> box as can be shown in the loads section field 404', allowing the user to select a load name, e.g., 403, corresponding to a load identifier. Aircraft load selection field 404' may appear, for example, upon a user focusing ("mouse-over") or clicking-on the aircraft load selection field 404, as will be understood by those having skill in the art. The aircraft load selection field 404' for selecting a load can be populated with loads, for example, responsive to the load-site loads 771 available to be positioned at the respective load-site, for example, using static HTML pages or templates, server side programming (such as PHP) for generating dynamically generated HTML pages, or client-side programming (such as JavaScript™) for including dynamic content. The plurality of loads available to be positioned at a respective load-site can be determined responsive to identifying the target aircraft load-site for the user-selected aircraft 301 at the aircraft library 520, such as by using a load-site identifier, identifying all available loads in a loads array at field 523, e.g., loadsite_loads, and matching a load identifier 541 or load name or type 542 at the loads library 540. Furthermore, the load selection field may be an empty or pre-filled input text field, e.g., 415, requiring the input of a load value, for example, for a load-site such as fuel, a user may input a weight, volume, mass, or other quantitative indicia of the load. The selection of a load value may be required, for example, for a load-site such as the landing gear; the load value can be, for example, a binary toggle selection, e.g., 416, to indicate whether the maneuver will be performed with the load in one position (e.g., "landing gear up") or another position (e.g., "landing gear down"), which can correspond to load-site dimensions in the array "loadsite_dimensions" being defined separately with respect to multiple load positions.

As can be shown with reference to selection field 417, the load-site selection fields on one side of the aircraft can be configured to "mirror" those of the other side of the aircraft responsive to receiving input at a binary toggle selection, i.e., a checkbox. The load-site selection fields can be configured responsive to receiving input at a binary toggle selection interactively using techniques that will be appreciated by those having skill in the art, for example, by using server-side application functionality, e.g., PHP, or client-side application or script functionality, e.g., Java™ or JavaScript™, to update the values (i.e., the loads) at one set of load-site selection fields using the values user-selected at another set of load-site selection fields.

As can further be shown with reference to step 203 of FIG. 2A, the aircraft load configuration module 120 can interactively update the scale graphic representation of the user-selected aircraft to include an oriented graphic representation of a user-selected load at a target aircraft load-site, the user-selected load being received from the user interface through the input/output unit responsive to a selection of the user-selected load by a user at a load selection field for the target aircraft load-site, the oriented graphic representation of the load being oriented responsive to the plurality of aircraft dimensions of the user-selected aircraft, a plurality of load dimensions of the user-selected load, and a plurality of aircraft load-site dimensions of the target aircraft load-site. As used herein, the orientation of a graphical representation of a user-selected load refers to the scaling and the positioning of a graphical representation of the user-selected load with respect to the graphical representation of the user-selected aircraft. Scaling refers to configuring the size of the graphical representation of the user-selected load to be commensurate with the size of the graphical representation of the user-selected aircraft so that both of these graphical representations appear proportionate according to the actual real-world proportions of the respective user-selected load and user-selected aircraft, as is reflected in the dimensions field for the user-selected load and the user-selected aircraft. Positioning refers to displaying the graphical representation of the user-selected load at the proper location with respect to the graphical representation of the user-selected aircraft responsive to the position of a target aircraft load-site on the graphical representation of the aircraft. The operation of an exemplary aircraft load configuration module 120 according to step 203 can be shown with reference to FIG. 8; and the interactive display 400 with respect to such operation can be shown with reference to FIG. 4A. Exemplary data structures described with respect to step 203 can be shown with reference to FIG. 5.

The aircraft load configuration module 120 can receive 810 a selection of a load 403 (a "selected load") at an aircraft load selection field 404, such as an HTML FORM SELECT field, that corresponds to an aircraft load-site 405 (a "target aircraft load-site"). Those having skill in the art will appreciate that the user-selected load 403 and the target aircraft load-site 405 can be received using any other means for receiving a selection, identification, or other input of a user-selected load, such as an HTML FORM TEXT field or a RADIO field, for example, though the means are not limited to the use of HTML. Responsive to receiving the user-selected load 403, the aircraft load configuration module 120 can store 811, 812 the user-selected load 403 and the target aircraft load-site 405 in memory 103, for example, to allow other modules, processes, subroutines, functions, objects, program products, and so on to reference the user-selected load 403.

The aircraft load configuration module 120 can further match 820 the user-selected aircraft 301 to a plurality of aircraft dimensions 621 for the user-selected aircraft 301 using the aircraft identifier 621 as a primary key 521 at the aircraft library 520 to link to an aircraft dimensions field 524 to receive a plurality of aircraft dimensions 721 matching the aircraft identifier 621. The aircraft load configuration module 120 can further match 820 the user-selected aircraft 301 to a plurality of load-site dimensions 831 for the target aircraft load-site 405 of the user-selected aircraft 403 using the aircraft identifier 621 as a primary key 521 at the aircraft library 520 to link to an aircraft dimensions field 524 and an aircraft load-sites field 523 to receive a plurality of aircraft load-site dimensions 831, respectively, matching the aircraft identifier 621. Responsive to the plurality of aircraft dimensions 621 and the aircraft load-site dimensions 831, and responsive to the aircraft scale data 723, the aircraft load configuration module 120 can determine 830 load position data 832 for displaying the user-selected load 403 with respect to the graphical representation of the user-selected aircraft at the interactive display 400.

The aircraft load configuration module 120 can further match 840 the user-selected load 403 to a plurality of load dimensions 851 and a load image 852 for the user-selected load 403 using the user-selected load 811 as a primary key 541 at the loads library 540 to link to a load dimensions field 543 to receive a plurality of load dimensions 851 and a load image 852 matching the user-selected load 811. Responsive to the plurality of load dimensions 851 and load image 852, and further responsive to the aircraft scale data 723, the aircraft load configuration module 120 can determine 850 load scale data 853 for displaying the user-selected load 403 with respect to the graphical representation 401 of the user-selected aircraft at the interactive display 400, according to a defined scale. Responsive to the load scale data 853, the load position data 832, and the aircraft scale data 832, the aircraft load configuration module 120 can generate 860 a display of a graphical representation 401 of the user-selected aircraft 301 and a graphical representation of the user-selected load 403 using both the aircraft image 722 and the load image 852 to form a composite graphical representation. The composite graphical representation 401 of the user-selected aircraft 301 and the user-selected load 403 can be generated, for example, according to techniques that will be understood by those having skill in the art, such as by image merging, image layering, and/or transparency techniques known to those of skill in the art, for example using cascading style sheets (CSS) and DIV elements therein to scale, position, and merge the aircraft image and load image on an HTML or XML document.

The image field 544 may be a table, chart, matrix, array, map, plan, list, index, or other multidimensional structure, or a reference to such, capable of storing and structuring data to represent or model the appearance of the load in any dimension or any number of dimensions. For example, each load entry 541 in the load library 540 may be associated with source data for displaying or rendering an image of the load, including a bitmap image, a compressed image, any other type of raster graphic, a hash or reference to either any file containing a bitmap, compressed image, or a raster graphics, or formulas, coordinates, or other data for generating a vector-based or solid or surface modeled image of an aircraft. The computer program product an scale the dimensions of the image 544 responsive to the dimensions of the load in the dimensions field 543 of the aircraft table 520, the scale being based on the same scale used to scale the dimensions of the image 525 of the user-selected aircraft as described with respect to step 205. Those having skill in the art will appreciate alternate methods of scaling the graphical representation of the load 402 at the interactive display 400, for example, by using templates, server side application functionality (such as PHP), or client-side application or script (such as JavaScript™). The image 544 can be scaled to a size suitable for the interactive display 400, according to the scale used in scaling the image 525 of the aircraft, responsive to the plurality of dimensions of the load at the dimensions field 543 of the load table 540. The scale graphical representation 401 can include, for example, a graphical representation or model of the load along its Y-axis and its Z-axis, wherein the Y-axis corresponds to the butt line ("BL") running from wing to wing and the Z-axis corresponds to the water line ("WL") running from bottom to top, so that the user can view the position of the load with respect to the BL and WL dimensions of the load. Similarly, the scale graphical representation may also be such along the load's X-axis and Y-axis, wherein the X-axis corresponds to the fuselage station ("FS") running the length of the load; along the X-axis and Y-axis; or along the all three axes, so thin the interactive display 400 can display the load in three-dimensions.

Figure 4B:
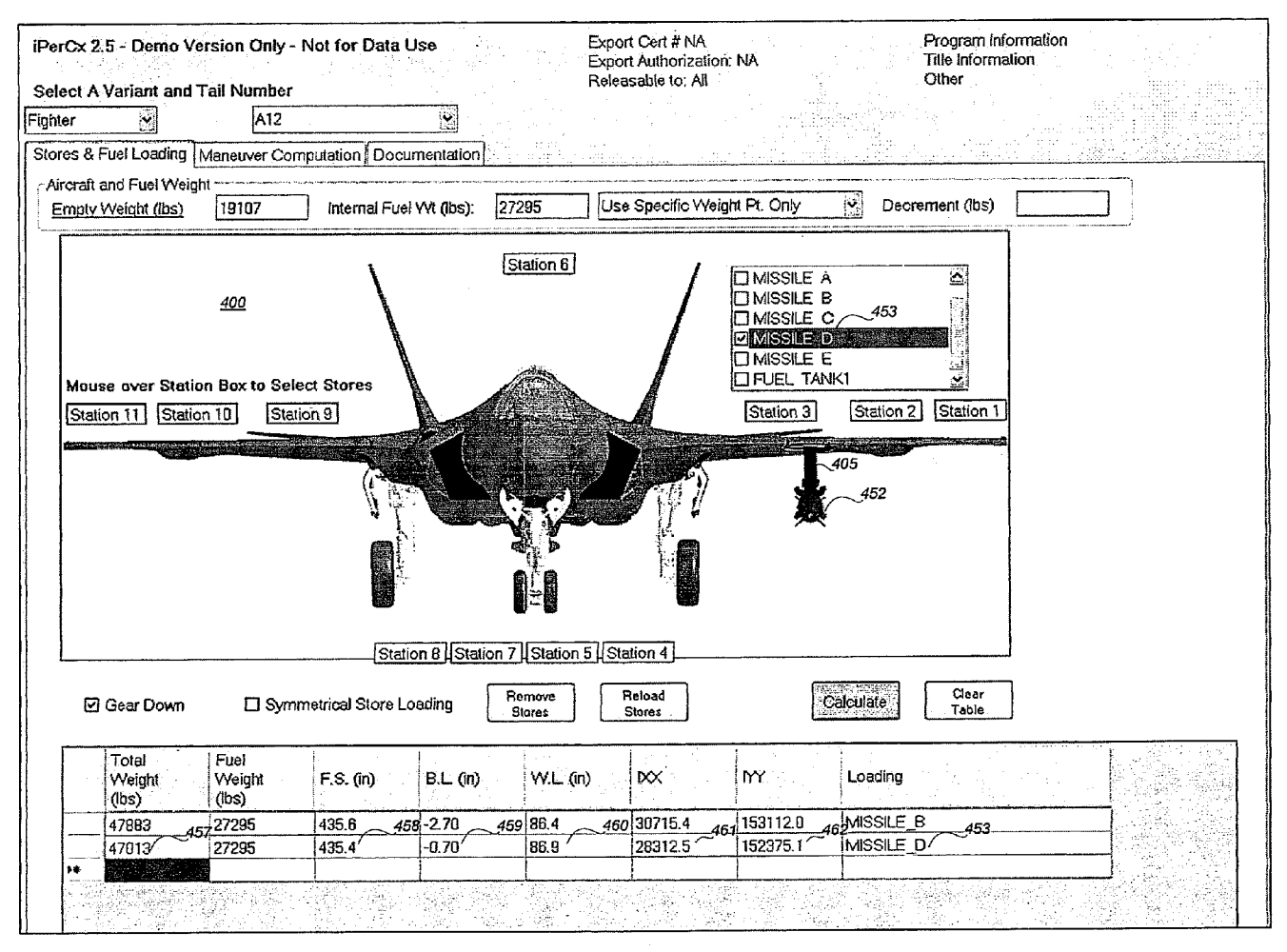
Figure 4C:
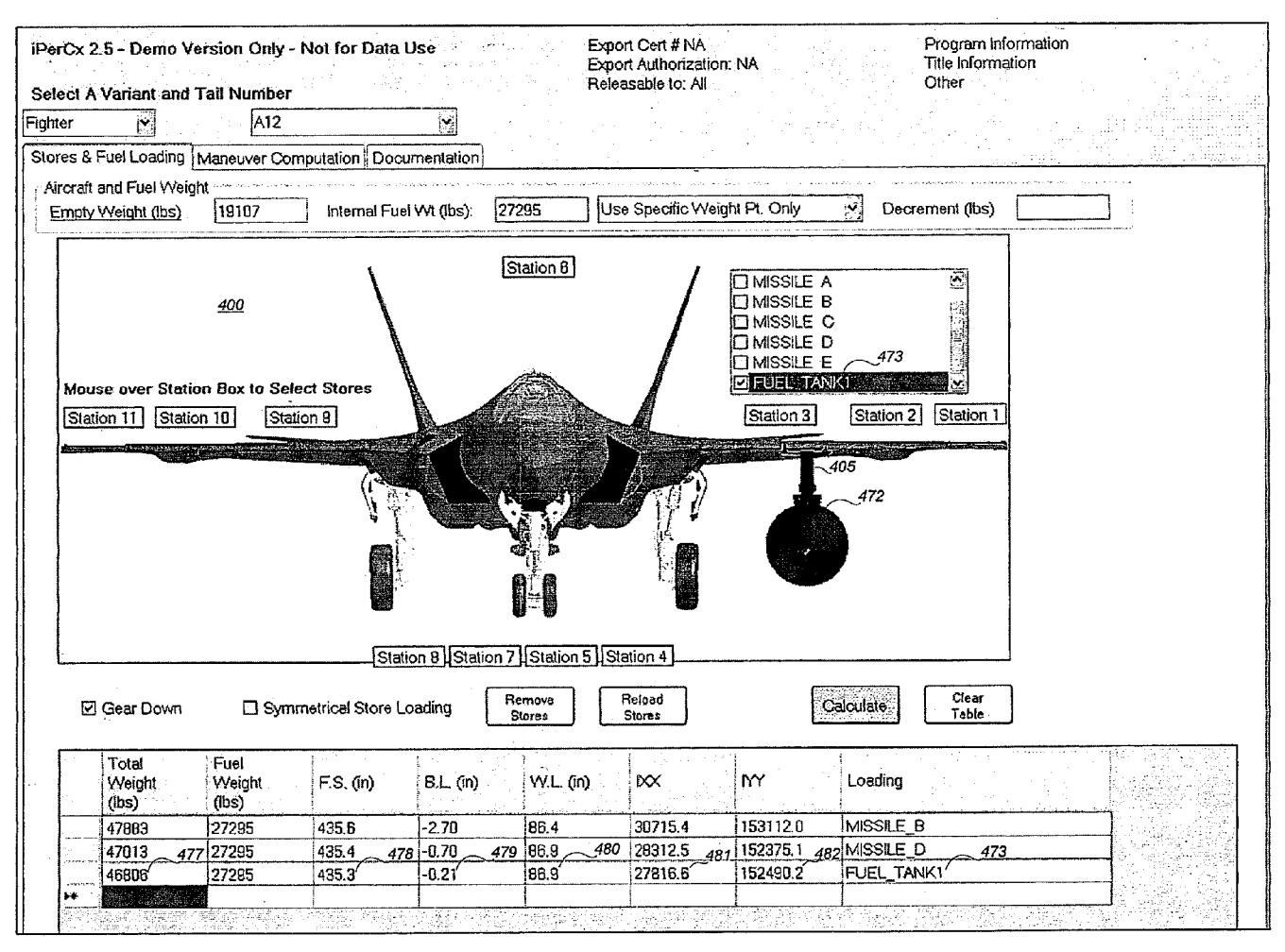
Figure 4D:
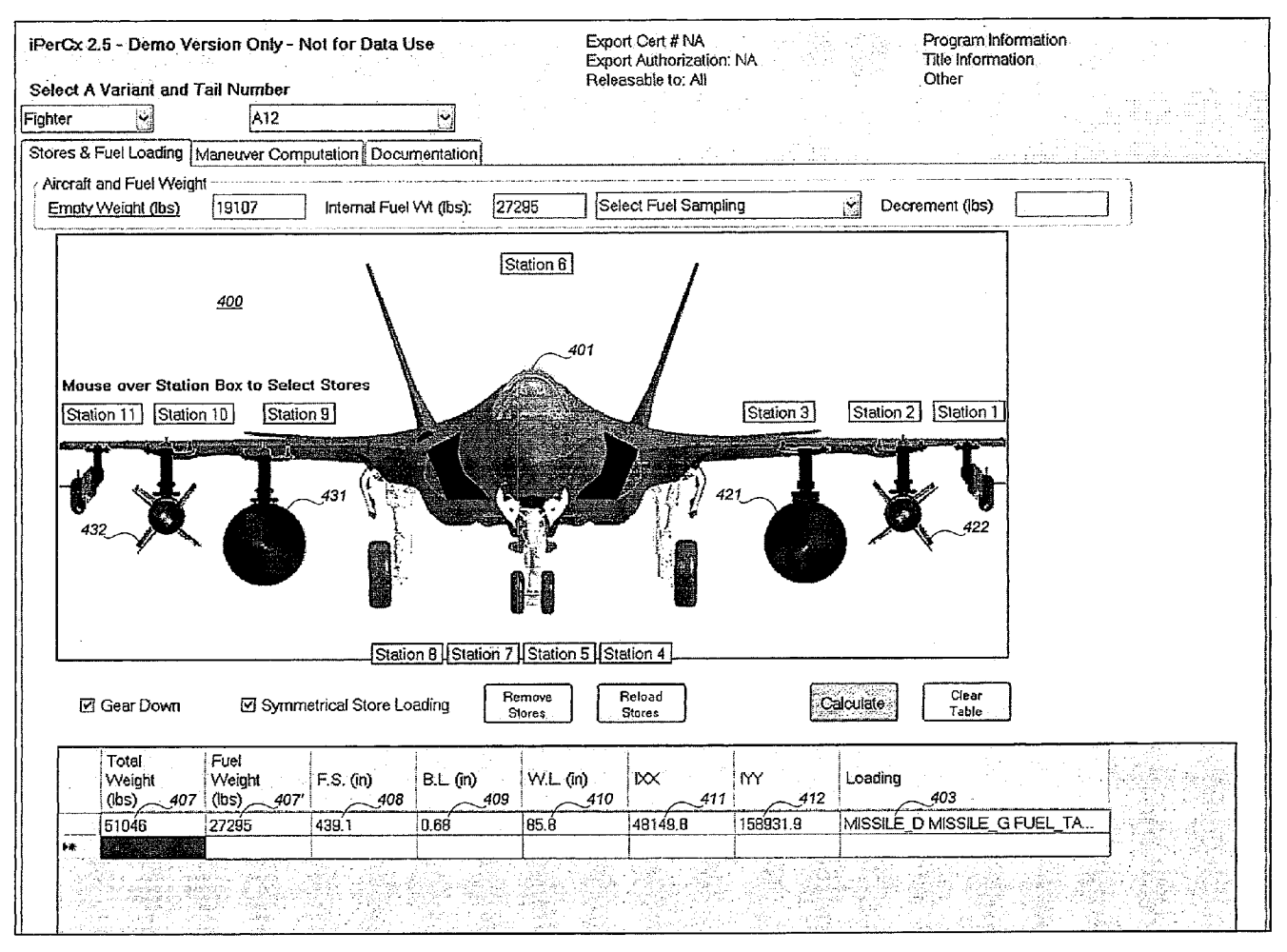
Figure 8:
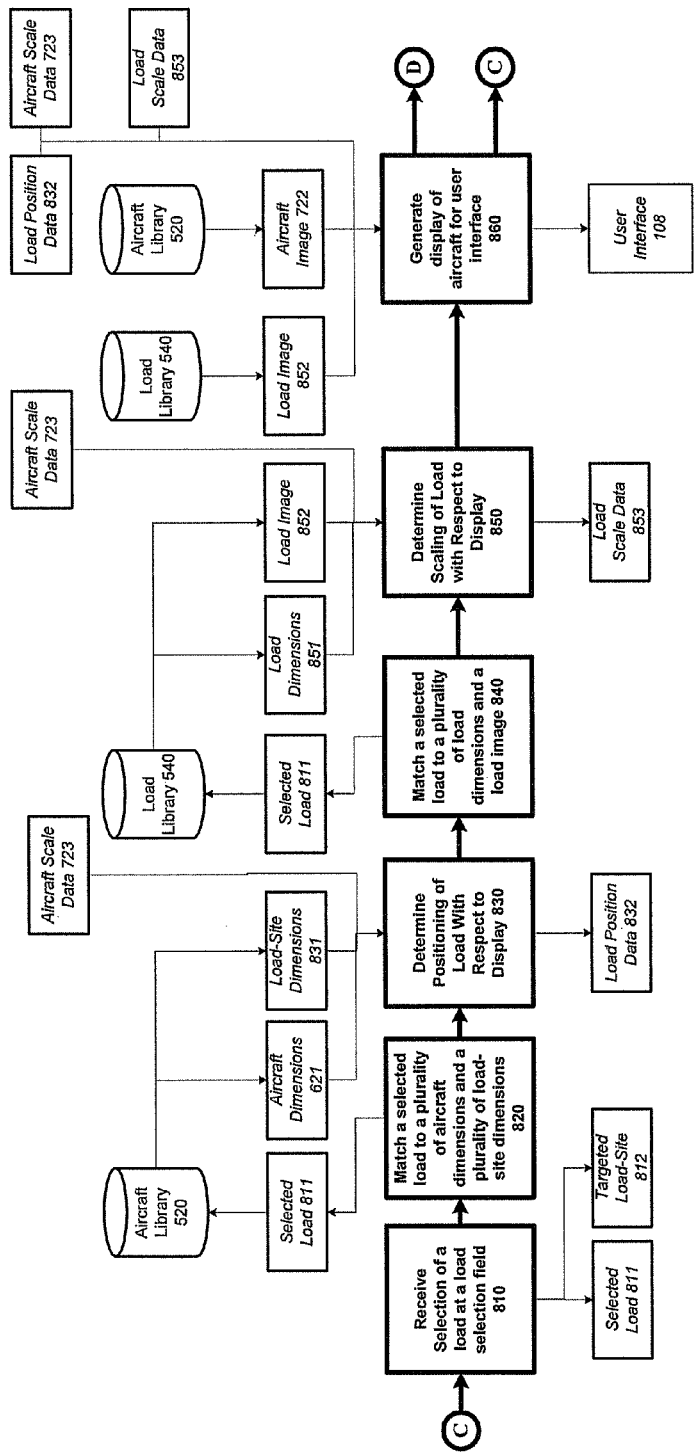
FIG. 8 is a flowchart that shows an exemplary process according to an embodiment of the present invention.

As can be shown with respect to points "B" in FIG. 8, steps 810-860 can be repeated interactively and iteratively upon receiving a new or additional selection of a load at a load selection field, as can be further shown with reference to FIG. 4B and FIG. 4C. Accordingly, the interactive display 400 allows a user to more effectively configure loads on an aircraft by interactively and immediately making the user visually aware of the impact of placing user-selected loads at corresponding load-sites, in three dimensions, with respect to multiple user-selected loads and multiple target aircraft load-sites, and the aircraft as a whole, as can be shown with reference to user-selected loads 421, 422, 431, and 432 at FIG. 4D. For example, a user may be able to visually identify clearance issues that may arise from having a load positioned at particular load-site incompatibly with respect to an adjacent load. Also, for example, a user may be able to visually identify and resolve imbalance issues that may arise from having selected an unintended load, positioning a load at an unintended load-site, or in intentionally configuring asymmetric loads on either side of the aircraft, especially where loads differ dramatically in dimension and there are multiple load-sites as can be shown with reference to FIG. 4D. For example, the interactive display 400 can include a graphical representation 401 of the user-selected aircraft 301 and can include a graphical representation 402 of a user-selected load 403 at the target aircraft load-site 405. As can further be shown with reference to FIG. 4B, a different user-selected load 453 at the target aircraft load-site 405 corresponds to a different graphical representation 452 of the different user-selected load. As can further be shown with reference to FIG. 4C, another different user-selected load 473 at the target aircraft load-site 405 corresponds to another different graphical representation 472 of the other different user-selected load 473.

Figure 9:
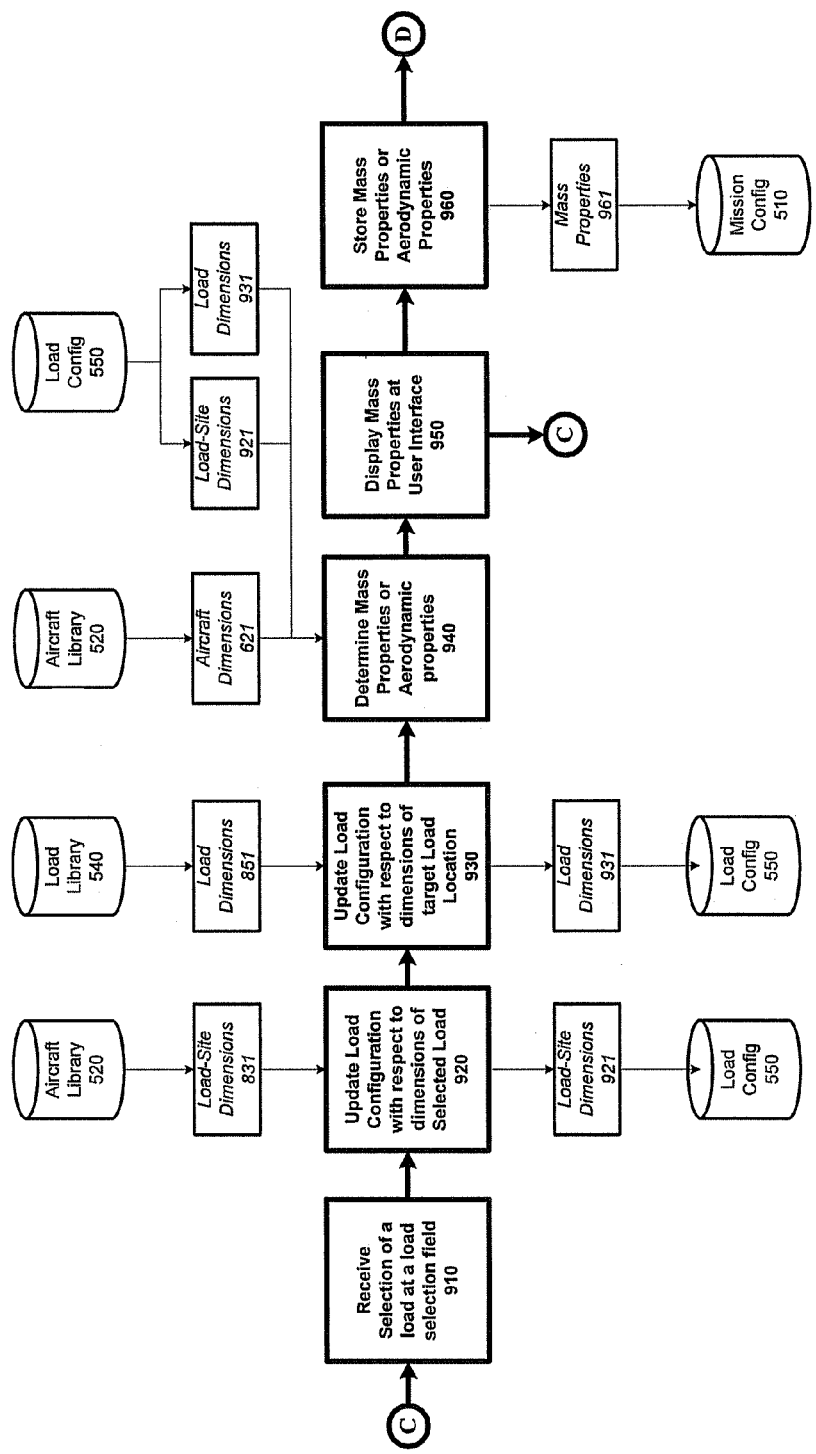
FIG. 9 is a flowchart that shows an exemplary process according to an embodiment of the present invention.

As can further be shown with reference to step 204 of FIG. 2A, the aircraft load configuration module 120 can interactively determine a plurality of mass properties of the user-selected aircraft responsive to the plurality of aircraft dimensions of the user-selected aircraft, the plurality of load dimensions of the user-selected load, and the plurality of aircraft load-site dimensions of the target aircraft load-site. The operation of an exemplary aircraft load configuration module 120 according to step 204 can be shown with reference to FIG. 9; and the interactive display 400 with respect to such operation can be shown with reference to FIG. 4A. Exemplary data structures described with respect to step 204 can be shown with reference to FIG. 5.

The interactive display 400 can include a display 400' a plurality of mass properties corresponding to the user-selected aircraft 301 and a user-selected load 403 being positioned at the target aircraft load-site 405. In particular, the plurality of mass properties can include values 407-412 which correspond to mass variables 423-429. As can further be shown with reference to FIG. 4B, a different user-selected load 453 at the target aircraft load-site 405 corresponds to a plurality of different mass properties corresponding to the user-selected aircraft 301 and the different user-selected load 403 being positioned at the target aircraft load-site 405. In particular, the different plurality of mass properties includes values 457-462. As can be shown with reference to values 458-460 and values 408-410, the centers of gravity, in three dimensions, of the selected aircraft 301 so loaded 453 in FIG.

4B differs from that of the selected aircraft 301 so loaded 403 in FIG. 4A. As can be shown with reference to values 461-462 and values 411-412, the moments of inertia, in two dimensions, of the selected aircraft 301 so loaded 452 in FIG. 4B differs from that of the selected aircraft 301 so loaded 403 in FIG. 4A.

The aircraft load configuration module 120 can determine a plurality of mass properties of the user-selected aircraft responsive to the plurality of aircraft dimensions of the user-selected aircraft, the plurality of load dimensions of the user-selected load, and the plurality of aircraft load-site dimensions of the target aircraft load-site. As can be shown with respect to points "B" in FIG. 9, steps 910-960 can be repeated interactively and iteratively upon receiving a new or additional selection of a load at a load selection field, as can be further shown with reference to FIG. 4B and FIG. 4C. The mass properties can be determined interactively using techniques that will be appreciated by those having skill in the art, for example, by using client-side application or script functionality, e.g., Java™ or JavaScript™, to determine or re-determine the mass properties upon receiving a new or updated selection at a selection field. The mass properties can also be determined interactively, for example, using server-side application functionality, e.g., PHP, or client-side application functionality, e.g., Java™ or JavaScript™, upon receiving input at, for example, a button 413 to trigger the interactive determination. Accordingly, the interactive display 400 allows a user to more effectively configure loads on an aircraft by interactively and immediately making the user aware of the qualitative impact of placing a user-selected load at a corresponding load-site, in three dimensions, with respect to the mass properties of the aircraft. For example, a user may be able to more precisely achieve a desired balance (for centers of gravity) or handling characteristics (for moments of inertia) in the design or configuration of an aircraft when the user is made aware of the incremental effect of each load, or the differential effect of a load being positioned at different stations, on the overall mass properties of the aircraft in three dimensions.

The aircraft load configuration module 120 can receive 910 a selection of a load 403 (a "selected load") at an aircraft load selection field 404, such as an HTML FORM SELECT field, that corresponds to an aircraft load-site 405 (a "target aircraft load-site"). Those having skill in the art will appreciate that the user-selected load 403 and the target aircraft load-site 405 can be received using any other means for receiving a selection, identification, or other input of a user-selected load, such as an HTML FORM TEXT field or a RADIO field, for example, though such means are not limited to the use of HTML. Responsive to receiving the user-selected load 403, the aircraft load configuration module 120 can store 811, 812 the user-selected load 403 and the target aircraft load-site 405 in memory 103, for example, to allow other modules, processes, subroutines, functions, objects, program products, and so on to reference the user-selected load 403.

As described above with respect to step 820, the aircraft load configuration module 120 can match 820 the user-selected aircraft 301 to a plurality of load-site dimensions 831 for the target aircraft load-site 405 of the user-selected aircraft 403 using the aircraft identifier 621 as a primary key 521 at the aircraft library 520 to link to an aircraft load-sites field 523 to receive a plurality of aircraft load-site dimensions 831 matching the aircraft identifier 621. And as described above with respect to step 840, the aircraft load configuration module 120 can further match 840 the user-selected load 403 to a plurality of load dimensions 851 using the user-selected load 811 as a primary key 541 at the loads library 540 to link to a load dimensions field 543 to receive a plurality of load dimensions 851 matching the user-selected load 811. Responsive to matching the user-selected load 403 to the plurality of load dimensions 851, the aircraft load configuration module 120 can update 930 the load configuration 550 with the load dimensions 931 of the user-selected load 403. And responsive to matching the target aircraft load-site 405 of the user-selected aircraft 301 to the plurality of load-site dimensions 831, the aircraft load configuration module 120 can update 920 the load configuration 550 with the load-site dimensions 921 of the target aircraft load-site 405.

Responsive to the aircraft dimensions 621, the load-site dimensions 921, and the load dimensions 931, the aircraft load configuration module 120 can determine 940 a plurality of mass properties of the user-selected aircraft 301 according to predefined functions, which may be stored as program code in non-transitory memory 103 or in database 102 or may be submitted to or referenced by any other system, program, module, plug-in, etc. that can provide functions for determining any of the plurality of mass properties. Predefined functions that implement formulas, for example, to calculate the centers of gravity of an aircraft will be known to those having skill in the art. For example, the mass properties of the user-selected aircraft 301 can include, for example, the total weight of the aircraft and the centers of gravity of the aircraft in three dimensions (FS 424, BL 425, and WL 426 axes) with respect to vertical reference datum, a horizontal reference datum, and a lateral reference datum of the user-selected aircraft. Predefined functions can, for example, determine the centers of gravity of the aircraft using the weights and arms (distance from the reference datum to any component of the aircraft or to any object or load located within the aircraft) of all mass within the aircraft as specified in the aircraft dimensions 621 and load dimensions 931, multiplying such weights by such arms, as specified in the aircraft dimensions 621, load-site dimensions 931, and load dimensions 921 for all mass to calculate moments, adding all moments of all mass together, and dividing the total moment by the total weight of the aircraft to give an overall arm. Also, predefined algorithms that implement formulas, for example, to calculate the moments of inertia of an aircraft will be known to those having skill in the art. Such algorithms or formulas, for example, may reference moments of inertia Ixx and Iyy about the FS and BL axes of the user-selected aircraft 103 as specified in the aircraft dimensions 621 and may implement the parallel axis theorem to sum the moments of inertia, as specified in the load dimensions 931 for the user-selected loads, e.g., 403, about the FS and BL axes of the user-selected aircraft 301, the user-selected loads being at position with respect to the user-selected aircraft 301 defined by the load-site dimensions 921 of the corresponding target load-sites, e.g., 405 for the user selected loads.

Steps 940-960, as will be appreciated by those having skill in the art, can also be performed with respect to other properties, such as aerodynamic properties, of the user-selected aircraft that will be impacted by the configuration of loads on or at the load-sites of a user-selected aircraft. For example, the dimensions of user-selected loads, the dimensions of the target aircraft load-sites, and the dimensions of the user-selected aircraft can jointly affect the aerodynamic properties of the user-selected aircraft. Functions including formulas to determine or estimate the aerodynamic properties of an aircraft, including computational fluid dynamics simulations and models, will be known to those having skill in the art, and can operate over related variables as set forth in the aircraft dimensions 621 for the user-selected aircraft 301, the load dimensions 931 for the user-selected load or loads, and the load-site dimensions 921 for the target aircraft load-site or load-sites 405. Upon the calculation of the aerodynamic properties of the user-selected aircraft, the computer program product can store the aerodynamic properties to a field 516 of the mission configuration 510 so that the aerodynamic properties can be used in the calculation of the flight performance properties, to the extent that the flight performance properties are determined responsive to aerodynamic variables. As was shown with respect to the mass properties in FIG. 4A, user interface 400 can also provide a display any of the aerodynamic properties responsive to determining the aerodynamic properties or storing such in the mission configuration 510.

Responsive to determining the plurality of mass properties of the user-selected aircraft 301, the aircraft load configuration module 120 can generate 950 a display 400' of the mass properties 407-412 at the interactive display 400. For example, the display of mass properties can be populated into table fields as shown in FIG. 4A corresponding to mass variables 423-429. Also responsive to determining the plurality of mass properties of the user-selected aircraft 301, the aircraft load configuration module 120 can store the mass properties 961 in the mass properties field 515 at the mission configuration 510 for the user-selected aircraft so that the mass properties can be used in the calculation of the performance properties, as is described further herein. The mass properties field 515 at the mission configuration 510 can be, for example, an array having multiple fields storing the mass properties can be indexed by corresponding mass variables.

Aircraft Mission Configuration Module

As can be shown with reference to FIG. 1, the aircraft mission configuration module 110 can be, for example, a computer program product stored in the non-transitory memory 103 and operable on the processor 101. As can be shown with reference to FIG. 2B, the aircraft mission configuration module 120 can determine a plurality of preselected maneuvers responsive to the user-selected aircraft, generate a display at the user interface of a maneuver selection field responsive to the plurality of preselected maneuvers, determine a plurality of operation variables and a plurality of performance variables responsive to a user-selected maneuver, and generate a display at the user interface of a plurality of operation property selection fields.

Figure 2B:
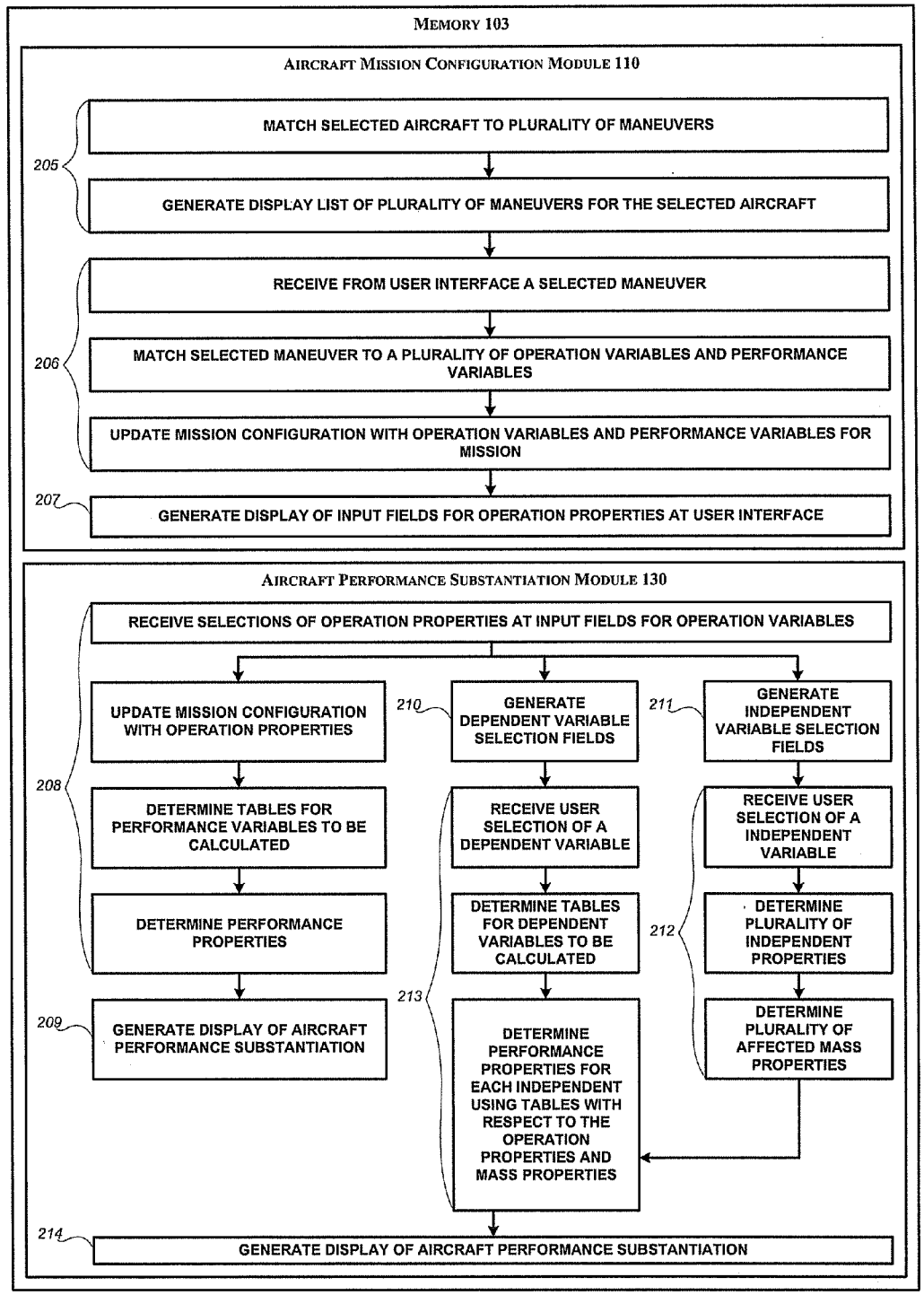
FIG. 2B is a block diagram that shows exemplary computer program products according to embodiments of the present invention.
Figure 10:
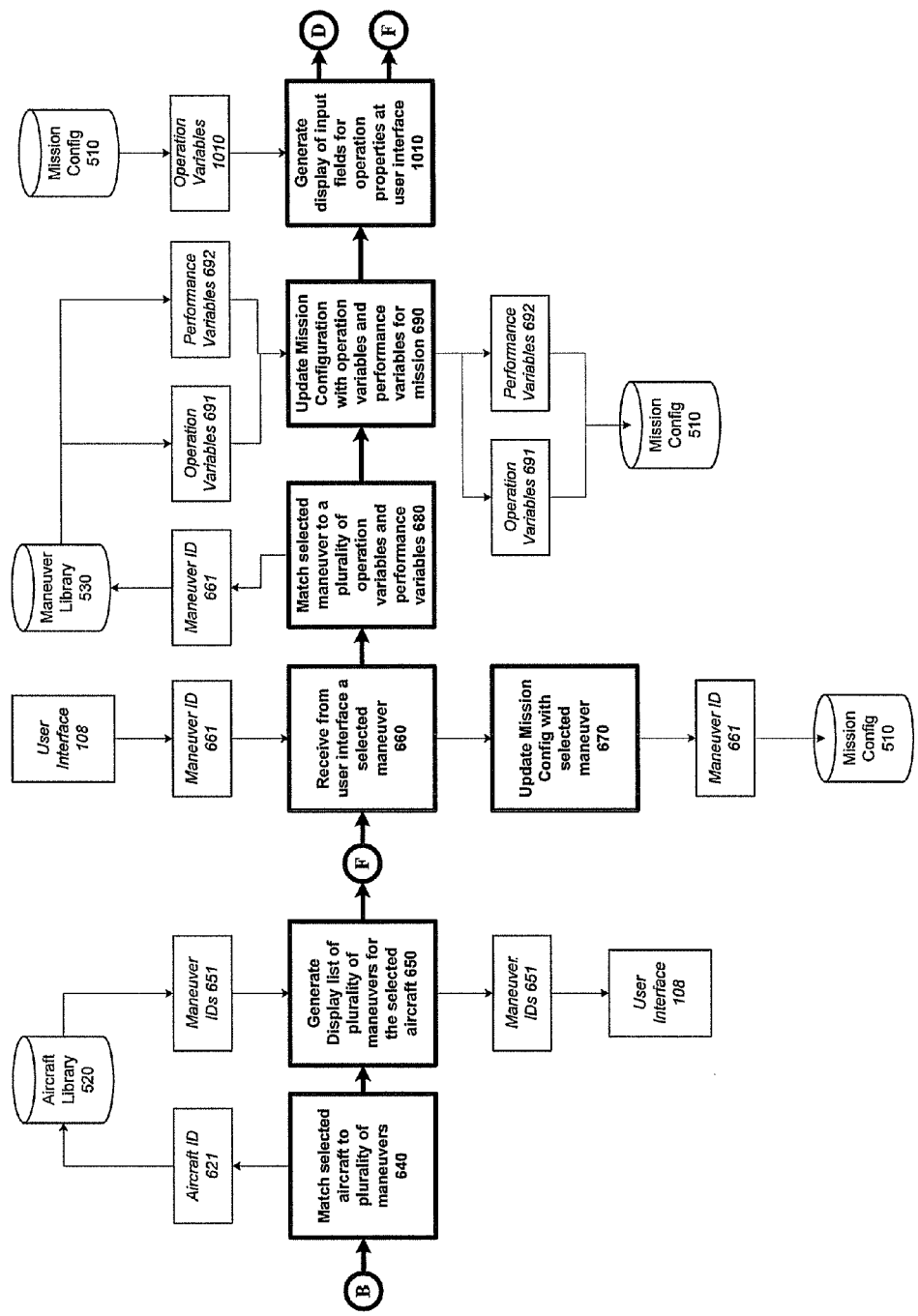

As can further be shown with reference to step 205 of FIG. 2B, the aircraft mission configuration module 120 can generate a display at the user interface of a maneuver selection field responsive to determining a plurality of preselected maneuvers responsive to the user-selected aircraft. The operation of an exemplary aircraft mission configuration module 110 according to step 205 can be shown with reference to FIG. 10; and the interactive display 300 with respect to such operation can be shown with reference to FIG. 3A. Exemplary data structures described with respect to step 205 can be shown with reference to FIG. 5.

An exemplary mission configuration 510 can include fields for a mission identifier 511, a user-selected maneuver, 518, a user-selected aircraft 512, operation properties 513, mass properties 515, aerodynamic properties 516, and performance properties 517. The mission configuration 510 can be, for example, any table, chart, matrix, array, map, plan, list, index, or other flat file or multidimensional structure, or a reference to such, capable of storing data to represent such variables and/or properties. Any of these fields, for example, the operation properties 513, mass properties 515, aerodynamic properties 516, and performance properties 517, can be multidimensional fields or arrays having name indexes so that several properties can be stored therein, each identifiable by a corresponding variable, such as a name. Mission configuration 510 may also be, for example, a data structure stored in memory 102 or any set or sets of arguments or expressions passed between computer program products, such as is known to those of skill in the art for passing arguments between server-side web applications, such as PHP applications.

The aircraft mission configuration module 110 can match 640 the user-selected aircraft 301 to a plurality of maneuvers using the aircraft identifier 621 as a primary key 521 at the aircraft library 520 to linked to a maneuvers field 522 to receive a plurality of maneuver identifiers 651 matching the aircraft identifier 621. As can be shown with reference to FIG. 3A, a maneuver selection field 304 may be generated 650 by the aircraft mission configuration module 110 for display on the user interface 300 responsive to a plurality of maneuver identifiers 651 at the aircraft library 520, and the maneuver selection field 304, may contain a list of the plurality of maneuvers in a drop down box, such as the SELECT field as shown in the maneuver selection field 304. The maneuver selection field 304 for selecting a maneuver can be automatically populated with maneuvers, for example, responsive to receiving input from the user interface, such as at an input button 314 as can be shown in FIG. 3A.

As can further be shown with reference to step 206 of FIG. 2B, the aircraft mission configuration module 120 can determine a plurality of operation variables and a plurality of performance variables responsive to a selection of a maneuver of the plurality of maneuvers from the database, the selection of the maneuver being by a user and received from the user interface through the input/output unit, the maneuver defining a user-selected maneuver. The operation of an exemplary aircraft mission configuration module 110 according to step 206 can be shown with reference to FIG. 10; and the interactive display 300 with respect to such operation can be shown with reference to FIG. 3A. Exemplary data structures described with respect to step 206 can be shown with reference to FIG. 5.

The aircraft mission configuration module 110 can receive 660 a user-selected maneuver 303 or maneuver identifier 661 for the user-selected maneuver 302, for example, using a maneuver selection field 304 such as an HTML FORM SELECT field. Those having skill in the art will appreciate that the user-selected maneuver 303 or maneuver identifier 661 for the user-selected maneuver 303 can be received using any other means for receiving a selection of a user-selected maneuver, such as an HTML FORM TEXT field or a RADIO field, for example, though the means are not limited to the use of HTML. Responsive to receiving the user-selected maneuver 303 or the maneuver identifier 661 for the user-selected maneuver 303, the aircraft mission configuration module 110 can store or update 670 the mission configuration 510 with the maneuver identifier 661 for the user-selected maneuver 303, thereby allowing other modules, processes, subroutines, functions, objects, program products, and so on to reference the user-selected maneuver 303 or the maneuver identifier 661 for the user-selected maneuver 303. The maneuver identifier 661 for the user-selected maneuver 303 can be any string of computer text or characters (e.g., alphanumeric characters) serving to identify the user-selected maneuver 303 as a primary key in the maneuver library 530 or any string of computer text or characters (e.g., alphanumeric characters serving to identify a maneuver to a user. A maneuver 531 can include, for example and without limitation, the following: takeoff, refused takeoff, acceleration, deceleration, climb, descent, cruise, 3-point landing, and 2-point landing. The selection of a maneuver allows performance properties of the user-selected aircraft to be determined with respect to the user-selected maneuver.

As can be shown with reference to the maneuvers library 530 at FIG. 5, as each maneuver 531 corresponds to a unique set of operation variables 532 and a unique set of performance variables 533. The unique set of performance properties and the unique set of performance variables for each maneuver may be stored, for example, at database 102 in the maneuvers library 530. The unique set of performance variables may be stored, for example, at the field performance variables 533; and likewise, the unique set of operation variables may be stored, for example, at the field operation variables 532. The fields 532 and 533 can be, for example, any table, chart, matrix, array, map, plan, list, index, or other multidimensional structure, or a reference to such, capable of storing and structuring data to represent the variables. For example, each maneuver at the maneuver library 530 can correspond to a maneuver identifier 531, which can be matched in the maneuvers library 530 to an array having a plurality of operation variables defined therein, or to an array having a plurality of performance variables defined therein. As used herein, the term "variables" refers to the name, type, class, or other identifier of a property, such as "Altitude," whereas the term "property" refers to the value, metric, or measurement corresponding to the variable, such as "3500".

Each maneuver corresponds to a unique set of performance variables 533 that are relevant to that maneuver; for example, "rotation speed" is a performance variable relevant to the maneuver "takeoff." Each maneuver also corresponds to a unique set of operation variables 532 that are relevant to the determination of any performance property for any of the unique set of performance variables; for example, "weight" is an operation variable relevant to the determination of the performance property for "rotation speed." Accordingly, the selection of a maneuver allows a programmatic determination of which performance properties must be determined, and which operation properties will be used in the determination of those performance properties, for the user-selected maneuver.

A unique set of operation variables for takeoff, for example, can include without limitation: Delta_Temp_degF, Altitude_ft, Weight_lbs, and FS_CG_in. A unique set of operation variables for landing, for example, can include without limitation: runway altitude, temperature, and flight control settings. A unique set of operation variables for a gradient maneuver, such as acceleration, deceleration, climb, and decent, for example, may include without limitation: a starting point, an ending point, and an increment, and so on. For example, for acceleration, the unique set of operation variables can include a starting speed, an ending speed, and an increment.

A unique set of performance variables for takeoff, for example, can include without limitation: Distance_to_50 ft, Ground_Roll_ft, Rotation_Speed_KCAS, Takeoff_Speed_KCAS, Speed_at_500_ft_KCAS, Speed_at_1000_ft_KCAS, Speed_at_2000_ft_KCAS. A unique set of performance variables to be calculated for landing, for example, may include without limitation: ground roll distance, approach speed, touchdown speed, brake energy, brake application speed, touchdown speed, and nose gear touchdown speed. A unique set of performance variables to be calculated for acceleration, for example, may include without limitation: delta time to perform the maneuver, delta fuel used, and the ground range travelled. Other performance variables to be determined may include, for example, calibrated airspeed, pitch angle, flight path angle, fuel flow, and rate of climb. Other maneuvers and corresponding operation variables and performance variables will be understood by those of skill in the art.

By way of example, the following summary is provided for takeoff performance data for the conventional takeoff and landing System Design and Demonstration (SDD) flight test aircraft with the FFR standard of the F135 engine. Takeoffs were analyzed between sea level and 6,000 feet to allow computations for operations at each of the flight test bases and to allow for diverts and other unexpected operations. A wide range of temperatures were utilized to accommodate all season operations at each field elevation, the takeoff analysis was performed at between −40 deg Fahrenheit and +60 deg Fahrenheit from standard day temperatures. The takeoff analysis evaluated variations of mass properties (weight, fuselage station of the center of gravity, waterline of the center of gravity, roll inertia Ixx, pitch inertia Iyy) to cover the range of internal loadings expected for flight test. By way of further example, with respect to the takeoff maneuver, rotation speeds (speed at which rotation is initiated with aft stick, not nose wheel liftoff speed) for the takeoff analysis were determined by finding the minimum speed at which the aircraft could rotate, maintain a smooth target pitch rate characteristic. It is possible to rotate the aircraft at a speed below those identified in this analysis. However the pitch rate characteristic is not necessarily smooth and may incorporate undesirable characteristics. The described rotation technique ensures that the main gear liftoff speed will be equal to or greater than the 1.05×Vmin speed. The target pitch rate characteristic is followed to capture a flyaway pitch attitude. Takeoff performance data are illustrated in the following tables 1 and 2, and can provide the level and available range of the data set. Level 1 independent variables, for example, may not be interpolated.

| Level | Description/Units | Range |
| --- | --- | --- |
| 1 | Engine Thrust Request (ETR) | Mil, Max A/B |
| 2 | Temperature Delta from Standard Day (deg F.) | −40 to +60 |
| 2 | Runway Altitude (ft) | 0 to 6,000 |
| 2 | Gross Weight (lb) | 20,000 to 50,000 |
| 2 | Fuselage Station Center of Gravity (in) | 444.5 to 475 |

| Name | Description/Units |
| --- | --- |
| Distance_to_50 ft | Takeoff Distance to Clear 50 ft Obstacle (ft) |
| Ground Roll ft | Takeoff Distance to Main Gear Liftoff (ft) |
| Rotation Speed _KCAS | Rotation Command Calibrated Airspeed (kts) |
| Takeoff Speed _KCAS | Main Gear Liftoff Calibrated Airspeed (kts) |
| Speed_at_500_ft_KCAS | Acceleration Check Calibrated Airspeed at 500 Feet (kts) |
| Speed_at_1000_ft_KCAS | Acceleration Check Calibrated Airspeed at 1000 Feet (kts) |
| Speed_at_2000_ft_KCAS | Acceleration Check Calibrated Airspeed at 2000 Feet (kts) |

The aircraft mission configuration module 110 can match 680 the user-selected maneuver 303 to a plurality of operation variables 691 and a plurality of performance variables 692 using the maneuver identifier 661 as a primary key 531 at the maneuver library 530 to link to an operation variables field 532 and the performance variables field 533 to receive a plurality of operation variables 691 and a plurality of performance variables 692 matching the maneuver identifier 661. Similarly, the aircraft identifier 621 for the user-selected aircraft 301 can be used as the primary key or as a secondary key to match to the plurality of operation variables 691 and the plurality of performance variables 692. Responsive to matching the user-selected maneuver 303 or the maneuver identifier 661 to the plurality of operation variables 691 and the plurality of performance variables 692, the aircraft mission configuration module 110 can store or update 690 the operation properties field 513 and the performance properties field 517 at the mission configuration 510 with the plurality of operation variables 691 and the plurality of performance variables 692, thereby allowing other modules, processes, subroutines, functions, objects, program products, and so on to reference the plurality of operation variables 691 and the plurality of performance variables 692 for the user-selected maneuver 303. The fields 513 and 517 can be, for example, any table, chart, matrix, array, map, plan, list, index, or other multidimensional structure, or a reference to such, capable of storing and structuring data to represent the variables and a corresponding property for such variables that can be determined or received as described further herein.

As can further be shown with reference to step 207 of FIG. 2B, the aircraft mission configuration module 120 can generate a display at the user interface of a plurality of operation property selection fields, each of the plurality of operation property selection fields being responsive to one of the plurality of operation variables and being positioned to receive a user selection of an operation property corresponding to the one of the plurality of operation variables. The operation of an exemplary aircraft mission configuration module 110 according to step 207 can be shown with reference to FIG. 10; and the interactive display 300 with respect to such operation can be shown with reference to FIG. 3A. Exemplary data structures described with respect to step 207 can be shown with reference to FIG. 5.

The aircraft mission configuration module 110 can generate 1010 a display of a plurality of operation property selection fields 305 for the plurality of operation variables 306 at the user interface 300. An operation property selection field, e.g., 307, may be generated 1010 responsive to an operation variable 308 of the plurality of operation variables 691 at the mission configuration 510. The operation property selection fields 305 may be configured to accept user text input, such as an HTML FORM TEXT box as shown by operation property selection field 307, which allows a user to input an operation property, e.g., 309. Similarly, for one or more mass variables, e.g., 318 that correspond to mass properties determined as described with respect to step 940, the aircraft mission configuration module 110 can generate 1010 a display of a mass property selection field 317 having the determined mass property pre-populated 819, as will be appreciated by those having skill in the art, using server-side application functionality such as PHP or client-side functionality such as JavaScript to populate the relevant value 319 for the property 961 from the mission configuration 510. Alternatively, a maneuver selection field may be an HTML FORM SELECT box as shown by operation property selection field 327, which allows a user to select a pre-populated operation property, e.g., 329 for a corresponding operation variable 328.

Aircraft Performance Substantiation Module

As can be shown with reference to FIG. 1, the aircraft performance substantiation module 130 can be, for example, a computer program product stored in the non-transitory memory 103 and operable on the processor 101. As can be shown with reference to FIG. 2B, the aircraft performance substantiation module 130 can generate a display at the user interface of a plurality of dependent-variable selection fields, generate a display at the user interface of a plurality of independent-variable selection fields, determine a plurality of independent properties responsive to one of a plurality of user-selected operation properties and the plurality of mass properties and responsive to a user selection of an independent variable at one of the plurality of independent-variable selection fields; determine a plurality of dependent properties for each of the plurality of independent properties responsive to the respective independent property and corresponding to a user-selected dependent variable, and generate a display of an aircraft performance substantiation at the user interface responsive to determining the plurality of dependent properties of the user-selected aircraft.

As can further be shown with reference to step 208 of FIG. 2B, the aircraft performance substantiation module 130 can determine a plurality of performance properties of the user-selected aircraft for each of the plurality of performance variables, the determining operation being responsive to a plurality of user-selected operation properties and the plurality of mass-properties, each of the plurality of user-selected operation properties being received from the user interface through the input/output unit responsive to a user selection of an operation property at one of the plurality of operation property selection fields. The operation of an exemplary aircraft performance substantiation module 130 according to step 208 can be shown with reference to FIG. 11; and the interactive display 300 with respect to such operation can be shown with reference to FIG. 3A and FIG. 3B. Exemplary data structures described with respect to step 208 can be shown with reference to FIG. 5.

The aircraft performance substantiation module 130 can receive 1110 a selection of an operation property 1111 from the user interface 108 through the input/output unit responsive to a user selection of an operation property 1111 at one of the plurality of operation property selection fields 305. Responsive to receiving 1110 the selection of an operation property 1111, the aircraft performance substantiation module 130 can update 1120 the operation properties at the operation properties field 513 in the mission configuration 510. As described herein with respect to the plurality of operation property selection fields 305, each operation property selection field, e.g., 307 corresponds to an operation variable, e.g., 308, and an operation property, e.g., 309, which is received and stored at the operation properties field 513, for example, keyed to the operation variable, e.g., 308. Storing the operation property 1111 in the mission configuration 510 at the operation properties field 513 can allow other modules, processes, subroutines, functions, objects, program products, and so on to reference the operation property 1111; and the operation properties field 513 can include, for example, a multidimensional table or array to relate each of a plurality of unique operation variables to a corresponding operation property.

The aircraft performance substantiation module 130 can also receive a selection of a mass property from the user interface 108 through the input/output unit responsive to a user selection of an operation property at one of the plurality of mass property selection fields 315. Responsive to receiving the selection of a mass property, the aircraft performance substantiation module 130 can update the mass properties at the mass properties field 515 in the mission configuration 510. As described herein with respect to the plurality of mass property selection fields 315, each mass property selection field, e.g., 317 corresponds to a mass variable, e.g., 318, and a mass property, e.g., 319, which is received and stored at the mass properties field 515, for example, keyed to the mass variable, e.g., 318. Although the mass properties field 515 may already contain a mass property for a particular mass variable such as a mass property, e.g., 318, determined by the aircraft load configuration module 120, the pass property received, e.g., 319, can provide an update for the existing mass property, for example, to allow fine adjustment. Storing the mass property in the mission configuration 510 at the mass properties field 515 can allow other modules, processes, subroutines, functions, objects, program products, and so on to reference the mass property; and the mass properties field 515 can include, for example, a multidimensional table or array to relate each of a plurality of unique mass variables to a mass operation property.

The aircraft performance substantiation module 130 can determine a plurality of performance properties relevant to the user-selected maneuver responsive to the plurality of user-selected operation properties and responsive to the plurality of mass-properties. The aircraft performance substantiation module 130 can determine a single performance property for each of the plurality of performance variables, which may be referred to herein as a single point determination. For example, the results of a single point determination can be shown with reference to FIG. 3A. For each of the plurality of performance variables 351, a single performance property for each performance variable has been determined and displayed 352. A single point determination results from the fact that a constant value for each of the operation variables and each of the mass variables will resolve to a single value for each performance variable.

Figure 11:
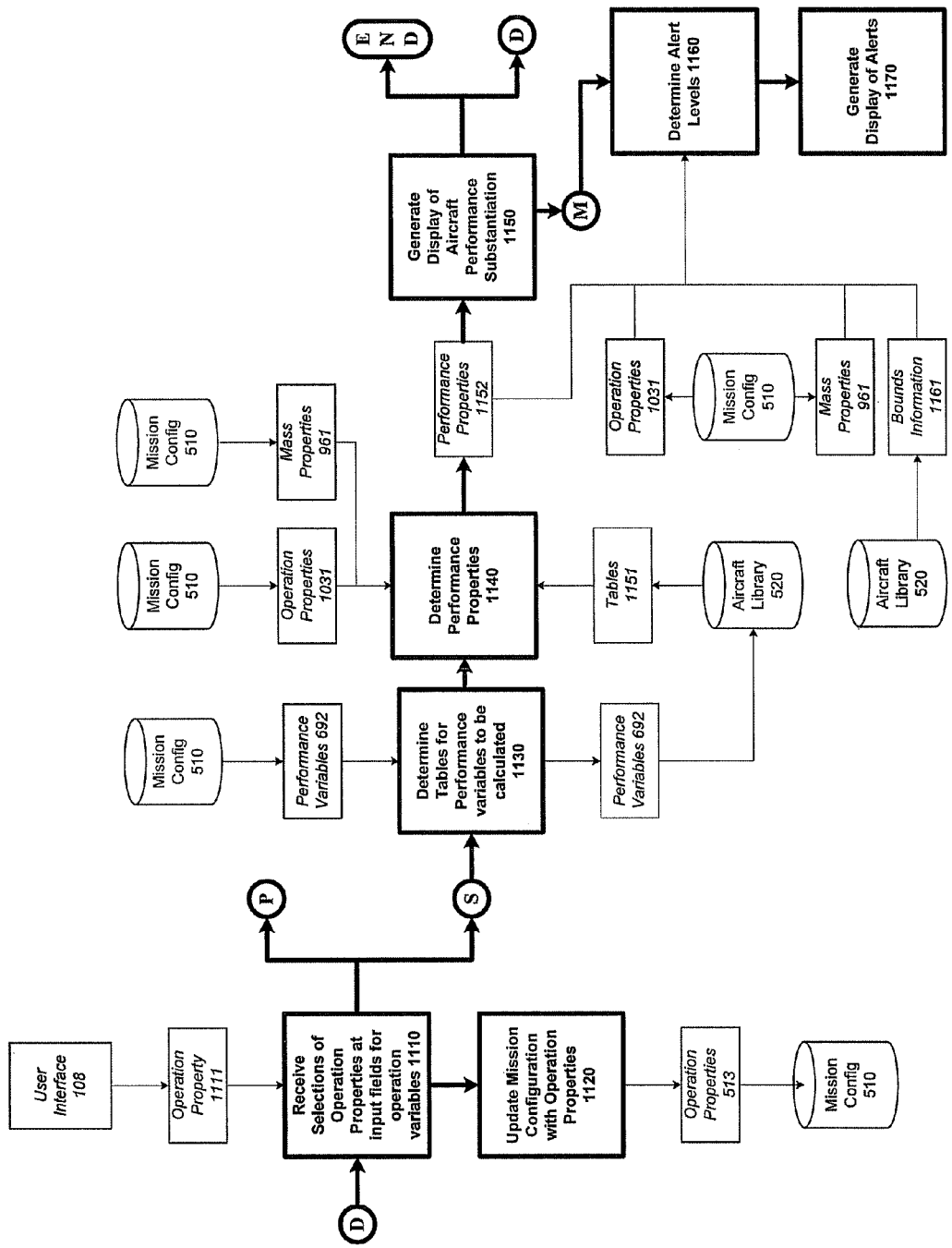
FIG. 11 is a flowchart that shows an exemplary process according to an embodiment of the present invention.

The aircraft performance substantiation module 130 can perform a single point determination as is shown beginning at point (S) of FIG. 11. With respect to a single point determination at point (S) of FIG. 11, the aircraft performance substantiation module 130 will determine a performance property for each of the plurality of performance variables corresponding to the user-selected maneuver. In order to make the determination, the aircraft performance substantiation module 130 may reference a performance table for each of the performance variables.

The aircraft performance substantiation module 130 can determine 1130 a plurality of aircraft performance tables 1151, and each aircraft performance table can correspond to a performance variable of the plurality of performance variables 692. The aircraft performance tables 1151, or a reference thereto, may be stored in database 102 at performance tables field 526 of the aircraft library 520 and may be indexed, for example, by the corresponding performance variable at the performance tables field 526. Each performance table contains tabular data indicating the relationship between a performance variable and any of a plurality of operating variables and a plurality of mass variables relevant to that performance variable.

The tabular data, for example, for a particular performance variable can include multiple predefined operation property values or predefined mass values in a predefined range and at a predefined increment, and each predefined operation property value or predefined mass value can correspond to a predefined performance property value for that performance variable. By way of example only, the tabular data for the performance variable "Ground_Roll_ft" can include mass variable "Weight_Lbs" expressed as predefined mass values between 45000 and 55000 at predefined increment of 1000 (i.e., 45000, 46000, 47000, 48000, 49000, . . . 55000), and each predefined mass property value can correspond to a predefined performance property value (e.g., predefined mass value 49000 can correspond to predefined performance value 2700 and predefined mass value 50000 can correspond to predefined performance value 3043). Because each performance variable may be dependant on more than one operation variable or mass variable, there may be multiple tables wherein certain operation variables or mass variables are held constant and there may be complex tables wherein multiple operation variables or mass variables are varied.

The aircraft performance substantiation module 130 can determine 1140 a plurality of performance properties 1152 corresponding to the operation properties 1031 and the mass properties 961 using the aircraft performance tables 1151. The aircraft performance substantiation module 130, for example, can reference the aircraft performance tables 1151 using any of the operation properties 1031 and the mass properties 961 to return a corresponding performance property for each of the plurality of performance variables 692. Because the plurality of performance tables 1151 includes operation property values and mass property values expressed at standard increments, determining performance properties for user-selected operation properties or the mass properties, which may not be identical to the predefined values, may require interpolation and extrapolation. The aircraft performance tables 1041 and interpolation and extrapolation functions may be structured or performed according to techniques that will be understood to those having skill in the art, for example, those described in "Method and system for automatic information exchange," U.S. Pat. No. 6,684,220, which is incorporated by reference fully herein.

Additionally, the aircraft performance substantiation module 130 can determine 1140 a plurality of performance properties 1152 corresponding to the operation properties 1031 and the mass properties 961 using predefined functions. Predefined functions for determining aircraft performance properties as will be understood by those of skill in the art may be stored with database 102 indexed according to a performance variable and accessed by the aircraft performance substantiation module. Furthermore, such predefined functions may be stored remotely and in communication with the I/O Unit 104, for example, and called by the aircraft performance substantiation module 130 as an application, program, module, plug-in, etc. to be executed by a remote system with respect to the plurality of performance variables 692, the plurality of operation properties 1031, and the plurality of mass properties 961; and the remote system can return the calculated performance properties 1152 to the aircraft performance substantiation module 130 through the I/O Unit 104.

As can further be shown with reference to step 209 of FIG. 2B, the aircraft performance substantiation module 130 can generate a display of an aircraft performance substantiation at the user interface responsive to determining the plurality of performance properties of the user-selected aircraft. The operation of an exemplary aircraft performance substantiation module 130 according to step 209 can be shown with reference to FIG. 11; and the interactive display 300 with respect to such operation can be shown with reference to FIG. 3B. Exemplary data structures described with respect to step 209 can be shown with reference to FIG. 5.

Figure 3A:
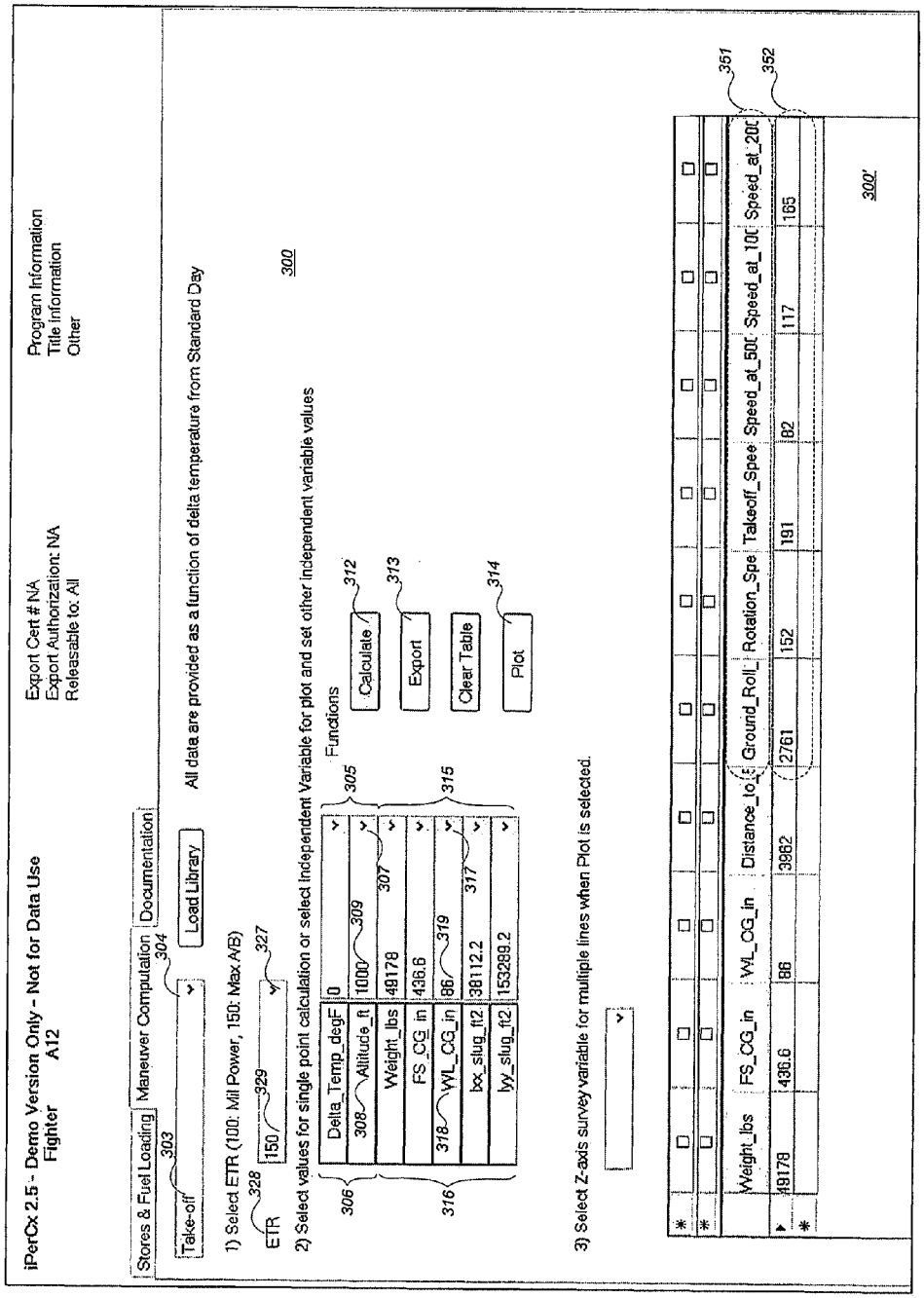
FIG. 3A is an exemplary interactive display at a user interface according to an embodiment of the present invention.

As can be shown with reference to FIG. 3A, the aircraft performance substantiation module 130 can generate 1150 a display of the plurality of performance properties 1152 determined in a single-point determination, as can be shown by the table 300' at the user interface 300. For example, the performance properties 352 for performance variables 351 can be displayed using an HTML page TABLE format. The performance properties 352 for performance variables can 351 also be displayed, for example, responsive to receiving input at a web form button 313, by exporting the performance properties 352 for the performance variables 351 to any file format that will be known to those in the art for viewing such data in table form, such as an electronic spreadsheet file according to the Microsoft® Excel® format by the Microsoft Corporation of Redmond, Wash. Exported performance properties to a spreadsheet can be shown with reference to FIG. 13A and FIG. 13B, for example.

As can further be shown with reference to step 210 of FIG. 2B, the aircraft performance substantiation module 130 can generate a display at the user interface of a plurality of dependent-variable selection fields, each of the plurality of dependent-variable selection fields corresponding to one of the plurality of performance variables to receive a user selection of a dependent variable. The operation of an exemplary aircraft perforance substantiation module 130 according to step 210 can be shown with reference to FIG. 11 and FIG. 12; and the interactive display 300 with respect to such operation can be shown with reference to FIG. 3B. Exemplary data structures described with respect to step 210 can be shown with reference to FIG. 5.

The aircraft performance substantiation module 130 can also determine multiple performance properties for each of the plurality of performance variables, which may be referred to herein as a plot determination. A plot determination results from the fact that variable values for any of the operation variables or any of the mass variables will resolve to a variable value for each performance variable. As is described elsewhere herein, the aircraft performance substantiation module 130 can determine a plurality of variable values, referred to as a plurality of independent properties, for any of the operation variables or any of the mass variables, referred to as an independent variable. For example, a plurality of independent properties can be shown with reference to FIG. 3B. For one of the plurality of operation variables or mass properties 1209, multiple independent properties 1203 can been determined and displayed. Also as is described elsewhere herein, the aircraft performance substantiation module 130 can determine a plurality of variable values, referred to as a plurality of dependent properties, for any of the performance variables, referred to as a dependent variable. For example, a plurality of dependent properties can be shown with reference to FIG. 3B. For one of the plurality of performance variables 1208, multiple performance properties 1205 for that perfoimance variable 1208 can be determined and displayed. At FIG. 11, the aircraft performance substantiation module 130 can perform a plot determination as is shown beginning at point (P). With respect to a plot determination beginning at point (P) of FIG. 12, the aircraft performance substantiation module 130 generates selection fields for the selection of dependent and independent variables.

The aircraft performance substantiation module 130 can generate 1210 a dependent-variable selection field to be displayed at the user interface 108 so that a user at the user interface 108 can select a dependent variable. The dependent-variable selection field can include a plurality of selections, each of which can correspond to one of the plurality of performance variables 692 from the mission configuration 510 that had previously been matched 680 to the user selected maneuver 661 by the aircraft mission configuration module 110. The dependent-variable selection field can be, for example, a FORM element or series of FORM elements 1204 in an HTML page as can be shown with reference to FIG. 3B. For example, the dependent-variable selection field 1204 contains a plurality of selections, e.g., 1294, which can correspond to the plurality of performance variables, e.g., 1208. Those having skill in the art will appreciate other ways of implementing a dependent-variable selection field, which may include, for example, drop down selection boxes, check-boxes, radio-select boxes, text input boxes, buttons, images, hotlinks, and so on. The aircraft performance substantiation module 130 can generate the dependent-variable selection field, for example, according to various programming or scripting languages as will be understood by those having skill in the art, for example, including server-side application functionality, e.g., PHP, or client-side application functionality, e.g., Java™ or JavaScript™.

As can further be shown with reference to step 211 of FIG. 2B, the aircraft performance substantiation module 130 can generate a display at the user interface of a plurality of independent-variable selection fields each of the plurality of independent-variable selection fields corresponding to the one of the plurality of operation variables and one of the plurality of mass variables to receive a user selection of an independent variable. The operation of an exemplary aircraft performance substantiation module 130 according to step 211 can be shown with reference to FIG. 11 and FIG. 12; and the interactive display 300 with respect to such operation can be shown with reference to FIG. 3B. Exemplary data structures described with respect to step 211 can be shown with reference to FIG. 5.

The aircraft performance substantiation module 130 can generate 1240 an independent-variable selection field to be displayed at the user interface 108 so that a user at the user interface 108 can select an independent variable. The independent-variable selection field can include a plurality of selections, each of which can correspond to one of the plurality of mass variables 961 from the load configuration 550 or one of the plurality of operation variables 691 from the mission configuration 510 that had previously been matched 680 to the user selected maneuver 661 by the aircraft mission configuration module 110. The independent-variable selection field can be, for example, a FORM element or series of FORM elements 1202 in an HTML page as can be shown with reference to FIG. 3B. For example, the independent-variable selection field 1202 contains a plurality of selections, e.g., 1292, which can correspond to the plurality of performance variables, e.g., 1209. Those having skill in the art will appreciate other ways of implementing a independent-variable selection field, which may include, for example, drop down selection boxes, checkboxes, radio-select boxes, text input boxes, buttons, images, hotlinks, and so on. The aircraft performance substantiation module 130 can generate the independent-variable selection field, for example, according to various programming or scripting languages as will be understood by those having skill in the art, for example, including server-side application functionality, e.g., PHP, or client-side application functionality, e.g., Java™ or JavaScript™.

The aircraft performance substantiation module 130 can generate 1245 a secondary independent-variable selection field to be displayed at the user interface 108 so that a user at the user interface 108 can select a secondary independent variable. The secondary independent-variable selection field can include a plurality of selections, each of which can correspond to one of the plurality of mass variables 961 from the load configuration 550 or one of the plurality of operation variables 691 from the mission configuration 510 that had previously been matched 680 to the user selected maneuver 661 by the aircraft mission configuration module 110. The secondary independent-variable selection field can be, for example, a FORM element 1201 or series of FORM elements in an HTML page as can be shown with reference to FIG. 3B. For example, the secondary independent-variable selection field 1201 contains a plurality of selections, e.g., 1291, which can correspond to the plurality of performance variables, e.g.,

1291. Those having skill in the art will appreciate other ways of implementing a secondary independent-variable selection field, which may include, for example, drop down selection boxes, checkboxes, radio-select boxes, text input boxes, buttons, images, hotlinks, and so on. The aircraft performance substantiation module 130 can generate the secondary independent-variable selection field, for example, according to various programming or scripting languages as will be understood by those having skill in the art, for example, including server-side application functionality, e.g., PHP, or client-side application functionality, e.g., Java™ or JavaScript™.

As can further be shown with reference to step 212 of FIG. 2B, the aircraft performance substantiation module 130 can determine a plurality of independent properties responsive to a predefined range, a predefined increment and one of a plurality of user-selected operation properties and the plurality of mass properties, each of the plurality of independent properties corresponding to a user-selected independent variable received from the user interface through the input/output unit responsive to a user selection of an independent variable at one of the plurality of independent-variable selection fields, each of the plurality of user-selected operation properties being received from the user interface through the input/output unit responsive to a user selection of an operation property at one of the plurality of operation property selection fields. The operation of an exemplary aircraft performance substantiation module 130 according to step 212 can be shown with reference to FIG. 11 and FIG. 12; and the interactive display 300 with respect to such operation can be shown with reference to FIG. 3B. Exemplary data structures described with respect to step 212 can be shown with reference to FIG. 5.

The aircraft performance substantiation module 130 can receive 1220 a selection of a dependent variable responsive to a user selection of a dependent variable at a dependent-variable selection field. Those having skill in the art will appreciate various techniques for passing the selection of a dependent variable, for example, selected using a FORM element in an HTML page, to the aircraft performance substantiation module, for example, using arguments in an HTTP request for a PHP server-side application. The selection of a dependent variable 1221 corresponds to a performance variable, as described herein with respect to the generation 1210 of the dependent-variable selection field. As can be shown with respect to FIG. 3B, for example, the user selection 1294 of "Distance to 50 ft" (performance variable) 1208 as the dependent variable is received by the aircraft performance substantiation module 130 responsive to the user clicking on button 313 to submit the selection 1294 to the aircraft performance substantiation module 130. Alternatively, as will be appreciated by those having skill in the art, client-side functionality, such as e.g., Java™ or JavaScript™, can allow the aircraft performance substantiation module 130 to receive the user selection of the dependent variable 1208 immediately upon detecting the event of the user's making the selection 1294, e.g., at a checkbox.

The aircraft performance substantiation module 130 can receive 1250 a user-selected independent variable responsive to a user selection of an independent variable at an independent-variable selection field. Those having skill in the art will appreciate various techniques for passing the selection of an independent variable, for example, selected using a FORM element in an HTML page, to the aircraft performance substantiation module, for example, using arguments in an HTTP request for a PHP server-side application. The selection of an independent variable 1251 corresponds to a mass variable or an operation variable, as described herein with respect to the generation 1240 of the independent-variable selection field. As can be shown with respect to FIG. 3B, for example, the user selection 1294 of "Fuel Wt (lbs)" (mass variable) 1209 as the independent variable is received by the aircraft performance substantiation module 130 responsive to the user clicking on button 313 to submit the selection 1292 to the aircraft performance substantiation module 130. Alternatively, as will be appreciated by those having skill in the art, client-side functionality, such as e.g., Java™ or JavaScript™, can allow the aircraft performance substantiation module 130 to receive the user selection of the independent variable 1209 immediately responsive to the event of the user making the selection 1292, e.g., at a checkbox.

The aircraft performance substantiation module 130 can determine 1260 a plurality of independent properties 1263 corresponding to the user-selected independent variable 1251 for the purpose of making a plot determination with respect to the user-selected dependent variable 1221 for the plurality of independent properties 1263. The plurality of independent properties 1263 can include, for example, a range of independent properties including a mass property or a user-selected operation property, from the mission configuration 510, that corresponds to the independent variable 1251. As can be shown with reference to FIG. 3B, a plurality of independent properties 1203 is shown to include a range of independent properties for the independent variable "Fuel. Wt. (lbs)," and the plurality of independent properties 1203 includes the mass property 1210, which corresponds to a mass property 414 in FIG. 4A. The plurality of independent properties 1263 can also include other independent properties determined responsive to a predefined range 1261 and a predefined increment value 1262, which can be stored in, or provided to, the aircraft performance substantiation module 130 as will be appreciated by those having skill in the art, such as being stored in database 102. The predefined range 1261 and the predefined increment value 1262, for example, may be received by the aircraft performance substantiation module 130 from the user interface 108 responsive to receiving a user selection of a predefined range 1261 and a predefined increment value 1262. As can be shown with reference to FIG. 3B, the plurality of independent properties 1263 can be within a range, e.g., from the initial mass property 1210 to zero (0), and each of the plurality of independent properties 1263 may be determined by to be a standard increment apart from a preceding independent property. The standard increment can be predefined or user-defined as a value or as a formula, for example, as a 10% decrement. The plurality of independent properties 1263 can be stored in, or provided to, the aircraft performance substantiation module 130 as will be appreciated by those having skill in the art, such as being stored as an array or table in database 102.

The aircraft performance substantiation module 130 can determine 1299 a plurality of affected mass properties responsive to determining an independent property. When the independent property, for example, is for a mass variable, e.g., "Fuel Wt. (lbs)" 1209, the affected mass properties can be determined responsive to the independent property in the same way as described with respect to step 940. The determined affected mass property, for example, can be seen with reference to properties for the mass variable "FS_CG_in" 1207. Accordingly, each of the plurality of affected mass properties can be determined responsive to a corresponding independent property of the plurality of independent properties, e.g., 1203, the plurality of aircraft dimensions of the preselected aircraft, the plurality of load dimensions of the preselected load configuration, and the plurality of aircraft load-site dimensions of the preselected load configuration as described with respect to step 940. When the independent property, for example, is for an operation variable, e.g., "Cruise Distance" (not shown), the affected mass properties can be determined responsive to the independent property according to predefined correlation tables, i.e., for fuel burn rate, to determine an affected mass property of "Fuel Wt. (lbs)," for example. Furthermore, predefined fuel burn maps, for example, may be used to correlate fuel weight to load-site dimensions and load dimensions to reflect the position of fuel with respect to the aircraft as fuel is burned, for example, from multiple fuel tanks positioned at multiple locations on or in the aircraft. Predefined fuel burn maps may be used to provide updated load-site dimensions and load dimensions in parallel with the variable independent property, e.g., "Fuel Wt. (lbs)" for the purpose of determining the affected mass property, e.g., FS_CG_in. The predefined fuel burn maps and predefined correlation tables, or a reference thereto, may be stored in database 102 at in a field (not pictured) of aircraft library 520, including the aircraft dimensions field 524 and may be indexed, for example, by the corresponding independent variable 1251 or by the mass variable for the affected mass property.

The aircraft performance substantiation module 130 can further receive 1255 a selection of a secondary independent variable responsive to a user selection of a secondary independent variable at a secondary independent-variable selection field. Those having skill in the art will appreciate various techniques for passing the selection of a secondary independent variable, for example, selected using a FORM element in an HTML page, to the aircraft performance substantiation module, for example, using arguments in an HTTP request for a PHP server-side application. The selection of a secondary independent variable 1256 corresponds to a mass variable or an operation variable, as described herein with respect to the generation 1245 of the secondary independent-variable selection field. As can be shown with respect to FIG. 3B, for example, the user selection 1201 of "Delta_Temp_degF" (operation variable) 1291 as the secondary independent variable is received by the aircraft performance substantiation module 130 responsive to the user clicking on button 313 to submit the selection 1201 to the aircraft performance substantiation module 130. Alternatively, as will be appreciated by those having skill in the art, client-side functionality, such as e.g., Java™ or JavaScript™, can allow the aircraft performance substantiation module 130 to receive the user selection of the secondary independent variable 1291 immediately responsive to the event of the user making the selection 1201, e.g., at a drop down selection box.

The aircraft performance substantiation module 130 can further determine 1265 a plurality of secondary independent properties 1268 corresponding to the user-selected secondary independent variable 1256 for the purpose of making a plot determination with respect to the user-selected dependent variable 1221 for the plurality of secondary independent properties 1268. The plurality of secondary independent properties 1268 can include, for example, a range of secondary independent properties including a mass property or a user-selected operation property, from the mission configuration 510, that corresponds to the secondary independent variable 1256. The plurality of secondary independent properties 1268 can also include other secondary independent properties determined responsive to a predefined range 1266 and a predefined increment value 1267, which can be stored in, or provided to, the aircraft performance substantiation module 130 as will be appreciated by those having skill in the art, such as being stored in database 102. The predefined range 1266 and the predefined increment value 1267, for example, may be received by the aircraft performance substantiation module 130 from the user interface 108 responsive to receiving a user selection of a predefined range 1266 and a predefined increment value 1267. The plurality of secondary independent properties 1268 can be stored in, or provided to, the aircraft performance substantiation module 130 as will be appreciated by those having skill in the art, such as being stored as an array or table in database 102. The aircraft performance substantiation module 130 can also determine (not pictured) a second plurality of affected mass properties responsive to determining a secondary independent property, as was described with respect to step 1299.

As can further be shown with reference to step 213 of FIG. 2B, the aircraft performance substantiation module 130 can determine a plurality of dependent properties of the user-selected aircraft for each of the plurality of independent properties, the determining operation being responsive to the respective independent property of the plurality of independent properties and at least one other of the plurality of user-selected operation properties and the plurality of mass-properties, each of the plurality of dependent properties corresponding to a user-selected dependent variable received from the user interface through the input/output unit responsive to a user selection of a dependent variable at one of the plurality of dependent-variable selection fields. The operation of an exemplary aircraft performance substantiation module 130 according to step 213 can be shown with reference to FIG. 11 and FIG. 12; and the interactive display 300 with respect to such operation can be shown with reference to FIG. 3C. Exemplary data structures described with respect to step 213 can be shown with reference to FIG. 5.

The aircraft performance substantiation module 130 can determine 1230 an aircraft performance table 1231 corresponding to the dependent variable 1221. The aircraft performance table 1231, or a reference thereto, may be stored in database 102 at performance tables field 526 of the aircraft library 520 and may be indexed, for example, by the corresponding dependent variable 1221 at the performance tables field 526. The performance table 1231 contains tabular data indicating the relationship between a performance variable, i.e., the dependent variable, and any of a plurality of operating variables and a plurality of mass variables relevant to that performance variable. The aircraft performance tables 1231 can be structured as is described further herein with reference to the plurality of aircraft performance tables 1151.

The aircraft performance substantiation module 130 can determine 1280 a dependent property (a performance property) for each of the plurality of independent properties 1263, defining a plurality of dependant properties 1283 for the plurality of independent properties 1263. The aircraft performance substantiation module 130 can determine 1280 the plurality of dependent properties 1282 in the same manner as described for determining the plurality of performance properties with respect to step 1140. In determining a dependent property for each independent property of the plurality of independent properties 1263, each of the operation properties 1031 and the mass properties 961 that are not for the independent variable 1251 can be used in the determination. Also, the plurality of affected mass properties determined in step 1299 may be used in determination in conjunction with each of the corresponding independent property of the plurality of independent properties 1262. As can be shown with reference to FIG. 3C, the dependent property 1211 can be determined responsive to an independent property 1210 and each of the plurality of operation properties and the plurality of mass properties 1212, which have not been varied as described with respect to step 1260, e.g., 1206. If a plurality of secondary independent properties 1268 have been determined, the aircraft performance substantiation module 130 can determine 1280 a dependent for each of the plurality of independent properties 1263 and the plurality of secondary independent properties 1268, defining a plurality of dependant properties 1283 for the plurality of independent properties 1263 and plurality of secondary independent properties 1263. In determining a dependent property for each independent property of the plurality of independent properties 1263 and each secondary independent property of the plurality of secondary independent properties 1268, each of the operation properties 1031 and the mass properties 961 that are not for the independent variable 1251 or secondary independent variable 1256 can be used in the determination.

As can further be shown with reference to step 214 of FIG. 2B, the aircraft performance substantiation module 130 can generate a display of an aircraft performance substantiation at the user interface responsive to determining the plurality of dependent properties of the user-selected aircraft, the display including a plot of each of the plurality of dependent properties for each respective independent property of the plurality of independent properties, the plot having the user-selected dependent variable as its Y-axis and the user-selected independent variable as its X-axis. The operation of an exemplary aircraft performance substantiation module 130 according to step 214 can be shown with reference to FIG. 11; and the interactive display 300 with respect to such operation can be shown with reference to FIG. 3B and FIG. 3C. Exemplary data structures described with respect to step 214 can be shown with reference to FIG. 5.

Figure 3B:
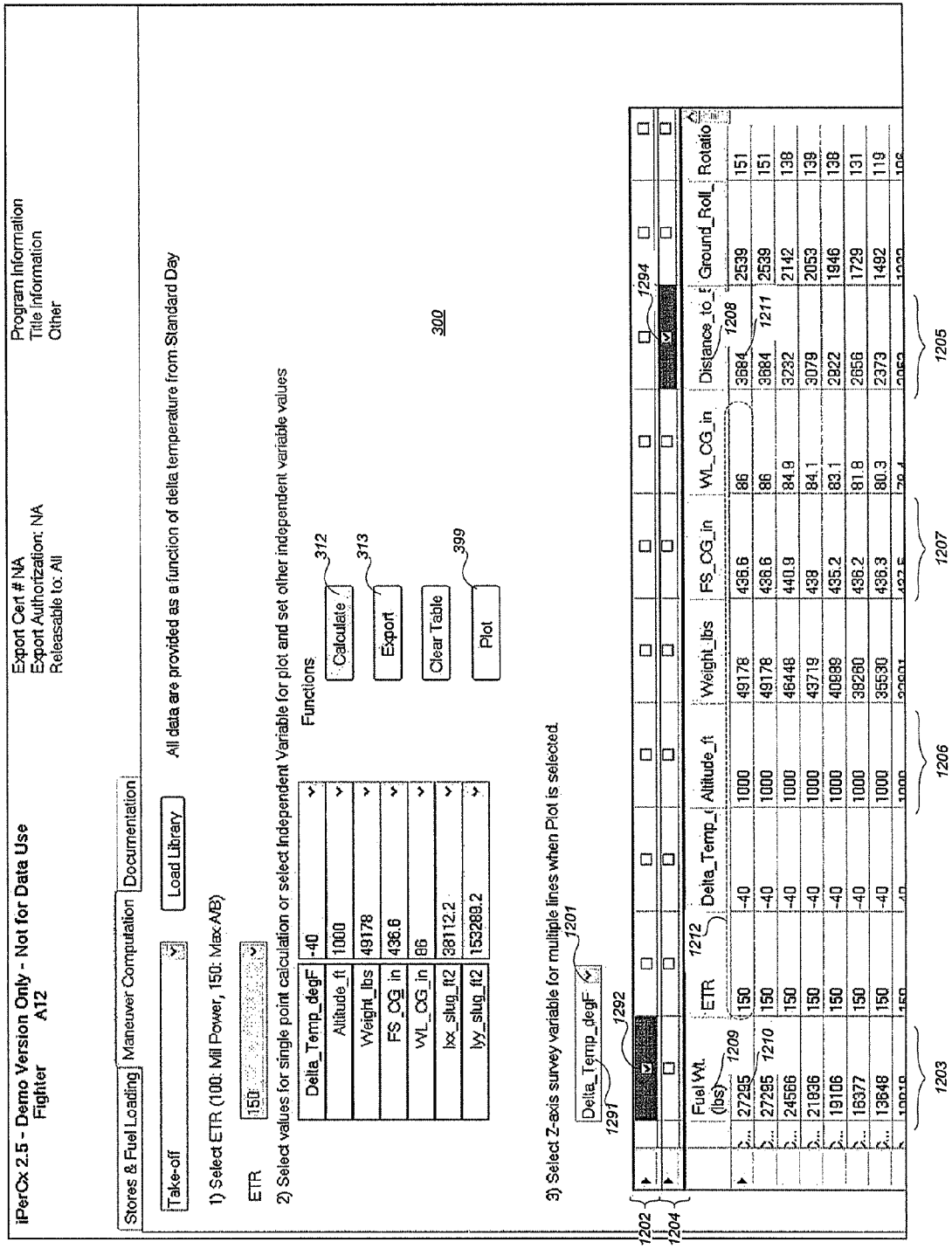
FIG. 3B is an exemplary interactive display at a user interface according to an embodiment of the present invention.

As can be shown with reference to FIG. 3B, the aircraft performance substantiation module 130 can generate 1290 a display of the plurality of dependent properties 1282 determined in a plot determination as can be shown by the table 1301 at the user interface 300. For example, the dependent properties 1205 for dependent variable 1208 can be displayed using an HTML page TABLE format. The dependent properties 205 for dependent variable 1208 can also be displayed, for example, responsive to receiving input at web form button 313, by exporting the performance properties 352 for the performance variables 351 to any file format that will be known to those in the art for viewing such data in table form, such as an electronic spreadsheet file as is described further herein.

Figure 3C:
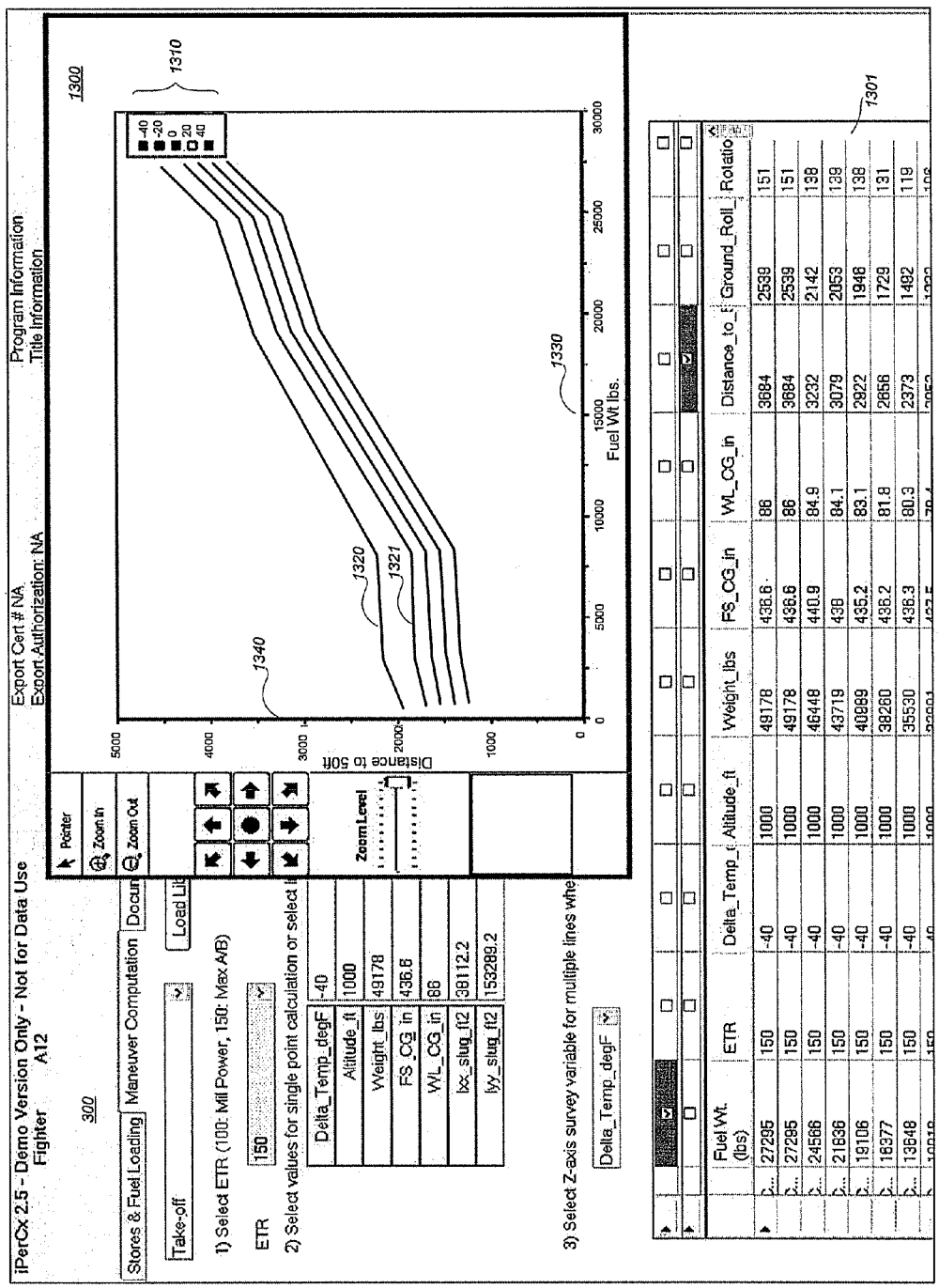
FIG. 3C is an exemplary interactive display at a user interface according to an embodiment of the present invention.

As can be shown with reference to FIG. 3C, the aircraft performance substantiation module 130 can also generate 1290 a display of the plurality of dependent properties 1282 determined in a plot determination as can be shown by the plot 1300 at the user interface 300. For example, each of the dependent properties 1205 for the dependent variable 1208 can be plotted for the corresponding independent properties 1263 in a graphical plot format having the user-selected dependent variable as the Y-Axis 1340 and the user-selected independent variable as the X-Axis 1330. Also, the display can include a plot line 1320 connecting each of the plot points for a dependent property and a corresponding independent property to graphically present the relation between the independent property and the dependent property to the user. If a plurality of secondary independent properties 1268 has been determined, the aircraft performance substantiation module 130 can also plot each of the dependent properties 1205 for the dependent variable 1208 for the corresponding independent properties 1263 and the corresponding secondary independent properties 1268. Also, the display can include a separate plot line, e.g., 1321, for each secondary independent property that connects each of the plot points for a dependent property and a corresponding independent property and a corresponding secondary independent property to graphically represent the relation between the independent variable 1221, the dependent variable 1251, and the secondary independent variable 1256 to the user. The display can include a key, e.g., 1310, to identify the relevance of the separate plot lines, e.g., 1321, to the secondary independent variable 1256. The plot 1300 at the user interface 300 can displayed, for example, responsive to receiving input at a web form button 399. As will be appreciated by those having skill in the art, the plot can be displayed using any available technique, such as using XML transformed into an SVG-XML file using XSLT or by creating an SVG-XML file server-side that is delivered to a web browser. For example, server-side programs such as PopCharts® by Corda Technologies, Inc., will take as input XML data for the graphs and a declarative specification of the type of graph and its parameters, e.g., the plurality of dependent properties, the plurality of independent properties, and the plurality of secondary independent properties.

Accordingly, a plot 1300 of performance properties, or dependent properties, having the dependent variable along the Y-axis and the independent variable along the X-axis allows a user, such as a pilot, for example, to thereby visualize a relationship between the performance variable and the independent variable throughout a preselected range. The preselected range, for example, can be selected to encompass expected operating constraints of the aircraft. By visualizing a relationship between the performance variable and the independent variable, a pilot, for example, can better understand the degrees of freedom in operating the aircraft. Because the relationship between the performance variable and the independent variable, notably, will be unique for each set of underlying aircraft properties (those operation properties and mass properties of the aircraft that are not variable in the plot), the pilot, for example, can plot a new unique relationship simply by changing one of the underlying aircraft properties. Also, the pilot, for example, can make use of the secondary independent variable to the same effect. A plot having a secondary independent variable, which includes a display of several plot lines, allows the pilot, for example, to better understand how the unique relationship between the independent and dependent variables will change as the secondary variable varies within a second range. Accordingly, a plot having a secondary independent variable allows the pilot to visualize the "delta" in the degrees of freedom in operating the aircraft with respect to the secondary independent variable.

For example, a pilot viewing a plot of "landing speed" varied dependant on "fuel weight" can view a plot showing the relationship between such variables within an acceptable range of "fuel weight." During preflight planning, the pilot may use such a plot to discover, for example, that the relationship is positive and increasing according to "fuel weight", which may allow the pilot, for example, to determine an amount of fuel to burn off or dump before landing to thereby achieve a desired landing speed. The pilot may also discover, for example, that the relationship changes according to "runway altitude", for example, which may allow the pilot, for example, to select an airport for landing that allows a desired landing speed and fuel weight. While in flight, however, the pilot may discover that the preflight plot is inconsistent with the actual circumstances of the mission. For example, the earlier plot may have included the assumption that 2 AIM-120 AMRAAM air-to-air missiles were loaded at respective loadsites (weapons stations) on the wings of the aircraft. The circumstances of the mission, however, may have required the pilot to fire both such missiles in a hostile encounter. In this instance, the pilot can easily obtain a new plot by removing the assumption regarding the loading of the 2 AIM-120 missiles, which will produce a new unique relationship between "landing speed" and "fuel weight." Similarly, a new plot can be obtained if other underlying variables, such as temperature, have changed during flight. The new plot can allow the pilot, for example, to determine a new amount of fuel to burn off or dump before landing to achieve the desired landing speed.

Figure 3D:
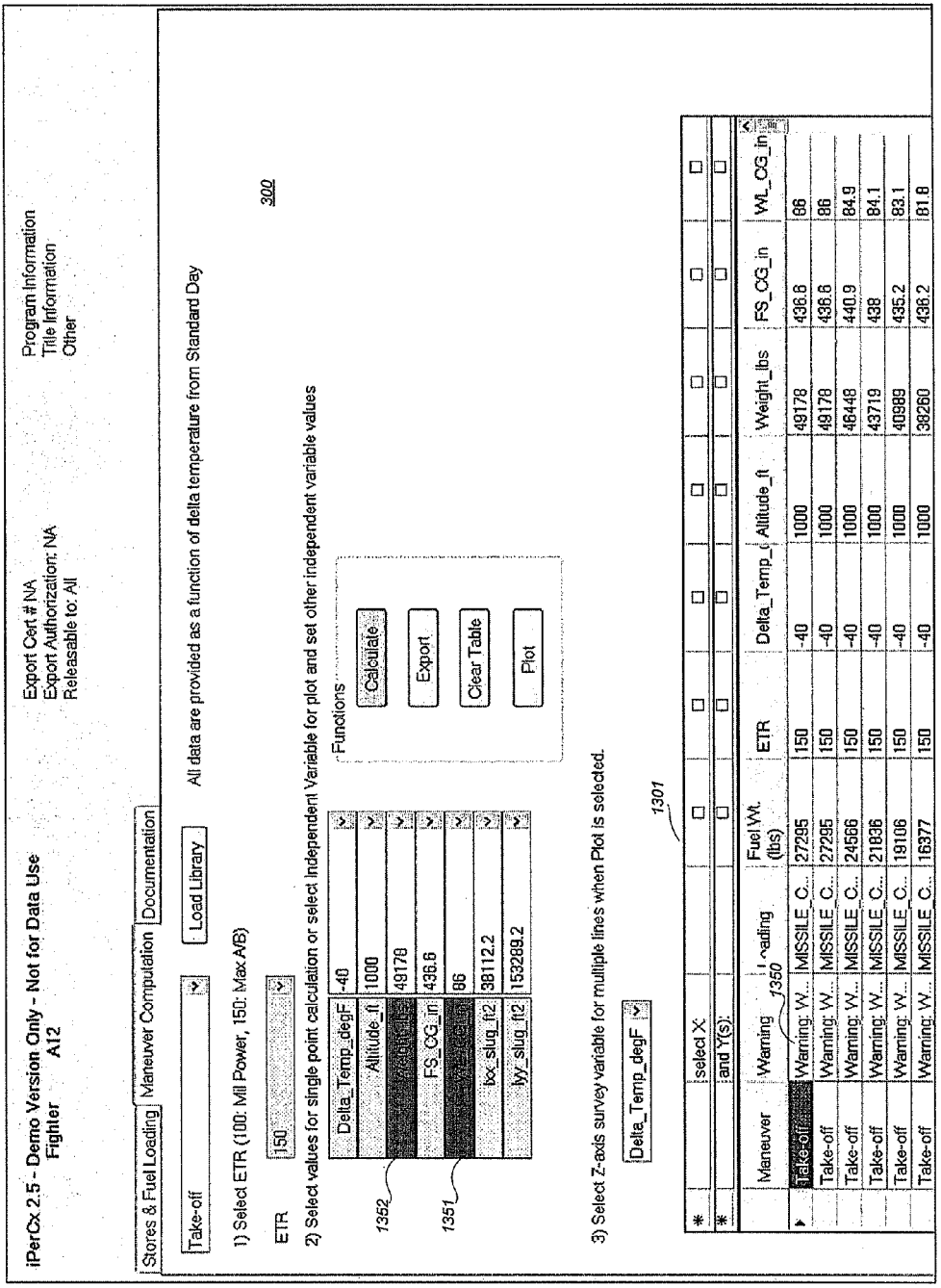
FIG. 3D is an exemplary interactive display at a user interface according to an embodiment of the present invention.

As can further be shown with reference to FIG. 3D, the aircraft performance substantiation module 130 can display an alert 358 at the user interface 300 responsive to determining a configuration alert level for one of the plurality of mass properties, the plurality of aerodynamic properties, and the plurality of operation properties. As can be shown with reference to FIG. 11 and FIG. 12 at points "M", the configuration alert level, for example, can be determined 1160 responsive to one of a plurality of aircraft configuration bounds 1161 (e.g., weight limits, dimensional limits, altitude limits, structural limits, and so on) in an aircraft configuration bounds table for the user selected aircraft 301. The aircraft configuration bounds table, or a reference thereto, may be stored in database 102 at in a field (not pictured) of aircraft library 520, including the aircraft dimensions field 524 and may be indexed, for example, by one of the corresponding mass variables, aerodynamic variables, and operation variables. The aircraft configuration bounds, for example, can represent the inherent limitations or constraints of the aircraft, such as a stall speed or a maximum cruise speed. Responsive to determining an alert level, the aircraft performance substantiation module 130 can generate 1170 a display of a configuration alert responsive to the configuration alert level at the user interface. For example, the configuration alert can include a warning message 1350 included in the table 1301 corresponding to each set of properties displayed. The configuration alert can also include a warning indication such as the bolding or highlighting of a variable corresponding to the property triggering the alert as is shown by highlighted mass property fields 1351-1352. The display of configuration alert can be generated interactively using techniques that will be appreciated by those having skill in the art, for example, by using server-side application functionality, e.g., PHP, or client-side application or script functionality, e.g., Java™ or JavaScript™.

Figure 12:
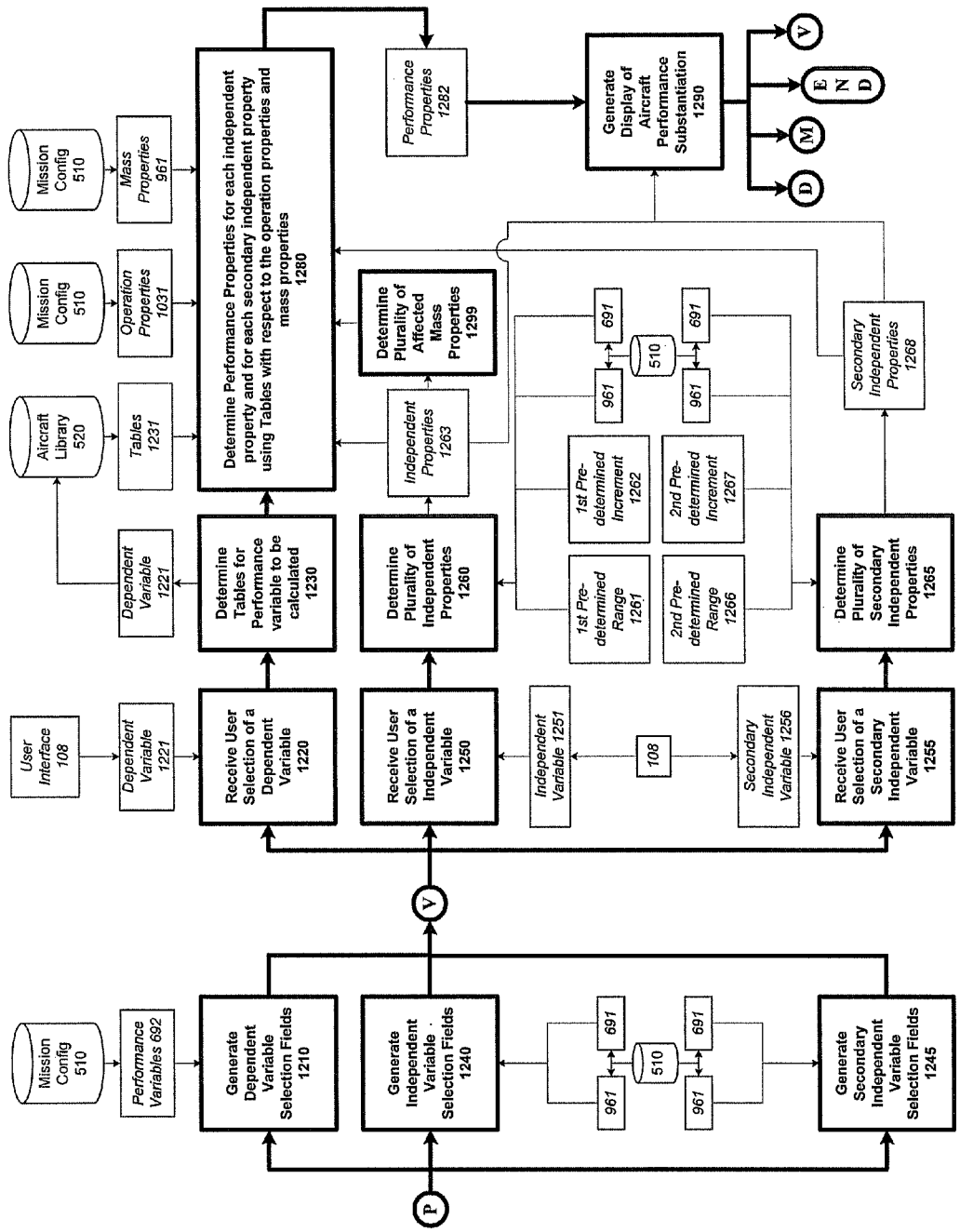
FIG. 12 is a flowchart that shows an exemplary process according to an embodiment of the present invention.

As can be shown with respect to points "D" in FIG. 11 and FIG. 12, steps 1110-1170 can be repeated interactively and iteratively upon receiving a new or additional selection of operation property at an operation properties field. As can be shown with respect to points "V" in FIG. 12, steps 1220-1290 can be repeated interactively and iteratively upon receiving a new or additional selection of a dependent variable property at a dependent-variable selection field, an independent variable property at an independent-variable selection field, or a secondary independent variable property at a secondary independent-variable selection field. The performance properties can also be calculated, and the aircraft performance substantiation displayed, interactively, for example, using server-side application functionality, e.g., PHP, or client-side application functionality, e.g., Java™ or JavaScript™, upon receiving input at a button 312 to trigger the calculation. Accordingly, the interactive display 400 allows a user to more effectively select dependent variables and independent variables and configure operation properties and mass properties by interactively and immediately allowing the user to become visually aware of the impact of variable selection and property selection with respect to the performance of the aircraft as a whole. For example, a user may be able to more precisely achieve a desired substantiation report tailored to the design or configuration of an aircraft when the user is made aware of the effects of selecting different dependent or independent variables on which to perform the substantiation report.

The foregoing has broadly outlined certain objectives, features, and technical advantages of the present invention and a detailed description of the invention so that embodiments of the invention may be better understood in light of features and advantages of the invention as described herein, which form the subject of certain claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages is better understood from the following description when considered in connection with the accompanying figures. It is to be expressly understood, however, that such description and figures are provided for the purpose of illustration and description only and are not intended as a definition of the limits of the present invention. For example, although the example embodiments described herein are directed to aircraft performance and configuration, it should be specifically noted that the interactive performance modeling and calculating functionalities can be employed to carry out similar functions with respect to several other vehicles having performance substantiation needs, such as land-based, sea-based vehicles, and spacecraft, for example.

That claimed is:

1. A machine to enhance aircraft performance substantiation for an aircraft selected from a plurality of preselected aircraft to more efficiently perform a mission by the aircraft, the machine comprising:

a processor;

a non-transitory memory positioned in communication with the processor to store computer program products therein;

a database to store data related to a plurality of preselected aircraft, a plurality of preselected aircraft maneuvers for each of the plurality of preselected aircraft, a plurality of aircraft dimensions of each of the plurality of preselected aircraft, a plurality of preselected loads of different types, and a plurality of aircraft load-sites being in or on each of the plurality of preselected aircraft and corresponding to one or more of the plurality of preselected loads;

an input/output unit in communication with the database and the processor to interactively communicate with a user through a user interface when positioned in communication therewith to receive user selections for and to display a scale graphical representation of one or more of the plurality of preselected aircraft when being used by a user;

first computer program product stored in the non-transitory memory and operable on the processor to generate a load configuration for one of the plurality of preselected aircraft by interactively modeling one or more of the plurality of preselected loads with respect to one of the plurality of preselected aircraft to thereby define an aircraft load configuration module, the aircraft load configuration module having a set of instructions comprising:

generating a display at the user interface of an aircraft selection field responsive to determining a plurality of preselected aircraft from the database, generating a display at the user interface of a scale graphic representation of a user-selected aircraft responsive to a selection of the user-selected aircraft by a user received from the user interface through the input/output unit responsive to the user selecting an aircraft at the aircraft selection field, the scale graphic representation of the user-selected aircraft being scaled responsive to the plurality of aircraft dimensions of the user-selected aircraft, generating a display at the user interface of a plurality of load selection fields, each of the plurality of load selection fields being for a respective aircraft load-site of the plurality of aircraft load-sites in or on the user-selected aircraft, each of the plurality of load selection fields being positioned responsive to the plurality of aircraft dimensions of the user-selected aircraft and a plurality of aircraft load-site dimensions of the respective aircraft load-site, each of the plurality of load selection fields being positioned to receive a selection one or more of the plurality of preselected loads of different types corresponding to the respective aircraft load-site at the database, interactively updating the scale graphic representation of the user-selected aircraft to include an oriented graphic representation of a user-selected load at a target aircraft load-site, the user-selected load being received from the user interface through the input/output unit responsive to a selection of the user-selected load by a user at a load selection field for the target aircraft load-site, the oriented graphic representation of the load being oriented responsive to the plurality of aircraft dimensions of the user-selected aircraft, a plurality of load dimensions of the user-selected load, and a plurality of aircraft load-site dimensions of the target aircraft load-site, and interactively determining a plurality of mass properties of the user-selected aircraft responsive to the plurality of aircraft dimensions of the user-selected aircraft, the plurality of load dimensions of the user-selected load, and the plurality of aircraft load-site dimensions of the target aircraft load-site;

second computer program product stored in the non-transitory memory and operable on the processor to generate a mission configuration for one or more of the plurality of preselected aircraft to define an aircraft mission configuration module, the aircraft mission configuration module having a set of instructions comprising:

generating a display at the user interface of a maneuver selection field responsive to determining a plurality of preselected maneuvers responsive to the user-selected aircraft, determining a plurality of operation variables and a plurality of performance variables responsive to a selection of a maneuver of the plurality of maneuvers from the database, the selection of the maneuver being by a user and received from the user interface through the input/output unit, the maneuver defining a user-selected maneuver, and generating a display at the user interface of a plurality of operation property selection fields, each of the plurality of operation property selection fields being responsive to one of the plurality of operation variables and being positioned to receive a user selection of an operation property corresponding to the one of the plurality of operation variables; and third computer program product stored in the non-transitory memory and operable on the processor to generate an aircraft performance substantiation responsive to the mission configuration and the load configuration to thereby define an aircraft performance substantiation module, the aircraft performance substantiation module having a set of instructions comprising:

generating a display at the user interface of a plurality of dependent-variable selection fields, each of the plurality of dependent-variable selection fields corresponding to one of the plurality of performance variables to receive a user selection of a dependent variable, generating a display at the user interface of a plurality of independent-variable selection fields, each of the plurality of independent-variable selection fields corresponding to one of the plurality of operation variables and a plurality of mass variables to receive a user selection of an independent variable, determining a plurality of independent properties responsive to a predefined range, a predefined increment, and one of a plurality of user-selected operation properties and the plurality of mass properties, each of the plurality of independent properties corresponding to a user-selected independent variable received from the user interface through the input/output unit responsive to a user selection of an independent variable at one of the plurality of independent-variable selection fields, each of the plurality of user-selected operation properties being received from the user interface through the input/output unit responsive to a user selection of an operation property at one of the plurality of operation property selection fields, determining a plurality of dependent properties of the user-selected aircraft for each of the plurality of independent properties, the determining operation being responsive to the respective independent property of the plurality of independent properties and at least one other of the plurality of user-selected operation properties and the plurality of mass-properties, each of the plurality of dependent properties corresponding to a user-selected dependent variable received from the user interface through the input/output unit responsive to a user selection of a dependent variable at one of the plurality of dependent-variable selection fields, and generating a display of an aircraft performance substantiation at the user interface so that the user can thereby visualize a relationship between the user-selected dependant variable and the user-selected independent variable throughout the preselected range, the generating instruction being responsive to determining the plurality of dependent properties of the user-selected aircraft, the display including a plot of each of the plurality of dependent properties for each respective independent property of the plurality of independent properties, the plot having the user-selected dependent variable as its Y-axis and the user-selected independent variable as its X-axis.

2. A machine as defined in claim 1, wherein:
the predefined range is a first predefined range and the predefined increment is a first predefined increment;

the set of instructions of the aircraft performance substantiation module further comprises:
  generating a display at the user interface of a secondary independent-variable selection field being responsive to the plurality of operation variables and the plurality of mass properties to receive a user selection of a secondary independent variable, and
  determining a plurality of secondary independent properties responsive to a second predefined range, a second predefined increment, and one of the plurality of user-selected operation properties and the plurality of mass properties, each of the plurality of secondary independent properties corresponding to a user-selected secondary independent variable received from the user interface through the input/output unit responsive to a user selection of the secondary independent variable at the secondary independent-variable selection field;
the determining instruction is for each of the plurality of independent properties and each of the plurality of secondary independent properties and further responsive to the respective secondary independent property of the plurality of secondary independent properties;
the display further includes a plot of each of the plurality of dependent properties for each respective independent property of the plurality of independent properties and each respective secondary independent property of the plurality of secondary independent properties; and
the display further includes a plurality of separate plot lines, each separate plot line being for a respective one of the plurality of respective secondary independent properties.

3. A machine as defined in claim 1, wherein:
the set of instructions of the aircraft load configuration module further comprises:
  interactively determining a plurality of aerodynamic properties of the user-selected aircraft responsive to the plurality of aircraft dimensions of the user-selected aircraft, the plurality of load dimensions of the user-selected load, and the plurality of aircraft load-site dimensions of the target aircraft load-site;
each of the plurality of independent-variable selection fields corresponds to the one of the plurality of operation variables, one of the plurality of mass variables, and one of a plurality of aerodynamic variables;
determining the plurality of independent properties is responsive to a predefined range, a predefined increment, and one of a plurality of user-selected operation properties, the plurality of mass properties, and the plurality of aerodynamic properties; and
determining the plurality of dependent properties is responsive to the respective independent property of the plurality of independent properties and at least one other of the plurality of user-selected operation properties, the plurality of mass-properties, and the plurality of aerodynamic properties.

4. A machine as defined in claim 1, wherein:
the set of instructions of the aircraft performance substantiation module further comprises: determining a plurality of affected mass properties, each of the plurality of affected mass properties being determined responsive to a corresponding independent property of the plurality of independent properties, a plurality of aircraft dimensions of the user-selected aircraft, the plurality of load dimensions of the user-selected load, and a plurality of aircraft load-site dimensions of the target aircraft load-site; and determining the plurality of dependent properties of the user-selected aircraft for each of the plurality of independent properties is responsive to the respective independent property of the plurality of independent properties, a corresponding affected mass property of the plurality of affected mass properties, and at least one other of the plurality of user-selected operation properties and the plurality of mass properties.

5. A machine as defined in claim 1, wherein the user-selected load is a first user-selected load at a first target aircraft load-site and the oriented graphic representation of the first user-selected load at the first target aircraft load-site is oriented with respect to the user-selected aircraft and a second user-selected load at a second target aircraft load site.

6. A machine as defined in claim 1, wherein a selection of a load at one of the plurality of load selection fields is received from the user interface responsive to receiving a user selection at a symmetrical loads field displayed at the user interface.

7. A machine as defined in claim 1, wherein determining the plurality of dependent properties of the user-selected aircraft for each of the plurality of independent properties is responsive to an interpolation including values of an aircraft performance table.

8. A machine as defined in claim 1, wherein:
the set of instructions of the aircraft performance substantiation module further comprises:
  determining an alert level for one of the plurality of independent properties and the plurality of dependent properties responsive to one of a plurality of aircraft bounds for the user-selected aircraft, and
  generating a display at the user interface of an alert responsive to the alert level.

9. A machine to enhance aircraft performance substantiation for an aircraft selected from a plurality of preselected aircraft to more efficiently perform a mission by the aircraft, the machine comprising:
a processor;
a non-transitory memory positioned in communication with the processor to store computer program products therein;
a database to store data related to a plurality of preselected aircraft, a plurality of preselected aircraft maneuvers for each of the plurality of preselected aircraft, a plurality of aircraft dimensions for each of the plurality of preselected aircraft, a plurality of preselected loads of different types, and a plurality of aircraft load-sites being in or on each of the plurality of preselected aircraft and corresponding to one or more of the plurality of preselected loads;
an input/output unit in communication with the database and the processor to interactively communicate with a user through a user interface when positioned in communication therewith to receive user selections for and to display a scale graphical representation of one or more of the plurality of preselected aircraft when being used by a user;
first computer program product stored in the non-transitory memory and operable on the processor to generate a load configuration for one or more of the plurality of preselected aircraft by interactively modeling one or more of the plurality of preselected loads with respect to one of the plurality of preselected aircraft to thereby define an aircraft load configuration module, the aircraft load configuration module having a set of instructions comprising:

generating a display at the user interface of a scale graphic representation of a user-selected aircraft responsive to a selection of the user-selected aircraft by a user received from the user interface through the input/output unit, the scale graphic representation of the user-selected aircraft being scaled responsive to the plurality of aircraft dimensions of the user-selected aircraft, generating a display at the user interface of a plurality of load selection fields, each of the plurality of load selection fields being for a respective aircraft load-site of the plurality of aircraft load-sites in or on the user-selected aircraft, each of the plurality of load selection fields being positioned responsive to the plurality of aircraft dimensions of the user-selected aircraft and a plurality of aircraft load-site dimensions of the respective aircraft load-site, each of the plurality of load selection fields being positioned to receive a selection one or more of the plurality of preselected loads of different types corresponding to the respective aircraft load-site at the database, interactively updating the scale graphic representation of the user-selected aircraft to include an oriented graphic representation of a user-selected load at a target aircraft load-site, the user-selected load being received from the user interface through the input/output unit responsive to a selection of the user-selected load by a user at a load selection field for the target aircraft load-site, the oriented graphic representation of the load being oriented responsive to the plurality of aircraft dimensions of the user-selected aircraft, a plurality of load dimensions of the user-selected load, and a plurality of aircraft load-site dimensions of the target aircraft load-site, and interactively determining a plurality of mass properties of the user-selected aircraft responsive to the plurality of aircraft dimensions of the user-selected aircraft, the plurality of load dimensions of the user-selected load, and the plurality of aircraft load-site dimensions of the target aircraft load-site;

second computer program product stored in the non-transitory memory and operable on the processor to generate a mission configuration for one or more of the plurality of preselected aircraft to define an aircraft mission configuration module, the aircraft mission configuration module having a set of instructions comprising:

generating a display at the user interface of a maneuver selection field responsive to determining a plurality of preselected maneuvers responsive to the user-selected aircraft, determining a plurality of operation variables and a plurality of performance variables responsive to a selection of a maneuver of the plurality of maneuvers from the database, the selection of the maneuver being by a user and received from the user interface through the input/output unit, the maneuver defining a user-selected maneuver, and generating a display at the user interface of a plurality of operation property selection fields, each of the plurality of operation property selection fields being responsive to one of the plurality of operation variables and being positioned to receive a user selection of an operation property corresponding to the one of the plurality of operation variables; and third computer program product stored in the non-transitory memory and operable on the processor to generate an aircraft performance substantiation responsive to the mission configuration and the load configuration to thereby define an aircraft performance substantiation module, the aircraft performance substantiation module having a set of instructions comprising:

determining a plurality of performance properties of the user-selected aircraft for each of the plurality of performance variables, the determining step being responsive to a plurality of user-selected operation properties and the plurality of mass-properties, each of the plurality of user-selected operation properties being received from the user interface through the input/output unit responsive to a user selection of an operation property at one of the plurality of operation property selection fields, and generating a display of an aircraft performance substantiation at the user interface responsive to determining the plurality of performance properties of the user-selected aircraft.

10. A machine as defined in claim 9, wherein:

the set of instructions of the aircraft load configuration module further comprises interactively determining a plurality of aerodynamic properties of the user-selected aircraft responsive to the plurality of aircraft dimensions of the user-selected aircraft, the plurality of load dimensions of the user-selected load, and the plurality of aircraft load-site dimensions of the target aircraft load-site; and the determining of the plurality of performance properties of the user-selected aircraft for each of the plurality of performance variables is responsive to the plurality of user-selected operation properties, the plurality of mass-properties, and the plurality of aerodynamic properties.

11. A machine as defined in claim 9, wherein the user-selected load is a first user-selected load at a first target aircraft load-site and the oriented graphic representation of the first user-selected load at the first target aircraft load-site is oriented with respect to the user-selected aircraft and a second user-selected load at a second target aircraft load site.

12. A machine as defined in claim 9, wherein:

the set of instructions of the aircraft performance substantiation module further comprises:

determining an alert level for one of the plurality of mass properties, the plurality of performance properties, and the plurality of operation properties responsive to one of a plurality of aircraft bounds for the user-selected aircraft, and generating a display of an alert responsive to the alert level at the user interface.

13. A machine as defined in claim 9, wherein determining the plurality of performance properties of the user-selected aircraft is responsive to an interpolation including values of an aircraft performance table.

14. A computer program product stored in a non-transitory memory, operable on a processor, and in communication with a user interface through an input/output unit, the computer program product to generate an aircraft performance substantiation responsive to a preselected aircraft, a preselected maneuver, and a preselected load configuration, the computer program product having a set of instructions comprising:

generating a display at the user interface of a plurality of dependent-variable selection fields, each of the plurality of dependent-variable selection fields corresponding to one of a plurality of performance variables for the preselected maneuver to receive a user selection of a dependent variable;

generating a display at the user interface of a plurality of independent-variable selection fields, each of the plurality of independent-variable selection fields corresponding to one of the plurality of operation variables for the preselected maneuver and one of a plurality of mass variables for the preselected load configuration to receive a user selection of an independent variable;

determining a plurality of independent properties responsive to a predefined range, a predefined increment and one of a plurality of user-selected operation properties of the preselected maneuver and a plurality of mass properties of the preselected load configuration, each of the plurality of independent properties corresponding to a user-selected independent variable received from the user interface through the input/output unit responsive to a user selection of an independent variable at one of the plurality of independent-variable selection fields;

determining a plurality of dependent properties of the user-selected aircraft for each of the plurality of independent properties, the determining step being responsive to the respective independent property of the plurality of independent properties and at least one other of the plurality of user-selected operation properties and the plurality of mass-properties, each of the plurality of dependent properties corresponding to a user-selected dependent variable received from the user interface through the input/output unit responsive to a user selection of a dependent variable at one of the plurality of dependent-variable selection fields; and generating a display of an aircraft performance substantiation at the user interface so that the user can thereby visualize a relationship between the user-selected dependant variable and the user-selected independent variable throughout the preselected range, the generating instruction being responsive to determining the plurality of dependent properties of the user-selected aircraft, the display including a plot of each of the plurality of dependent properties for each respective independent property of the plurality of independent properties, the plot having the user-selected dependent variable as its Y-axis and the user-selected independent variable as its X-axis.

15. A computer program product as defined in claim 14, wherein the predefined range is a first predefined range and the predefined increment is a first predefined increment, wherein:

the set of instructions further comprises:
generating a display at the user interface of a secondary independent-variable selection field being responsive to the plurality of operation variables and the plurality of mass properties to receive a user selection of a secondary independent variable, and determining a plurality of secondary independent properties responsive to a second predefined range, a second predefined increment and one of the plurality of user-selected operation properties and the plurality of mass properties, each of the plurality of secondary independent properties corresponding to a user-selected secondary independent variable received from the user interface through the input/output unit responsive to a user selection the secondary independent variable at the secondary independent-variable selection field;

the determining step is for each of the plurality of independent properties and each of the plurality of secondary independent properties and further responsive to the respective secondary independent property of the plurality of secondary independent properties;

the display further includes a plot of each of the plurality of dependent properties for each respective independent property of the plurality of independent properties and each respective secondary independent property of the plurality of secondary independent properties; and the display further includes a plurality of separate plot lines, each separate plot line being for a respective one of the plurality of respective secondary independent properties.

16. A computer program as defined in claim 14, the set of instructions further comprising:
determining an alert level for one of the plurality of independent properties and the plurality of dependent properties responsive to one of a plurality of aircraft bounds for the user-selected aircraft; and
generating a display at the user interface of an alert responsive to the alert level.

17. A computer program as defined in claim 14, wherein:
the set of instructions further comprises: determining a plurality of affected mass properties, each of the plurality of affected mass properties being determined responsive to a corresponding independent property of the plurality of independent properties, a plurality of aircraft dimensions of the preselected aircraft, a plurality of load dimensions of the preselected load configuration, and a plurality of aircraft load-site dimensions of the preselected load configuration; and
determining the plurality of dependent properties of the user-selected aircraft for each of the plurality of independent properties is responsive to the respective independent property of the plurality of independent properties, a corresponding affected mass property of the plurality of affected mass properties, and at least one other of the plurality of user-selected operation properties and the plurality of mass-properties.

18. A computer-implemented method to generate an aircraft performance substantiation at a user interface responsive to a preselected aircraft, a preselected maneuver, and a preselected load configuration, the computer-implemented method comprising the steps of:

generating a display at the user interface of a plurality of dependent-variable selection fields, each of the plurality of dependent-variable selection fields corresponding to one of a plurality of performance variables for the preselected maneuver to receive a user selection of a dependent variable;

generating a display at the user interface of a plurality of independent-variable selection fields, each of the plurality of independent-variable selection fields corresponding to one of the plurality of operation variables for the preselected maneuver and one of a plurality of mass variables for the preselected load configuration to receive a user selection of an independent variable;

determining a plurality of independent properties responsive to a predefined range, a predefined increment and one of a plurality of user-selected operation properties of the preselected maneuver and a plurality of mass properties of the preselected load configuration, each of the plurality of independent properties corresponding to a user-selected independent variable received from the user interface responsive to a user selection of an independent variable at one of the plurality of independent-variable selection fields;

determining a plurality of dependent properties of the user-selected aircraft for each of the plurality of independent properties, the determining step being responsive to the respective independent property of the plurality of independent properties and at least one other of the plurality of user-selected operation properties and the plurality of mass-properties, each of the plurality of dependent properties corresponding to a user-selected dependent variable received from the user interface responsive to a user selection of a dependent variable at one of the plurality of dependent-variable selection fields; and generating a display of an aircraft performance substantiation at the user interface so that the user can thereby visualize a relationship between the user-selected dependant variable and the user-selected independent variable throughout the preselected range, the generating step being responsive to determining the plurality of dependent properties of the user-selected aircraft, the display including a plot of each of the plurality of dependent properties for each respective independent property of the plurality of independent properties, the plot having the user-selected dependent variable as its Y-axis and the user-selected independent variable as its X-axis.

19. A computer-implemented method as defined in claim 18, wherein:

the predefined range is a first predefined range and the predefined increment is a first predefined increment;

the computer-implemented method further comprises the steps of:

generating a display at the user interface of a secondary independent-variable selection field being responsive to the plurality of operation variables and the plurality of mass properties to receive a user selection of a secondary independent variable, and determining a plurality of secondary independent properties responsive to a second predefined range, a second predefined increment and one of the plurality of user-selected operation properties and the plurality of mass properties, each of the plurality of secondary independent properties corresponding to a user-selected secondary independent variable received from the user interface responsive to a user selection the secondary independent variable at the secondary independent-variable selection field;

the determining step is for each of the plurality of independent properties and each of the plurality of secondary independent properties and further responsive to the respective secondary independent property of the plurality of secondary independent properties;

the display further includes a plot of each of the plurality of dependent properties for each respective independent property of the plurality of independent properties and each respective secondary independent property of the plurality of secondary independent properties; and the display further includes a plurality of separate plot lines, each separate plot line being for a respective one of the plurality of respective secondary independent properties.

20. A computer-implemented method as defined in claim 18, the computer-implemented method further comprising the steps of:

determining an alert level for one of the plurality of independent properties and the plurality of dependent properties responsive to one of a plurality of aircraft bounds for the user-selected aircraft; and generating a display at the user interface of an alert responsive to the alert level.

21. A computer-implemented method as defined in claim 18, wherein:

the computer-implemented method further comprises the step of: determining a plurality of affected mass properties, each of the plurality of affected mass properties being determined responsive to a corresponding independent property of the plurality of independent properties, a plurality of aircraft dimensions of the preselected aircraft, a plurality of load dimensions of the preselected load configuration, and a plurality of aircraft load-site dimensions of the preselected load configuration; and the step of determining of a plurality of dependent properties of the user-selected aircraft for each of the plurality of independent properties is responsive to the respective independent property of the plurality of independent properties, a corresponding affected mass property of the plurality of affected mass properties, and at least one other of the plurality of user-selected operation properties and the plurality of mass-properties.

22. A computer-implemented method to generate an aircraft performance substantiation at a user interface responsive to a preselected aircraft, a preselected maneuver for the preselected aircraft, and a preselected load configuration for the preselected aircraft, the computer-implemented method comprising the steps of:

generating a display at the user interface of a plurality of variable selection fields, each of the plurality of variable selection fields corresponding to one of a plurality of performance variables for a preselected maneuver of a preselected aircraft, a plurality of operation variables for the preselected maneuver of the preselected aircraft, and a plurality of mass variables for a preselected load configuration of the preselected aircraft to thereby receive a selection by a user of one of the plurality of performance variables, the plurality of operation variables, and the plurality of mass variables;

determining a plurality of performance properties of the preselected aircraft for each of a plurality of potential mission properties, the plurality of potential mission properties being responsive to a preselected range, a preselected increment, and one of a predetermined operation property and a predetermined mass property corresponding to a first selection by the user of one of the plurality of operation variables and the plurality of mass variables at a first one of the plurality of variable selection fields to define a user-selected mission variable, each of the plurality of performance properties corresponding to a second selection by the user of one of the plurality of performance variables at a second one of the plurality of variable selection fields to define a user-selected performance variable; and generating a display of an aircraft performance substantiation at the user interface so that the user can thereby visualize a relationship between the user-selected performance variable and the user-selected mission variable throughout the preselected range, the generating step being responsive to the plurality of performance properties of the preselected aircraft and the plurality of potential mission properties, the display including a plot of each of the plurality of performance properties for each respective potential mission property of the plurality of potential mission properties, the plot having the user-selected performance variable as its Y-axis and the user-selected mission variable as its X-axis.

23. A computer-implemented method as defined in claim 22, wherein:

the predetermined operation property is a first predetermined operation property and the predetermined mass property is a first predetermined mass property; and the determining step is responsive to at least one of a second predetermined operation property and a second predetermined mass property.

24. A computer-implemented method as defined in claim 22, wherein:
the predefined range is a first predefined range and the predefined increment is a first predefined increment;
the predetermined operation property is a first predetermined operation property and the predetermined mass property is a first predetermined mass property; and
the performance properties of the preselected aircraft are determined for each of a plurality of potential mission properties and for each of a plurality potential secondary properties, the plurality of potential secondary properties being responsive to a second preselected range, a second preselected increment, and one of a second predetermined operation property and a second predetermined mass property corresponding to a third selection by the user of one of the plurality of operation variables and the plurality of mass variables at a third one of the plurality of variable selection fields to define a user-selected secondary variable;
the display of an aircraft performance substantiation at the user interface is generated so that the user can thereby visualize a relationship among the user-selected perfoiniance variable, the user-selected mission variable, and the user-selected secondary variable throughout the first preselected range and the second preselected range, the generating step being further responsive to the plurality of potential secondary properties;
the display includes a plot of each of the plurality, of performance properties for each respective potential mission property of the plurality of potential mission properties and for each respective potential secondary property of the plurality of potential secondary properties; and
the display further includes a plurality of separate plot lines, each separate plot line being for a respective one of the plurality of potential secondary properties.

25. A computer-implemented method as defined in claim 22, the computer-implemented method further comprising the steps of:
determining a configuration alert level for one of the plurality of potential mission properties responsive to one of a plurality of aircraft configuration bounds for the preselected aircraft; and
generating a display of a configuration alert responsive to the configuration alert level at the user interface.

26. A computer-implemented method as defined in claim 22, the computer-implemented method further comprising the steps of:
determining a performance alert level for one of the plurality of performance properties responsive to one of a plurality of aircraft performance bounds for the preselected aircraft; and
generating a display of a performance alert responsive to the performance alert level a the user interface.

27. A computer-implemented method as defined in claim 22, wherein:
the computer-implemented method further comprises the step of: determining a plurality of affected mass properties, each of the plurality of affected mass properties being determined responsive to a corresponding potential mission property of the plurality of potential mission properties, a plurality of aircraft dimensions of the preselected aircraft, a plurality of load dimensions of the preselected load configuration, and a plurality of aircraft load-site dimensions of the preselected load configuration; and
the plurality of performance properties of the preselected aircraft for each one of the plurality of potential mission properties is determined further responsive to an affected mass property of the plurality of affected mass properties corresponding the one of the plurality of potential mission properties.

28. An interactive user interface to display to a user an aircraft performance substantiation responsive to a preselected aircraft, a preselected maneuver for the preselected aircraft, and a preselected load configuration for the preselected aircraft, user interface comprising:
an interactive display of a plurality of variable selection fields, each of the plurality of variable selection fields being generated responsive to one of a plurality of performance variables for a preselected maneuver of a preselected aircraft, a plurality of operation variables for the preselected maneuver of the preselected aircraft, and a plurality of mass variables for a preselected load configuration of the preselected aircraft, the plurality of variable selection fields to thereby receive a user-selected performance variable being one of the plurality of performance variables and to thereby receive a user-selected mission variable being one of the plurality of operation variables and the plurality of mass variables; and
a resulting display of an aircraft performance substantiation so that the user can thereby visualize a relationship between the user-selected performance variable and the user-selected mission variable throughout a preselected range, the resulting display being generated responsive to a plurality of performance properties of the preselected aircraft and a plurality of potential mission properties, the resulting display including a plot of each of the plurality of performance properties for each respective potential mission property of the plurality of potential mission properties, the plot having the user-selected performance variable as its Y-axis and the user-selected mission variable as its X-axis.

29. An interactive user interface as defined in claim 28, wherein:
the plurality of performance properties of the preselected aircraft are determined for each of the plurality of potential mission properties;
the plurality of potential mission properties are determined responsive to the preselected range, a preselected increment, and one of a predetermined operation property and a predetermined mass property corresponding to the user-selected mission variable; and
each of the plurality of performance properties correspond to the user-selected performance variable.

30. An interactive user interface as defined in claim 28, wherein:
the predetermined operation property is a first predetermined operation property and the predetermined mass property is a first predetermined mass property; and
the plurality of mission properties of the preselected aircraft are determined responsive to at least one of a second predetermined operation property and a second predetermined mass property.

31. An interactive user interface as defined in claim 28, wherein:
the predefined range is a first predefined range and the predefined increment is a first predefined increment;

the predetermined operation property is a first predetermined operation property and the predetermined mass property is a first predetermined mass property;

the plurality of performance properties of the preselected aircraft are determined for each of a plurality of potential mission properties and for each of a plurality potential secondary properties, the plurality of potential secondary properties being responsive to a second preselected range, a second preselected increment, and one of a second predetermined operation property and a second predetermined mass property corresponding to a third selection by the user of one of the plurality of operation variables and the plurality of mass variables at a third one of the plurality of variable selection fields to define a user-selected secondary variable;

the resulting display of an aircraft performance substantiation at the user interface is generated so that the user can thereby visualize a relationship among the user-selected performance variable, the user-selected mission variable, and the user-selected secondary variable throughout the first preselected range and the second preselected range, the generating step being further responsive to the plurality of potential secondary properties;

the resulting display includes a plot of each of the plurality of performance properties for each respective potential mission property of the plurality of potential mission properties and for each respective potential secondary property of the plurality of potential secondary properties; and the resulting display further includes a plurality of separate plot lines, each separate plot line being for a respective one of the plurality of potential secondary properties.

32. An interactive user interface as defined in claim 28, further comprising a display of a configuration alert responsive to a configuration alert level being determined for one of the plurality of potential mission properties responsive to one of a plurality of aircraft configuration bounds for the preselected aircraft.

33. An interactive user interface as defined in claim 28, further comprising a display of a performance alert responsive to a performance alert level being determined for one of the plurality of performance properties responsive to one of a plurality of aircraft performance bounds for the preselected aircraft.

* * * * *